(12) United States Patent
Liebman et al.

(10) Patent No.: US 12,008,294 B2
(45) Date of Patent: Jun. 11, 2024

(54) CALIBRATION OF ONLINE REAL-WORLD SYSTEMS USING SIMULATIONS

(71) Applicant: SPARKCOGNITION, INC., Austin, TX (US)

(72) Inventors: Elad Liebman, Austin, TX (US); Sridhar Sudarsan, Austin, TX (US)

(73) Assignee: SPARKCOGNITION, INC., Austin, TX (US)

( * ) Notice: Subject to any disclaimer, the term of this patent is extended or adjusted under 35 U.S.C. 154(b) by 689 days.

(21) Appl. No.: 16/943,855

(22) Filed: Jul. 30, 2020

(65) Prior Publication Data

US 2022/0035965 A1 Feb. 3, 2022

(51) Int. Cl.
| | | |
|---|---|---|
| G06F 30/20 | (2020.01) | |
| G06F 18/214 | (2023.01) | |
| G06F 30/15 | (2020.01) | |
| G06N 20/00 | (2019.01) | |

(52) U.S. Cl.
CPC ............ *G06F 30/20* (2020.01); *G06F 18/214* (2023.01); *G06F 30/15* (2020.01); *G06N 20/00* (2019.01)

(58) Field of Classification Search
CPC ......... G06F 30/20; G06F 30/15; G06N 20/00; G06K 9/6256

USPC ............................................................. 703/8
See application file for complete search history.

(56) References Cited

U.S. PATENT DOCUMENTS

| | | | | |
|---|---|---|---|---|
| 2015/0300239 | A1* | 10/2015 | Ruby | ...................... F01P 11/14 |
| | | | | 701/99 |
| 2019/0232971 | A1* | 8/2019 | Vijayakumar | ...... B60W 50/045 |
| 2020/0141266 | A1* | 5/2020 | Cooper | .................. F01D 21/003 |
| 2020/0200140 | A1* | 6/2020 | Attard | .................... G01M 15/04 |

OTHER PUBLICATIONS

Gutjahr et al. (Advanced Modeling and Optimization for Virtual Calibration, (9 pages). (Year: 2017).*
Afify et al. (Smart Engine Speed Control System with ECU System Interface, (6 pages)). (Year: 2018).*

* cited by examiner

*Primary Examiner* — Andre Pierre Louis

(57) ABSTRACT

Calibration of online combustion engines using simulations, including: simulating, on a processor coupled to an engine and based on operation data generated during operation of the engine, operation of the engine; training, based on simulating the operation of the engine, one or more trained models; and generating, based at least on the one or more trained models, calibration data corresponding to one or more electronically controllable components of the engine.

19 Claims, 23 Drawing Sheets

CALIBRATION OF ONLINE REAL-WORLD SYSTEMS USING SIMULATIONS

DESCRIPTION OF EMBODIMENTS

Figure 1:
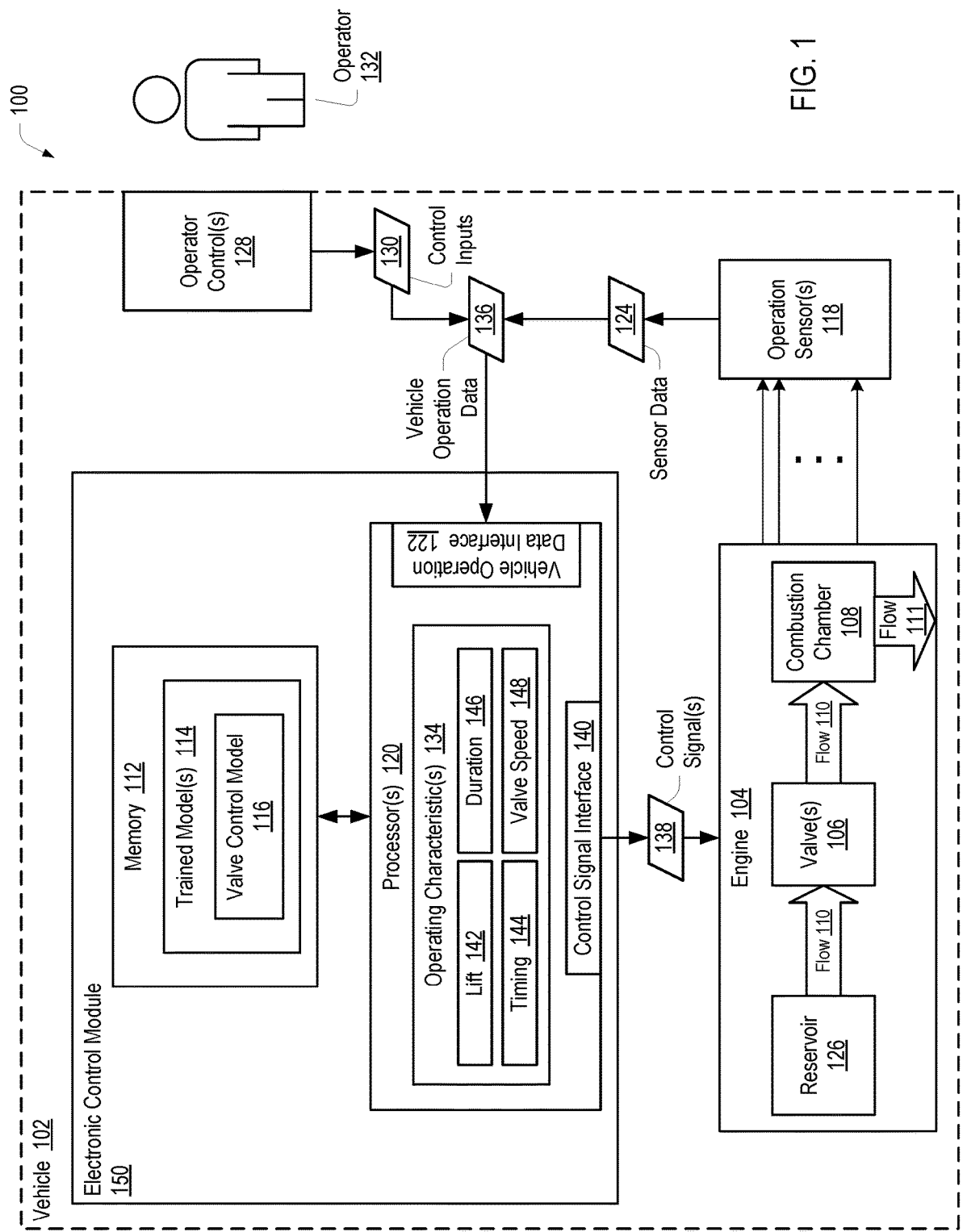
FIG. 1 illustrates a block diagram of a particular implementation of a vehicle that includes a valve control model to control operation of an electronically controllable valve of an engine in accordance with some examples of the present disclosure.

Example methods, apparatus, and products for calibration of online combustion engines using simulations in accordance with embodiments of the present disclosure are described with reference to the accompanying drawings.

The present disclosure is generally related to a calibration system that is implemented within or onboard a real-world system, such as a vehicle, engine, or equipment that performs calibrations during operation or service of the vehicle, engine, or equipment. Dynamic calibration, in some examples, enables dynamic tuning of operating characteristics of an engine in order to overcome or compensate for changes in operating characteristics that may otherwise result in the engine not meeting calibration objectives. The calibration system may use simulator models of real-world systems in the context of simulation learning to determine calibration data that is usable by a control system of the real-world system for modifying operating characteristics of the real-world system. In some examples, the modifications to operating characteristics may change the performance or behavior of the real-world system to better align with one or more target objectives. Further, in some examples, the real-world system being calibrated may be an electronic system, a mechanical system, or a combination of an electronic and mechanical system. In some examples, such as where the real-world system includes an engine or vehicle, the calibration data may be used by a control system to electronically control engine components that are mechanical, electronic, or both mechanical and electronic. In other examples, a real-world system may include a robot or robotic machinery, a computer system such as a mobile device, server, or desktop computer, or a cloud computing environment. In general, any real-world system that includes a control system for generating operations or control signals that, when carried out, reconfigure operation of the real-world system—where the reconfiguration may be based on calibration data that generated based on simulations driven by a data-driven, multi-objective approach. While the below examples provide specific implementations in the context of engines and vehicles, the simulation learning techniques used for generating calibration data or trained models for calibrating the engines and vehicles may be similarly applied when tuning other real-world systems that include operating characteristics controllable by control signals specified by a control system using calibration data or trained models trained in accordance with calibration data.

In some implementations, a calibration system may use simulator models of real-world systems in the context of simulation learning to determine calibration data corresponding to electronically controllable components of an online physical engine or vehicle.

Further, in this disclosure, calibration data may then be used to calibrate an online engine, such as an engine that is currently in operation, in service, or deployed for use. For example, the calibration data may be used by a control system or control module to electronically control engine components that are mechanical, electronic, or both mechanical and electronic, such that operating characteristics of the calibrated engine are in accordance with one or more metrics, performance behaviors, or operating characteristics of objectives specified in the calibration data.

In some implementations, an engine or vehicle may be configured to include implementations of calibration system that includes a simulator and a calibration module. In some examples, sensor data collected during operation of a vehicle may be used as simulation data, where, in dependence on a comparison of operating characteristics to one or more target objectives, a calibration module may generate updated calibration data to calibrate performance of the engine or vehicle. In this way, changes in vehicle or engine performance may trigger generation of updated calibration data to continue to meet target calibration objectives.

In other implementations, the calibration system may receive updated calibration data or updated target objectives during operation of the engine or vehicle, such as over a wireless communication link, where the calibration system may then, using an onboard simulator and calibration module, generate updated calibration data in accordance with the received updates over the communication link.

Conventional, modern internal combustion engines include valves that are used to control passage of fluids, such as an intake valve that controls ingress of a fuel-air mixture into a combustion chamber (e.g., a piston cylinder) or an exhaust valve that controls egress of exhaust gasses from the combustion chamber. Conventionally, operation of such valves is mechanically controlled via a mechanical linkage in contact with a cam of a rotating camshaft. Further, in conventional engines, properties of valve operation, such as valve lift, opening or closing speed, timing with respect to rotation of a crankshaft of the engine, and duration the valve remains in an open state or a closed state are controlled by a physical geometry of a cam that is associated with the valve. Conventionally, engine performance can be tuned by adjusting operation of the valves, where the mechanical nature of the valve, the camshaft, and the mechanical linkage can cause such adjustments to be time consuming and costly.

By contrast to conventional mechanical or manual adjustments to an engine, the disclosed embodiments describe calibrating an online engine using onboard simulations. An online engine is an engine that is actively in operation or actively deployed for use or service, where the online, or operating, engine may be online during calibration. Subsequent to being calibrated, the online engine may continue operation.

In general, as described in the below implementations, techniques for calibrating a real-world system may include any point along a continuum of combinations of offline and online calibration. In other words, calibration may be performed not simply on an offline real-world system or an online real-world systems, but rather under various states of operation, or sequences of states of operation, for a real-world system over the course of an entire life cycle of the real-world system.

As an example calibration point along the continuum of combinations of offline and online calibration, for a given real-world system, different types of calibration may be performed at different points during the life cycle of the real-world system, where the calibration may be based on a combination of techniques. For example, some of the calibration techniques described in this disclosure are performed during use or operation of the real-world system, which is one example of using simulations to calibrate an online real-world system.

As another example calibration point along the continuum of combinations of offline and online calibration, calibration using simulations may be performed for a real-world system that is not operational during calibration, where offline calibration is further described in patent application Ser. No. 16/944,315, which is incorporated by reference herein for all purposes.

Further, in between fully online calibration and fully offline calibration are calibration options that may combine elements of each of these calibration techniques. For example, calibration of a real-world system may be an iterative process that is part of the maintenance of the real-world system, where a real-world system may be calibrated offline, such as during manufacture prior to deployment, and where during operation, the real-world system collects operational data. Further, in this example, some or parts of the real-world system may be calibrated during operation, and some or parts of the real-world system may be calibrated when the real-world system is taken offline and is not operating. In some examples, a subset of the components of the real-world system may be calibrated during online operation, and another subset of the components of the real-world system may be calibrated when the real-world system is taken offline and not operating—in this way, all components that may be calibrated are calibrated based on a combination of online and offline calibration techniques. In this example, the different subsets of components of the real-world system that are calibrated online or offline may depend on a predefined specification, depend on circumstances or conditions of operation, and/or depend on sensor data or third-party data gathered or determined during operation.

In this way, in some examples, an engine or vehicle may be currently in use, where an operator is driving down a road, and as the operator is driving, the engine or vehicle may be updated with new calibration data that, when implemented by a control system, modifies operating characteristics without the engine operation being disrupted, stopped, or otherwise noticeably affected by the operator. Some example advantages to such an online calibration to an in-use engine or vehicle is that service time for the vehicle is not lost or reduced, and time for performing maintenance or tuning of the engine or vehicle offline is not expended.

Further, in some examples, a fixed set of calibration data may be used to continuously tune an engine or vehicle to adjust operating characteristics to be realigned with target objectives specified by the calibration data. For example, during service, a vehicle or engine may undergo performance drift or performance changes due to wear, a change in performance in one or more aspects of an engine or vehicle, or mechanical or electrical damage or failures.

In some examples, based on sensor data, operating characteristics may be continuously or periodically compared to the target objectives specified by the calibration data to determine whether the operating characteristics are meeting the target objectives, or meeting the target objectives within a specified threshold. In such an example, use of a simulator to determine how to modify operating characteristics to continue meeting target objectives may be performed while the vehicle is operating.

Continuing with this example, if the operating characteristics are not meeting the target objectives specified by calibration data, the onboard calibration system may use collected sensor data and corresponding operating characteristics to determine updated trained models for specifying control signals to one or more electronically controllable components of the engine. In this example, based on the updated trained models, and the recalibrated trained models, operating characteristics of the engine may be modified to meet, or more closely meet the target objectives specified by the calibration data. In this way, adverse changes in engine operation with respect to meeting target objectives in calibration data may be compensated for by updated trained models based on current operating conditions of the engine.

In some implementations, during service or use of a vehicle, as part of scheduled or emergency maintenance, new calibration data may be released, for example, to a fleet of service vehicles for a company or for an organization. In this way, in some examples, the benefits discussed earlier with regard to reducing out-of-service time for a vehicle is magnified in accordance with the size of a given fleet of vehicles, or equipment, being maintained by a company or by an organization.

In some examples, simulations for an engine targeted for calibration may be performed within an simulation learning environment, where a simulation learning environment may include a simulator and a calibration module—where the simulation learning environment may be implemented onboard the engine or vehicle, for example, within software, hardware, or a combination of software and hardware.

In some implementations, onboard simulations may generate simulator output that, in conjunction with target objectives for engine calibration, may be used as a basis for generating calibration data. Further, in some examples, the calibration data may be used to calibrate, modify, define, or redefine, operating characteristics of the engine, or vehicle. In some implementations, operating characteristics correspond to components or operating behavior of the engine that are affected by operation of the electronically controllable components of the engine. In some implementations, calibration of an online engine using calibration data generated within an onboard simulation learning environment may serve as a basis for avoiding more expensive human calibration of an engine.

Further, in some implementations, the calibration data generated by a simulation learning environment may be given effect by trained models that are uploaded onto an engine module or memory, or a module or memory coupled to the engine, where the trained modules may take in as input different types of vehicle or engine operation data, such as vehicle sensor data and operator control inputs, and generate control signals in accordance with the calibration data, where the control signals control the electronically controllable components of the engine or vehicle.

Further, in some implementations, the simulator results may be based on a data-driven approach for onboard simulations using unbounded, algorithm-generated combinations of inputs, including combinations of operation sensor data, operator control data, location data, environmental data, travel condition data, regulatory data, fleet control data, among others. In this way, performance of an online engine may be calibrated based on onboard simulations that operate on an exhaustive range of possible inputs and input types, thereby increasing the likelihood of finding optimal, or near optimal, calibrations of the electronically controllable components of an engine or vehicle.

In some implementations, there may be target objectives for how an engine or vehicle should be calibrated to perform, and based on onboard simulations of the engine or vehicle, a set of control signals, for multiple different states of an engine, may be determined to correspond to engine characteristics or performance of electronically controlled components of the engine that optimally satisfy, or nearly optimally satisfy, the target objectives.

Further, in some implementations, for multiple different situations, conditions, or states of an engine based on a combination of sensor data inputs and operator control inputs—trained models as part of calibration data may be loaded or installed into a control module for an online engine to calibrate the engine in accordance with one or more target objectives. In some implementations, in short, an onboard simulation learning environment may include a simulator, where simulator output is a basis for developing trained models to be used in calibrating an online engine. In other words, in some implementations, such a real-world system that includes operational components in addition to components to gather sensor data, make decisions, deploy decisions, and act may be considered a "closed loop" system once or iteratively. However, as discussed in other examples, in different implementations, calibration may be performed during different periods of the life cycle of a real-world system, including periods that are closed loop, and periods that are not. For example, as discussed above, techniques for calibrating a real-world system may include any point along a continuum of combinations of offline and online calibration.

In some implementations, generating calibration data using simulation learning may be based on a hybrid approach toward simulation input. In some examples, the simulation input may include, as a first type of input, synthetic input that may be generated in accordance with a data-driven approach for generating combinations of inputs, such as algorithm or computationally generated inputs. Further, in this example, the simulation input may also include, as a second type of input, non-synthetic inputs based on sensor or control data collected from a real-world system, specific design-based or physics-based restrictions or parameters determined by capabilities or features of a physical engine configuration. Given these hybrid simulation inputs, simulation learning may be considered to be based on using a data-driven approach combined with using non-synthetic data or sample inputs. In other words, in some examples, a hybrid approach may combine multiple sources of non-synthetic data as well as physics-informed models based on engine geometry and subject matter expertise.

In some implementations, a data-driven approach may be considered to be data-driven based on not being limited to operating on specific sets of data or being limited to operating on specific parameter settings, and based on there being no dependence upon a prior knowledge of a type of problem to be solved. Examples for such knowledge include, but are not limited to, physics-informed models of an engine architecture or geometry, subject-matter-expertise information involving value ranges and/or constraints, kinds of relationships between different measurements, dependencies between different components, and other similar, restrictions of simulator input.

In some implementations, data-driven approaches to simulations may avoid unnecessary narrowing of simulation input parameters due to human tuning or setting—based on expectations of engine behavior or operation—simulator operation toward local optima, or in some cases, not an optimum at all. In other words, human-driven simulations, and more generally, human-led calibration as a whole, may be unable escape limited scopes for exploring calibration options.

However, in some implementations, a pure data-driven approach may not be computationally feasible or may lead to a large amount of impractical calibration data settings. Consequently, in some implementations, a hybrid approach may be used to bring simulator operation into computational feasibility, toward greater accuracy, or toward greater likelihood of practical application. In other words, in some cases, simulation learning may be based on simulator input that is based on a data-driven approach guided by simulator input that is based on domain boundaries or knowledge, such as aspects of a simulated engine that are based on sample data from operation of a pre-existing, physical engine.

In some implementations, as described above, an electronically controllable component of an engine may be valves that control flows into and out of a combustion chamber of an engine. As described herein, control signals that control operating characteristics of the electronically controllable valves may be based on trained models operating on sensor data input, operating control inputs, or other inputs.

For example, in some implementations, an electronically controllable component of an engine may be a mechanism that changes the dimensions of a combustion chamber of an engine. In this example, increasing or decreasing a volume of a combustion chamber may increase or decrease an amount of power output from the engine. In some examples, volume of a combustion chamber may be modified to increase or decrease based on movement or realignment of one or more movable surfaces that define the dimensions of the combustion chamber. In this way, in this example, similarly to electronically controllable valves, control signals that control operating characteristics of the electronically controllable combustion chambers may be based on trained models operating on sensor data input, operating control inputs, or other inputs.

However, in some implementations, more generally, any number of electronically controllable component of a real-world system, such as an engine, equipment, computer system, robot, or a vehicle housing an engine, may be controlled by one or more trained models developed within an onboard simulation learning environment as part of calibration data that is used to calibrate an offline or online engine, equipment, computer system, robot, or a vehicle housing an engine.

In general, enormous computational resources are used for performing simulations to improve or optimize for a single engine or vehicle operating characteristic using hybrid simulation inputs varying across the various combinations of possible data points or sample data points. However, in various implementations, multiple engine or vehicle operating characteristics may be considered for optimization toward a target objective in the process of determining configuration information for calibrating or tuning an online engine or online vehicle.

Further, in some implementations, one or more simulation model aspects may affect—positively or adversely—multiple, different operating characteristics. For example, improving fuel efficiency may adversely affect one or more other operating characteristics, such as performance characteristics that include power or torque. In other words, a simulation learning environment may simultaneously consider and balance multiple objectives for different operating characteristics, where one or more dependencies may exist between elements of vehicle operation data that affect different operating characteristics.

Further, in some implementations, in contrast to using a static simulator to simulate an engine or vehicle, in some examples, a simulator may be modified or refined over multiple iterations to increase simulator accuracy or results. For example, over successive iterations, simulator output, in combination with real-world performance data, may be used for grounding the simulator and for updating models of the engine or vehicle used by the simulator to increase accuracy of the models with respect to real-world, physical operation of the engine or vehicle. In some examples, simulator refinement may be carried out by using iterative modeling or hierarchical modeling. For example, iterative modeling may include beginning with an initial model, which is used to generate some output set of information, and in turn, the generated output set of information is used to update the initial model. In this example, such iterations may continue until convergence on a model with desired properties is reached. In other examples, a hierarchical modeling approach may be carried out by generating a hierarchy of different simulator models, where each of the different simulator models in the hierarchy are defined with different levels of fidelity. Further, in this example, simulations may be navigated in an order that specifies that simulator models with the coarsest fidelity are simulated before simulator models of a finer fidelity—where the fidelity of each model may be refined over successive simulations. In other examples, a combination of both iterative modeling and hierarchical modeling may be used.

The present disclosure generally describes systems, methods, and apparatus that enable calibration of online combustion engines using simulations operating within a simulation learning environment, where simulation learning is used to determine calibration data that when made available to a control system for a real-world system, is usable by the control system for modifying operating characteristics of the real-world system. For example, a control system may use calibration data for calibrating electronically controllable components of an engine, including components that are mechanical, electronic, or both mechanical and electronic.

The present disclosure also describes systems, methods, and apparatus that enable use of trained models to control operation of electronically controllable components in an engine, such as an internal combustion engine of a land-based vehicle or machinery, a water-based craft or machinery, an aircraft, a generator, or other types of engines that include electronically controllable components that determine, in whole or in part, operating characteristics of an engine.

Turning toward the drawings, FIGS. 1-9 illustrate use of trained models for determining operating characteristics of electronically controllable components of an engine, and illustrate examples for training models, and flowcharts describing a processing flow within a vehicle, or other equipment, that includes the engine.

With further reference to the drawings, FIGS. 10-14 illustrate a simulation learning environment for developing engine calibration data based on simulations and trained models, and further illustrate flowcharts describing methods and processing flows for calibration of online combustion engines using simulations operating within a simulation learning environment, where simulation learning is used to determine calibration data that when made available to a control system for a real-world system, is usable by the control system for modifying operating characteristics of the real-world system. For example, a control system may use calibration data for calibrating electronically controllable components of an engine, including components that are mechanical, electronic, or both mechanical and electronic.

For further explanation, FIG. 1 depicts a system (100) that includes a vehicle (102) operated by an operator (132). The vehicle (102) includes an engine (104), a memory (112), and one or more operator controls (128) that are coupled to one or more processors (120). In various implementations, the vehicle (102) may be one or more of: an aircraft (e.g., an airplane or unmanned aerial vehicle), a watercraft (e.g., a ship or submarine), or a land vehicle (e.g., an automobile), as illustrative, non-limiting examples. In alternate implementations, the electronic control module (150), the engine (104), operation sensors (118), and operator controls (128) are part of a power generator or other non-transportation equipment.

In some implementations, a vehicle includes an engine that has an electronically controllable valve coupled to a combustion chamber and configured to control flow into the combustion chamber, out of the combustion chamber, or both. The vehicle also includes a memory configured to store one or more trained models, and the one or more trained models include a valve control model. The vehicle includes one or more vehicle operation sensors configured to generate vehicle operation data. The vehicle operation data includes sensor data corresponding to a condition of the engine, control inputs indicative of operation of the vehicle, or a combination thereof. The vehicle also includes one or more processors configured to determine, using the valve control model, an operating characteristic of the electronically controllable valve at least partially based on the vehicle operation data and to generate a control signal to effect operation of the electronically controllable valve in accordance with the operating characteristic.

In some implementations, an apparatus for controlling an engine of a vehicle includes a memory configured to store one or more trained models, and the one or more trained models include a valve control model. The apparatus also includes one or more processors configured to receive vehicle operation data that includes sensor data corresponding to a condition of the engine, control inputs indicative of operation of the vehicle, or a combination thereof. The one or more processors are also configured to determine, using a trained valve control model, an operating characteristic of an electronically controllable valve of the engine at least partially based on the vehicle operation data, and to generate a control signal to effect operation of the electronically controllable valve in accordance with the operating characteristic.

In some implementations, a computer-readable storage device stores instructions that, when executed by one or more processors, cause the one or more processors to receive vehicle operation data that includes sensor data corresponding to a condition of an engine of a vehicle, control inputs indicative of operation of the vehicle, or a combination thereof. The instructions further cause the one or more processors to determine, using a trained valve control model, an operating characteristic of an electronically controllable valve of the engine at least partially based on the vehicle operation data and to generate a control signal to effect operation of the electronically controllable valve in accordance with the operating characteristic.

In some implementations, an apparatus for controlling an electronically controllable valve of an engine of a vehicle includes means for receiving vehicle operation data including sensor data corresponding to a condition of the engine, control inputs indicative of operation of the vehicle, or a combination thereof. The apparatus includes means for determining, using a trained valve control model, an operating characteristic of the electronically controllable valve at least partially based on the vehicle operation data. The apparatus also includes means for generating a control signal to effect operation of the electronically controllable valve in accordance with the operating characteristic.

In some implementations, a method of controlling an electronically controllable valve of an engine includes receiving, from one or more operation sensors, operation data including sensor data corresponding to a condition of the engine, control inputs indicative of operation of equipment that includes the engine, or a combination thereof. The method includes determining, using a trained valve control model, an operating characteristic of the electronically controllable valve at least partially based on the operation data, and generating a control signal to effect operation of the electronically controllable valve in accordance with the operating characteristic.

In some implementations, an apparatus for controlling an engine includes a memory configured to store one or more trained models, and the one or more trained models include a valve control model. The apparatus also includes one or more processors configured to receive operation data that includes sensor data corresponding to a condition of the engine, control inputs indicative of operation of equipment that includes the engine, or a combination thereof. The one or more processors are also configured to determine, using a trained valve control model, an operating characteristic of an electronically controllable valve of the engine at least partially based on the operation data, and to generate a control signal to effect operation of the electronically controllable valve in accordance with the operating characteristic.

In some implementations, a computer-readable storage device stores instructions that, when executed by one or more processors, cause the one or more processors to receive operation data that includes sensor data corresponding to a condition of an engine, control inputs indicative of operation of equipment that includes the engine, or a combination thereof. The instructions further cause the one or more processors to determine, using a trained valve control model, an operating characteristic of an electronically controllable valve of the engine at least partially based on the operation data and to generate a control signal to effect operation of the electronically controllable valve in accordance with the operating characteristic.

In some implementations, an apparatus for controlling an electronically controllable valve of an engine includes means for receiving operation data including sensor data corresponding to a condition of the engine, control inputs indicative of operation of equipment that includes the engine, or a combination thereof. The apparatus includes means for determining, using a trained valve control model, an operating characteristic of the electronically controllable valve at least partially based on the operation data. The apparatus also includes means for generating a control signal to effect operation of the electronically controllable valve in accordance with the operating characteristic.

In the example depicted in FIG. 1, the vehicle (102) uses a trained valve control model (116) to control operation of an electronically controllable valve (106) for adjusting operation of the engine (104). In some implementations, an electronically controllable valve (106) may be tuned or controlled to achieve one or more operating characteristics, where, by contrast, a valve that is mechanically controlled via a camshaft is unable to be similarly controlled to achieve the one or more operating characteristics. It is to be understood that although a single electronically controllable valve (106) is shown in FIG. 1 for ease of illustration, the engine (104) may include any number of electronically controllable valves, where each such valve may be controllable independently of other valves. In such examples, each electronically controllable valve may have a separate valve control model, or in some cases multiple electronically controllable valves may be controlled using a single valve control model. In this way, in some implementations, each of multiple electronically controllable valves may be controlled in unison.

In this example, the memory (112) and the one or more processors (120) are incorporated in an electronic control module (150) ("ECM") that is coupled to the engine (104) and to the one or more operator controls (128). In some implementations, the memory (112) includes volatile memory devices, non-volatile memory devices, or both, such as one or more hard drives, solid-state storage devices (e.g., flash memory, magnetic memory, or phase change memory), a random access memory (RAM), a read-only memory (ROM), one or more other types of storage devices, or any combination thereof.

In this example, the memory (112) stores data and instructions (e.g., computer code) that are executable by the one or more processors (120). For example, the instructions can include one or more trained models (114) (e.g., trained machine learning models) that are executable by the one or more processors (120) to initiate, perform, or control various operations of the vehicle (102). The one or more processors (120) include one or more single-core or multi-core central processing units (CPUs), one or more digital signal processors (DSPs), one or more graphics processing units (GPUs), or any combination thereof. Although the memory (112) and the one or more processors (120) are depicted within the electronic control module (150), in other implementations, one or both of the memory (112) and the one or more processors (120) may be external to the electronic control module (150).

In some implementations, the engine (104) includes an electronically controllable valve (106) coupled to a combustion chamber (108). The combustion chamber (108) is coupled to a reservoir (126) via the electronically controllable valve (106). The electronically controllable valve (106) is configured to control flow (110) (e.g., gaseous flow) into the combustion chamber (108), flow (111) out of the combustion chamber (108), or both. For example, the electronically controllable valve (106) may correspond to a cylinder valve (e.g., an intake valve or an exhaust valve) of an internal combustion engine that is controlled via a control signal (138), or multiple control signals, from the one or more processors (120) instead of via physical actuation by a rotating camshaft. For example, the engine (104) may be a camless engine in which all cylinder valves are electronically controlled via a set of control signals (e.g., the control signal (138) represents, or is part of, a set of control signals for all cylinder valves). An example of operation of the electronically controllable valve (106) is provided in further detail with reference to FIG. 6.

In some implementations, the engine (104) includes a gasoline engine, a diesel engine, or is adjustable to switch between diesel operation and gasoline operation, as illustrative, non-limiting examples. In some implementations, the engine (104) is configured to operate using carbon dioxide-free fuels (e.g., carbon-neutral fuels, such as synthetic hydrocarbons generated using renewable energy), renewable fuels (e.g., fossil-free fuels, such as biofuels), or one or more other environmentally friendly fuels.

In some implementations, the engine (104) includes a set of valves, where a first subset of the valves include electronically controllable valves (106), and where a second subset of the valves include valves controlled by a camshaft via physical actuation.

In some implementations, the vehicle (102) includes one or more vehicle operation sensors (118) configured to generate sensor data (124) that may be, or is included as part of, vehicle operation data (136). In some examples, the vehicle operation data (136) may include sensor data (124) corresponding to a condition of the engine (104), including a condition of any components within the engine or coupled to the engine. Further, in some examples, the vehicle operation data (136) may, in addition to or instead of sensor data (124), include control inputs (130). In some examples, the control inputs (130) may be, or are included as part of, vehicle operation data (136), where the control inputs (130) may be generated via vehicle operation sensors (not depicted) coupled to the one or more operator controls (128) and indicative of operation of the vehicle (102).

Examples of sensor data (124) include various measurements corresponding to temperatures, pressures, engine speed, battery condition, air intake and exhaust flows, exhaust oxygen levels, one or more other measurements, or any combination thereof. Examples of the control inputs (130) includes data representing position and movement of one or more operator controls (128), such as from one or more sensor coupled to an throttle (e.g., an accelerator pedal), a brake pedal, a clutch pedal, a steering wheel, a gear shift control, a traction control button, a ride height control, a cruise control, one or more other controls, or any combination thereof.

In some implementations, the memory (112) may be configured to store one or more trained models (114) that are executable by the one or more processors (120) to determine operating characteristics related to the vehicle (102) based on various sensor and control inputs. For example, the one or more trained models (114) may include neural networks, classifiers, regression models, or other types of models, such as described further with reference to FIG. 5. As illustrated, the one or more trained models (114) include a valve control model (116) that is trained to determine, responsive to receiving, and based at least in part on, the vehicle operation data (136), an operating characteristic (134) corresponding to the electronically controllable valve (106), as described further below.

In some implementations, the one or more processors (120) may include, or are coupled to, a vehicle operation data interface (122) ("VOD I/F") that is configured to receive vehicle operation data (136). For example, the vehicle operation data interface (122) may receive control inputs (130) from the one or more operator controls (128) and sensor data (124) from one or more vehicle operation sensors (118). In an illustrative implementation, the vehicle operation data interface (122) may be an electrical signal bus, an optical signal bus, and/or a wireless interface.

In some implementations, the one or more processors (120) may be configured to determine, using the valve control model (116), an operating characteristic (134) of the electronically controllable valve (106) at least partially based on vehicle operation data (136). In some implementations, an operating characteristic (134) may be one or more of: displacement of an electronically controllable valve (106) with respect to a particular position (e.g., a lift (142) of the electronically controllable valve (106) from a seated or closed position), timing (144) of the electronically controllable valve (106) (e.g., timing when to open and close the electronically controllable valve (106) based on angular positions of a crankshaft of the engine 104), a duration (146) of an open state or a closed state of an electronically controllable valve (106), or valve speed (148) (e.g., how quickly the electronically controllable valve (106) opens or closes).

In some implementations, the one or more processors (120) are configured to generate control signals (138) via a control signal interface (140) to effect operation of the electronically controllable valve (106) in accordance with an operating characteristic (134). In an illustrative implementation, the control signal interface (140) may be an electrical signal bus, an optical signal bus, and/or a wireless interface.

In some implementations, during operation of the vehicle (102), a control loop for operation of the electronically controllable valves (106) includes receiving vehicle operation data (136) (e.g., control inputs (130) from one or more operator controls (128) and sensor data (124) indicating a state of the engine (104)), inputting at least a portion of the vehicle operation data (136) to the valve control model (116) to generate an operating characteristic (134), and sending the control signal (138) based on the operating characteristic (134) to adjust operation of the electronically controllable valves (106). Adjusting operation of the electronically controllable valves (106) affects performance of the engine (104) and consequently affects performance of the vehicle (102).

In some implementations, the valve control model (116) is trained to optimize or balance one or more characteristics of the engine (104), such as power output, torque production, fuel efficiency, emissions, responsiveness, and engine longevity, as illustrative, non-limiting examples. In some implementations, the valve control model (116) is generated and installed by a manufacturer of the vehicle (102) based on experimental or test data generated using one or more test vehicles, the vehicle (102) itself, or a combination thereof. The valve control model (116) may indicate default values that enhance operation of the vehicle (102), as compared to conventional non-adjustable cam-operated valves, by tuning performance of the engine (104) based on the state of the engine (104) and the control inputs (130) responsive to the operator (132) of the vehicle (102). The operator (132) can be within the vehicle (102), such as within a cabin or cockpit of the vehicle (102), or remote from the vehicle (102), such as in implementations in which the one or more operator controls (128) include a remote controller for the vehicle (102) (e.g., for remote control of the vehicle (102) via wireless signaling).

In some implementations, the valve control model (116) can be updated after a period of use of the vehicle (102). For example, the one or more processors (120) may be configured to store a history of vehicle operation data (136) and to update (e.g., periodically, continuously, or according to some other schedule) the valve control model (116), such as to adapt to changes in engine performance, changes in performance requirements of the operator (132) as inferred from the control inputs (130), or changes due to external factors (e.g., environmental regulations regarding emissions or instructions received from an external authority), as illustrative, non-limiting examples. Alternatively, or in addition, such history information may be transmitted to a remote system (e.g., to a cloud-based server system via a wireless network) that determines such updates and pushes data indicative of the updated valve control model (116) to the vehicle (102). In some implementations, update of the valve control model (116) is further based on aggregated data from multiple vehicles, such as by using historical data of a group of vehicles sharing similar aspects as the vehicle (102). Thus, in various implementations, valve control may be dynamically adjusted due to characteristics (or changes in characteristics) of the vehicle (102), the operator (132), the weather or other environmental factors, vehicle regulations, etc.

In some implementations, use of the one or more trained models (114) to control valve operation enables operation of the engine (104) with more power, higher fuel efficiency, or both, as compared to using mechanical linkages to operate the valves, and also as compared to using pre-programmed valve control or control based on simple heuristics. In addition, or alternatively, controlling operation of the engine (104) using the one or more trained models (114) enables a smaller and lighter engine to be used in the vehicle (102) with equivalent or improved performance as compared to conventional engines. Reduced engine size and weight enables improved fuel efficiency and relaxed design constraints as compared to using larger, heavier engines. In a particular example, using a smaller engine enables the engine to be positioned lower in the vehicle (102), lowering the center of gravity of the vehicle (102) and enabling improved handling, road grip, etc. Although fuel efficiency is generally improved due to reduced engine size and weight, using the one or more trained models (114) to control valve operation specifically enables the engine (104) to operate with enhanced fuel efficiency as compared to using mechanical linkages to operate the valves and also as compared to using pre-programmed valve control or control based on simple heuristics.

Although in some implementations, the engine (104) may be an internal combustion-type engine, in other implementations the engine (104) may be a hybrid engine, such as a hybrid electric-petroleum engine that also includes electric motors and a battery set. In such implementations, sensor data (124) may further include data corresponding to electrical components of the engine (104), such as battery charge and current-voltage characteristics, as illustrative, non-limiting examples. Further, in this example, the one or more trained models (114) may be configured to adjust valve operation further based on the state of the electrical components, such as to tune the internal combustion engine to enhance fuel efficiency while maintaining vehicle performance in parallel hybrid configuration, or to enhance internal combustion engine performance in a power-split hybrid configuration in response to detection of depleted battery charge, as illustrative, non-limiting examples.

In some implementations, although the one or more trained models (114) are described as including the valve control model (116), in other implementations, the one or more trained models (114) also include other trained models that can provide inputs to, or operate in parallel with, the valve control model (116). Other trained models that may be included in the one or more trained models (114) include a travel type model, a fleet operation model, an operator type model, or any combination thereof, as described further with reference to FIGS. 2-4B.

In accordance with one or more disclosed aspects, an apparatus for controlling an electronically controllable valve of an engine of a vehicle includes means for receiving vehicle operation data including sensor data corresponding to a condition of the engine, control inputs indicative of operation of the vehicle, or a combination thereof. For example, in a particular implementation the means for receiving vehicle operation data includes the vehicle operation data interface (122), the one or more processors (120), the electronic control module 150, one or more other circuits or devices to receive vehicle operation data, or any combination thereof.

The apparatus includes means for determining, using a trained valve control model, an operating characteristic of the valve at least partially based on the vehicle operation data. For example, in a particular implementation the means for determining the operating characteristic of the valve includes the one or more processors (120), the memory (112), the electronic control module (150), one or more other circuits or devices to determine, using a trained valve control model, an operating characteristic of the valve, or any combination thereof.

The apparatus also includes means for generating a control signal to effect operation of the valve in accordance with the operating characteristic. For example, in a particular implementation the means for generating the control signal includes the control signal interface (140), the one or more processors (120), the electronic control module (150), one or more other circuits or devices to generate the control signal, or any combination thereof.

In accordance with one or more disclosed aspects, an apparatus for controlling an electronically controllable valve of an engine includes means for receiving operation data including sensor data corresponding to a condition of the engine, control inputs indicative of operation of equipment that includes the engine, or a combination thereof. For example, in a particular implementation the means for receiving operation data includes the vehicle operation data interface (122), the one or more processors (120), the electronic control module (150), one or more other circuits or devices to receive operation data, or any combination thereof.

The apparatus includes means for determining, using a trained valve control model, an operating characteristic of the valve at least partially based on the operation data. For example, in a particular implementation the means for determining the operating characteristic of the valve includes the one or more processors (120), the memory (112), the electronic control module (150), one or more other circuits or devices to determine, using a trained valve control model, an operating characteristic of the valve, or any combination thereof.

The apparatus also includes means for generating a control signal to effect operation of the valve in accordance with the operating characteristic. For example, in a particular implementation the means for generating the control signal includes the control signal interface (140), the one or more processors (120), the electronic control module (150), one or more other circuits or devices to generate the control signal, or any combination thereof.

Figure 2:
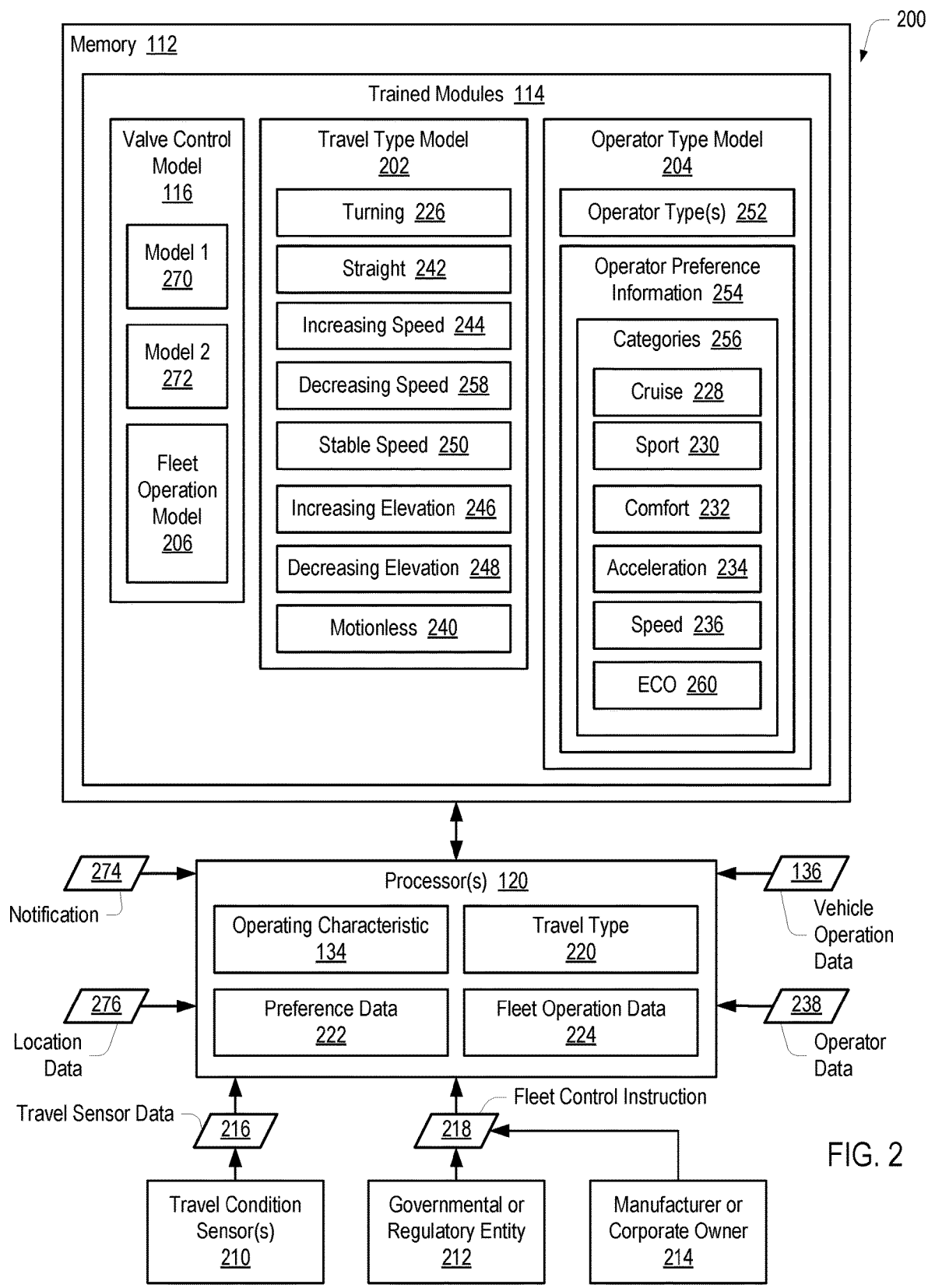
FIG. 2 is a block diagram of components that may be included in the vehicle of FIG. 1 in accordance with some examples of the present disclosure.

For further explanation, FIG. 2 depicts a diagram (200) of a particular implementation of components that may be included in the vehicle (102) in conjunction with controlling the electronically controllable valve 106 using one or more additional trained models (114). As illustrated, in addition to the valve control model (116), the one or more trained models (114) include a travel type model (202), an operator type model (204), and a fleet operation model (206).

In some implementations, the vehicle (102) includes one or more travel condition sensors (210) that are configured to generate travel sensor data (216) corresponding to a travel condition. In an illustrative example, the one or more travel condition sensors (210) can correspond to one or more magnetic compasses, accelerometers, location or positioning sensors, cameras, pressure sensors, temperature sensors, altimeters, or any other sensor that can generate data indicative of a travel condition. The one or more processors (120) are configured to determine, using the travel type model (202), a travel type (220) based on the travel sensor data (216), and to determine the operating characteristic (134) further based on the travel type (220). For example, in a particular implementation, the travel type model (202) is configured to process the travel sensor data (216) to select the travel type (220) from among a plurality of travel types based on the travel sensor data (216). In an illustrative implementation, the plurality of travel types includes at least one of: turning (226), straight travel (242), increasing speed (244), decreasing speed (258), stable speed (250), increasing elevation (246), decreasing elevation (248), or motionless (240). In other implementations, other travel types may be used in place of, or in addition to, any or all of the travel types illustrated in FIG. 2. For example, in implementations in which the vehicle (102) is an aircraft, the travel type model (202) may be configured to select from among different travel types as compared to implementations in which the vehicle (102) is a land vehicle or a watercraft.

In some implementations, the one or more processors (120) are further configured to determine, using the operator type model (204), preference data (222) corresponding to an operator (132) of the vehicle (102), and to determine an operating characteristic (134) further based on the preference data (222). For example, the one or more processors (120) may receive operator data (238) indicating an identity of an operator of the vehicle (102), measured characteristics of the operator (132), such as data corresponding to the control inputs (130), biometric data such as voice, facial recognition, weight, etc., or other data that is indicative of the operator (132). In this example, the measured characteristics of the operator may enable selection of a particular operator profile or determination of a particular one of one or more operator types (252). Examples of the operator types (252) may include aggressive, defensive, conservative, abrupt, smooth, and high-performance, one or more other operator types, or any combination thereof.

In a particular implementation, the operator type model (204) includes, for each of the one or more operator types (252), operator preference information (254) regarding a plurality of travel types. As an illustrative example, the operator preference information (254) indicates a preference for one or more categories (256) corresponding to at least one of cruise (228), sport (230), comfort (232), acceleration (234), speed (236), or economy ("ECO") (260). Each of the one or more categories (256) can correspond a type of vehicle performance that is preferred, or predicted to be preferred, by a particular operator (132) or operator type based on each particular type of travel of the vehicle (102). As an example, the operator type model (204) may determine that an "aggressive" operator type prefers that the vehicle (102) operate according to the acceleration (234) category (e.g., adjusting throttle response, transmission shift points, etc. for improved power and performance), when the determined travel type (220) corresponds to straight travel (242) and that a "conservative" operator type prefers that the vehicle (102) operates according to the ECO (260) category (e.g., adjusting throttle response, transmission shift points, etc. for improved fuel efficiency) when the travel type (220) corresponds to straight travel (242). As another example, the operator type model (204) may determine that an "aggressive" operator type prefers that the vehicle (102) operates according to the sport (230) category when the determined travel type (220) corresponds to turning (226) and that a "conservative" operator type prefers that the vehicle (102) operate according to the comfort (232) category when the travel type (220) corresponds to turning (226).

In a particular implementation, the one or more processors (120) are further configured to determine, using the fleet operation model (206), fleet operation data (224) corresponding to fleet control data (218) that is received at the vehicle (102) and to determine the operating characteristic (134) further based on the fleet operation data (224). In some examples, the fleet control data (218) corresponds to an instruction from a governmental or regulatory entity (212). To illustrate, a municipality may issue fleet control data (218) instructing vehicles to operate in a lowered-emission mode in response to air pollution levels exceeding a threshold amount. In other example, the fleet control data (218) corresponds to an instruction from a manufacturer or corporate owner (214) of the vehicle (102). To illustrate, an owner of a fleet of vehicles including the vehicle (102) (e.g., the vehicle (102) may be a commercial aircraft owned by an airline or a delivery truck owned by a business) may issue the fleet control data (218) instructing vehicles in the fleet to operate in an increased fuel-efficiency mode in response to an increase in fuel prices.

In some implementations, a travel type (220), a preference data (222), and fleet operation data (224) may be used in conjunction with the vehicle operation data (136) to determine the operating characteristic (134), where the operating characteristic (134) may be used to generate a control signal (138). The operating characteristic (134) may generally correspond to a default value based on the vehicle operation data (136), as modified or adjusted based on the operator's preference, based on the type of travel indicated by the travel type (220), and responsive to the fleet control data (218). Thus, various independent (and potentially competing) criteria may be factored into the final determination of how the electronically controllable valve (106) is to be controlled. More generally, independent criteria may include any type of complementary data, such as geography, terrain, climate, traffic-related information, road conditions, GPS measurements such as altitude or global coordinates, information that may be obtained through sensors, through communication links providing external condition information or driving preferences from personal computing devices for an operator, or some other type of information relevant to or describing how a vehicle may be operating—including combinations of these various independent criteria.

Further, in some examples, a valve control model (116) includes multiple selectable models, illustrated as a first model (270) and a second model (272). The valve control model (116) may be configured to select a particular model from among the multiple selectable models (270, 272) to generate an operating characteristic (134). As a first example, the first model (270) may be trained for operating the engine (104) and may be updated periodically, as described above. The first model (270) may be configured to enhance, maximize, or improve one or more aspects of performance, such as horsepower, torque, fuel efficiency, etc., in conformance with a regulatory requirement, such as fuel efficiency or emissions restrictions. However, if the regulatory requirement is updated (e.g., emissions are further restricted), operation of the vehicle (102) in accordance with the first model 270 may result in the vehicle (102) being in violation of the updated regulatory requirement. In response to announcement or promulgation of the updated regulatory requirement, the second model (272) may be generated and provided to the memory (112) (e.g., via wireless data transmission) to enable operation of the vehicle (102) in conformance with the updated regulatory requirement. The vehicle (102) may continue to use the first model 270 until a notification (274) is received, such as from a manufacturer of the vehicle (102), to deselect the first model 270 and to select the second model (272). As a result, when a new regulation on fuel efficiency or emissions is promulgated, the vehicle (102) can remain in compliance with the new regulation with negligible cost as compared to conventional alternatives, such as upgrading or replacing the vehicle (102).

As a second example, the first model (270) may be trained for operating the engine (104) in compliance with regulations of a first jurisdiction, and the second model (272) may be trained for operating the engine (104) in compliance with regulations of a second jurisdiction. Location data (276) (e.g., Global Positioning System (GPS) data, one or more other types of location data, or any combination thereof) may be received at the one or more processors (120) and compared to jurisdiction boundary data to determine which jurisdiction the vehicle (102) is located in and to select the appropriate one of the first model (270) and the second model (272). Although two models (270, 272) are illustrated, in other implementations any number of models may be trained, downloaded, stored, and selected during operation of the vehicle (102).

As a third example, one or more additional models may be included for various uses of the vehicle (102) within a particular jurisdiction. For example, a particular jurisdiction may enact strict emissions regulations but may provide an exception for vehicles operating on a racetrack. Thus, the vehicle (102) may operate using the first model (270) to comply with that jurisdiction's strict emissions requirements, and when the location data (276) indicates that the vehicle (102) has entered (or is within) a geographic boundary of a racetrack (e.g., within a geofence around the racetrack), the second model (272) may be selected to enable the vehicle (102) to operate in a higher-performance mode. Other location-based models may be used based on particular jurisdictional requirements, such as for regulations that distinguish between urban and rural operation, as an illustrative, non-limiting examples.

In some implementations, while descriptive labels are used to provide examples of various categories and classes associated with the trained models (114) for purpose of explanation, it should be understood that the various categories and classes used by one or more of the trained models (114) may be determined based on processing empirical data, such as using an unsupervised machine learning clustering analysis, as a non-limiting example. For example, the travel types used by the travel type model (202), the operator types (252) used by the operator type model (204), the categories (256) used by the operator type model (204), or any combination thereof, may be generated based on supervised or unsupervised analysis of data from one or more sources, such as an aggregated history of sensor data and operator control data from a fleet of vehicles. Such categories and classes are subject to change as additional data collection and analysis results in updated models that are provided to the vehicle (102). In some examples, valve control models may be generated based on reinforcement learning with respect to an engine performance simulator environment.

Further, while FIG. 2 depicts an implementation that uses four trained models (114), in other implementations, one or more of the trained models (114) may be omitted, one or more additional models may be included, or any combination thereof. Examples of various implementations that include different combinations of the valve control model (116), the travel type model (202), the operator type model (204), and the fleet operation model (206) are described with reference to FIGS. 3A-3C and FIGS. 4A and 4B.

Figure 3A:
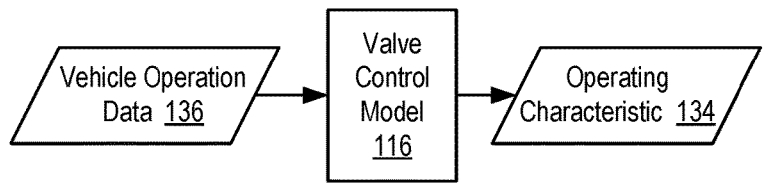
FIG. 3A is a data flow diagram of an example of using a trained model to determine an operating characteristic associated with an electronically controllable valve in accordance with some examples of the present disclosure.
Figure 3B:
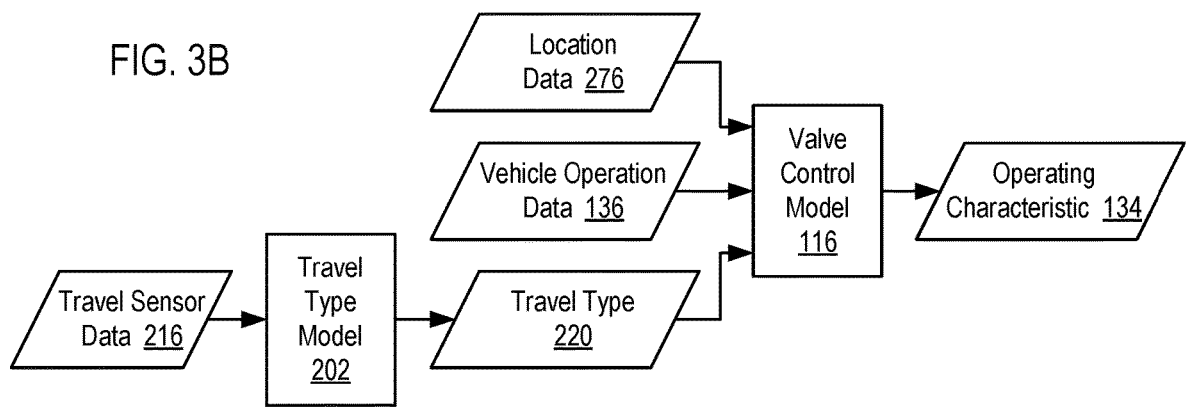
FIG. 3B is a data flow diagram of an example of using multiple trained models to determine an operating characteristic associated with an electronically controllable valve in accordance with some examples of the present disclosure.
Figure 3C:
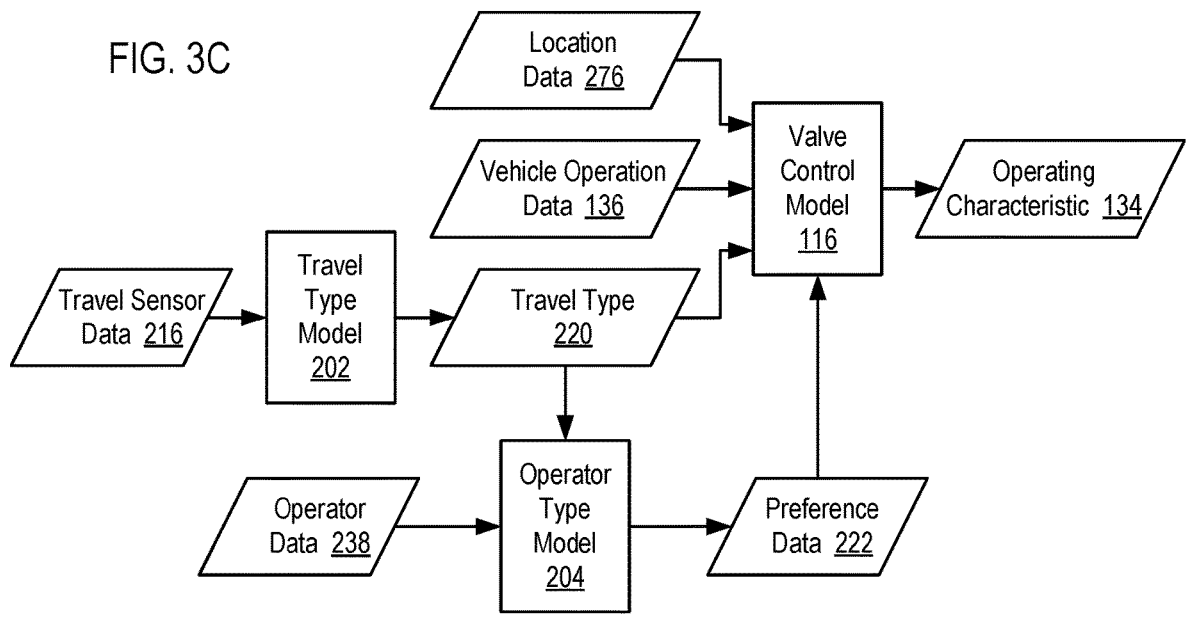
FIG. 3C is a data flow diagram of an example of using multiple trained models to determine an operating characteristic associated with an electronically controllable valve in accordance with some examples of the present disclosure.

For further explanation, FIGS. 3A-3C depict diagrams of various examples of operation in which the one or more trained models (114) are used to determine an operating characteristic (134). FIG. 3A corresponds to an implementation in which the vehicle operation data (136) is received and processed by the valve control model (116) to generate the operating characteristic (134), such as described with reference to FIG. 1. For example, the valve control model (116) can include a classifier that maps the vehicle operation data (136) to a discrete value or set of values of the lift (142), timing (144), duration (146), and valve speed (148) that are output as the operating characteristic (134). As another example, the valve control model (116) can include a regression model that maps the vehicle operation data (136) to particular values of a set of continuous values corresponding to the lift (142), timing (144), duration (146), and valve speed (148) that are output as the operating characteristic (134).

For further explanation, FIG. 3B depicts an implementation that includes the valve control model (116) and the travel type model (202). The travel type model (202) receives and processes the travel sensor data (216) and outputs the travel type (220). The valve control model (116) receives the vehicle operation data (136), the location data (276), and the travel type (220) as inputs. The valve control model (116) is configured to process the vehicle operation data (136) in conjunction with the travel type (220) and the location data (276) to determine the operating characteristic (134).

For further explanation, FIG. 3C depicts an implementation that includes the valve control model (116), the travel type model (202), and the operator type model (204). The travel type model (202) receives and processes the travel sensor data (216) and outputs the travel type (220). The operator type model (204) receives and processes the travel type (220) and the operator data (238) to determine the preference data (222). The valve control model (116) receives the vehicle operation data (136), the location data (276), the travel type (220), and the preference data (222) as inputs. The valve control model (116) is configured to process the vehicle operation data (136) in conjunction with the location data (276), the travel type (220) and the preference data (222) to determine the operating characteristic (134).

Figure 4A:
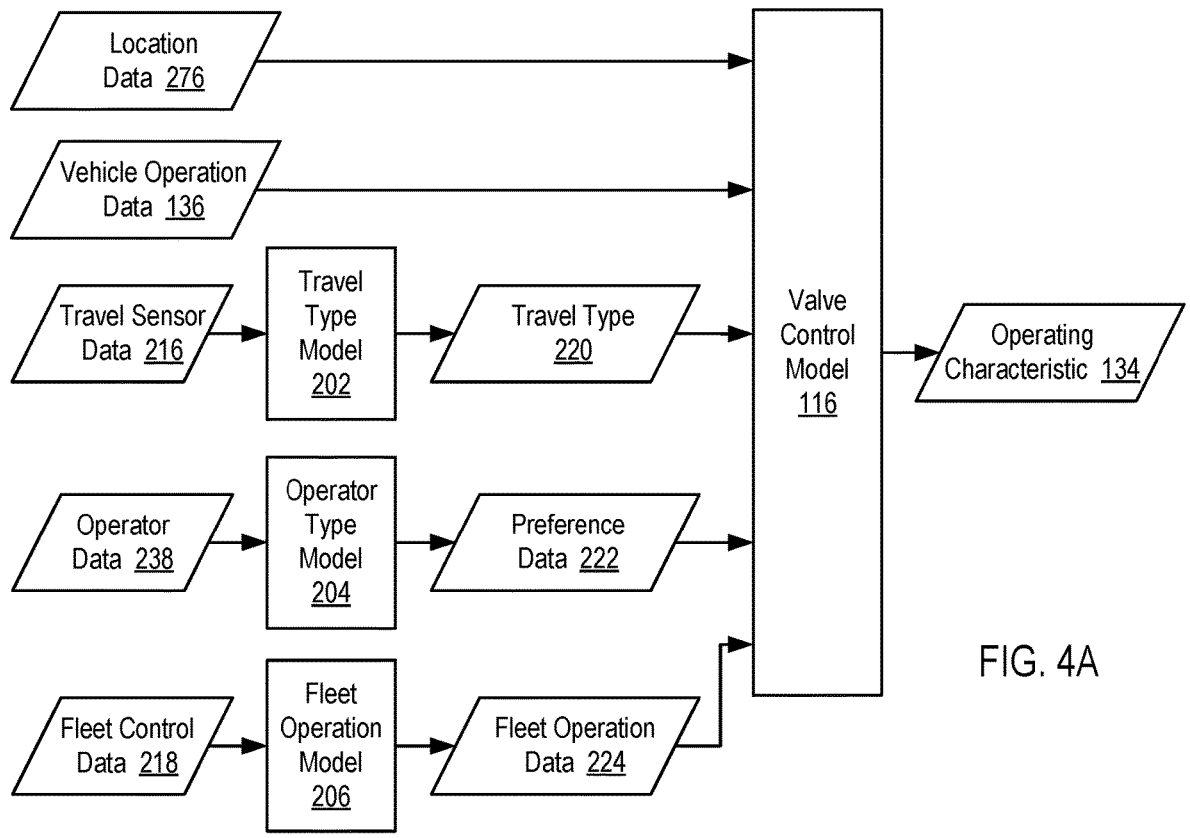
FIG. 4A is a data flow diagram of an example of using multiple trained models to determine an operating characteristic associated with an electronically controllable valve in accordance with some examples of the present disclosure.

For further explanation, FIG. 4A depicts an implementation that includes a valve control model (116), a travel type model (202), a operator type model (204), and a fleet operation model (206). The travel type model (202) receives and processes the travel sensor data (216) and outputs the travel type (220). The operator type model (204) receives and processes the operator data (238) and outputs the preference data (222), although in other implementations the operator type model (204) is also responsive to the travel type (220). The fleet operation model (206) receives and processes the fleet control data (218) and outputs the fleet operation data (224). The valve control model (116) receives the vehicle operation data (136), the location data (276), the travel type (220), the preference data (222), and the fleet operation data (224) as inputs. The valve control model (116) is configured to process the vehicle operation data (136) in conjunction with the location data (276), the travel type (220), the preference data (222), and the fleet operation data (224) to determine the operating characteristic (134).

Figure 4B:
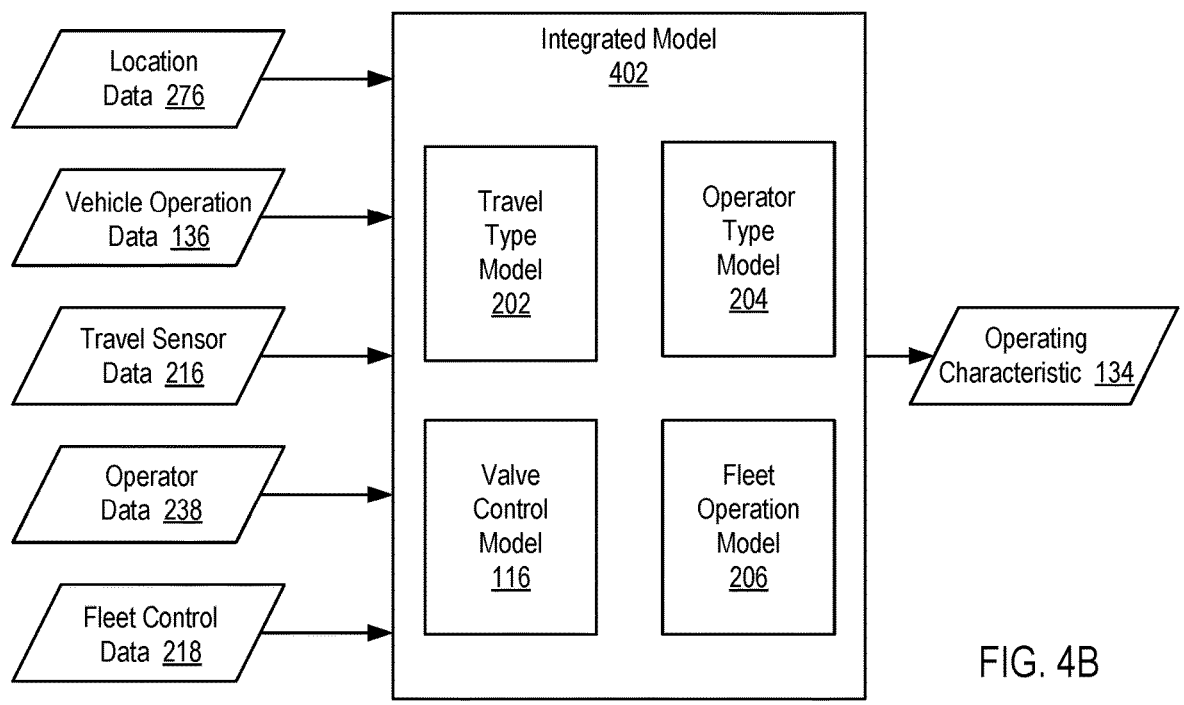
FIG. 4B is a data flow diagram of a particular example of using an integrated model to determine an operating characteristic associated with an electronically controllable valve in accordance with some examples of the present disclosure.

In contrast to FIGS. 3A-3C and FIG. 4A, in which the valve control model (116) generates the operating characteristic (134) based on received inputs that include one or more of vehicle operation data (136), location data (276), travel type (220), preference data (222), and fleet operation data (224), FIG. 4B depicts an implementation in which an integrated model (402) is configured to generate an operating characteristic (134) based on inputs including travel sensor data (216), operator data (238), fleet control data (218), and vehicle operation data (136). The integrated model (402) includes functionality associated with the valve control model (116), the travel type model (202), the operator type model (204), and the fleet operation model (206), although the valve control model (116), the travel type model (202), the operator type model (204), and the fleet operation model (206) are not implemented as discrete, separate components as in FIG. 4A.

Implementing the valve control model (116), the travel type model (202), the operator type model (204), and the fleet operation model (206) as discrete components as in FIG. 4A enables smaller, less complex individual modules that may be independently updated, thereby using reduced processing resources, as compared to updating a single integrated model. However, using the single integrated model (402) of FIG. 4B enables the operating characteristic (134) to be determined based on the combined inputs with enhanced accuracy as compared to using the multiple independent models of FIG. 4A.

Figure 5:
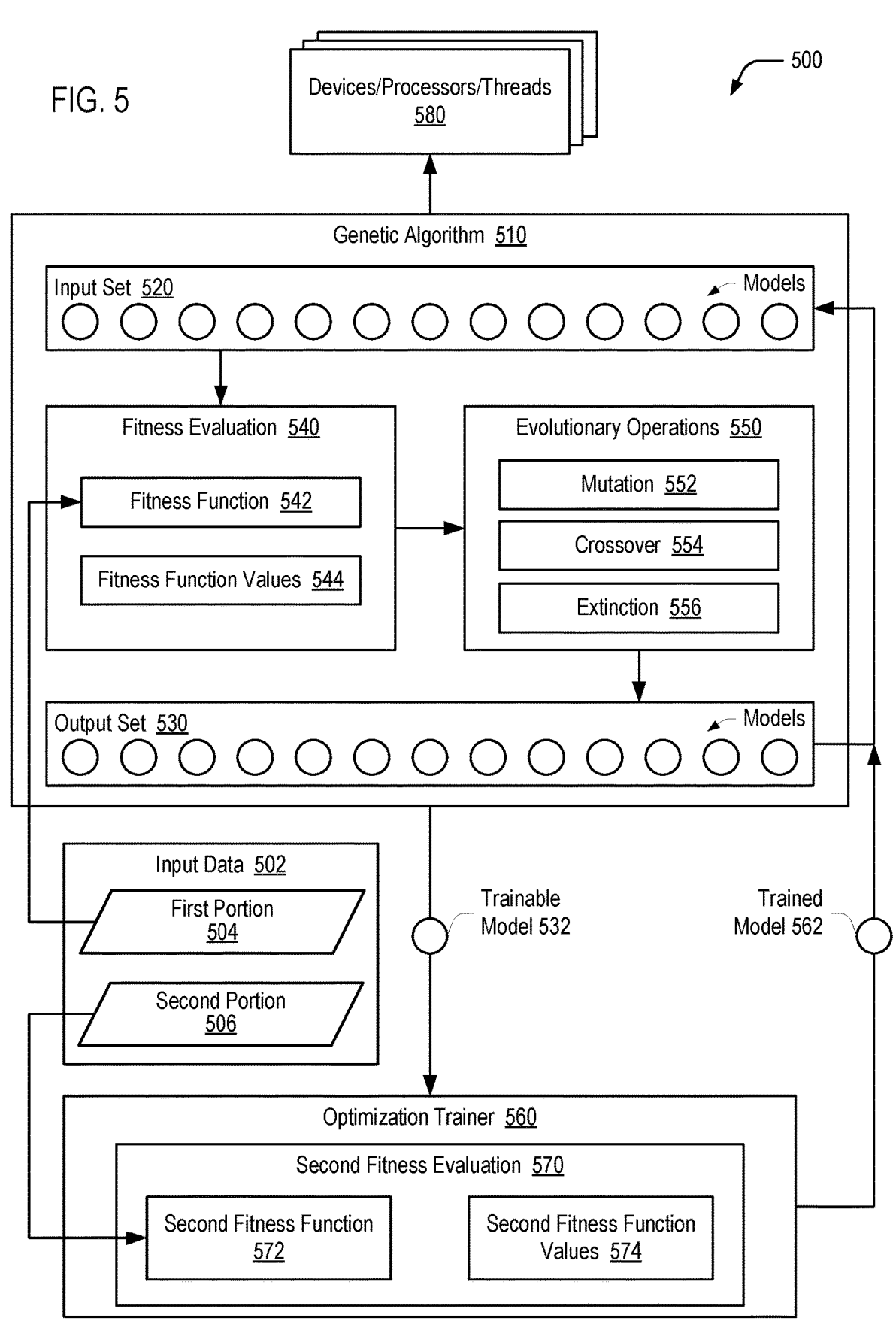
FIG. 5 is a diagram of an example of a system to generate one or more trained models that are used in conjunction with controlling an electronically controllable valve in accordance with some examples of the present disclosure.

For further explanation, FIG. 5 depicts an example of a system (500) for generating a machine learning data model, such as one or more of the trained models (114), that can be used by the one or more processors (120), the ECM (150), or the vehicle (102). Although FIG. 5 depicts a particular example for purpose of explanation, in other implementations other systems may be used for generating or updating one or more of the trained models (114).

In some examples, the system (500), or portions thereof, may be implemented using (e.g., executed by) one or more computing devices, such as laptop computers, desktop computers, mobile devices, servers, and Internet of Things devices and other devices utilizing embedded processors and firmware or operating systems, etc. In the illustrated example, the system (500) includes a genetic algorithm (510) and an optimization trainer (560). The optimization trainer (560) is, for example, a backpropagation trainer, a derivative free optimizer (DFO), an extreme learning machine (ELM), etc. In particular implementations, the genetic algorithm (510) is executed on a different device, processor (e.g., central processor unit (CPU), graphics processing unit (GPU) or other type of processor), processor core, and/or thread (e.g., hardware or software thread) than the optimization trainer (560). The genetic algorithm (510) and the optimization trainer (560) are executed cooperatively to automatically generate a machine learning data model (e.g., one of the trained models (114) of FIGS. 1-2, such as depicted in FIGS. 3A-4B and referred to herein as "models" for ease of reference), such as a neural network or an autoencoder, based on the input data (502). In this example, the system (500) performs an automated model building process that enables users, including inexperienced users, to quickly and easily build highly accurate models based on a specified data set.

In some implementations, during configuration of the system (500), a user specifies the input data (502). In some implementations, the user may also specify one or more characteristics of models that can be generated. In such implementations, the system (500) constrains models processed by the genetic algorithm (510) to those that have the one or more specified characteristics. For example, the specified characteristics may constrain allowed model topologies (e.g., to include no more than a specified number of input nodes or output nodes, no more than a specified number of hidden layers, no recurrent loops, etc.). In some examples, constraining the characteristics of the models can reduce the computing resources (e.g., time, memory, processor cycles, etc.) needed to converge to a final model, can reduce the computing resources needed to use the model (e.g., by simplifying the model), or both.

In some implementations, a user can configure aspects of the genetic algorithm (510) via input to graphical user interfaces (GUIs). For example, the user may provide input to limit a number of epochs that will be executed by the genetic algorithm (510). Alternatively, the user may specify a time limit indicating an amount of time that the genetic algorithm (510) has to execute before outputting a final output model, and the genetic algorithm (510) may determine a number of epochs that will be executed based on the specified time limit. To illustrate, an initial epoch of the genetic algorithm (510) may be timed (e.g., using a hardware or software timer at the computing device executing the genetic algorithm (510)), and a total number of epochs that are to be executed within the specified time limit may be determined accordingly. As another example, the user may constrain a number of models evaluated in each epoch, for example by constraining the size of an input set (520) of models and/or an output set (530) of models.

In some implementations, a genetic algorithm (510) represents a recursive search process. Consequently, each iteration of the search process (also called an epoch or generation of the genetic algorithm (510)) has an input set (520) of models (also referred to herein as an input population) and an output set (530) of models (also referred to herein as an output population). The input set (520) and the output set (530) may each include a plurality of models, where each model includes data representative of a machine learning data model. For example, each model may specify a neural network or an autoencoder by at least an architecture, a series of activation functions, and connection weights. The architecture, also referred to herein as a topology, of a model includes a configuration of layers or nodes and connections therebetween. The models may also be specified to include other parameters, including but not limited to bias values/functions and aggregation functions.

For example, each model can be represented by a set of parameters and a set of hyperparameters. In this context, the hyperparameters of a model define the architecture of the model (e.g., the specific arrangement of layers or nodes and connections), and the parameters of the model refer to values that are learned or updated during optimization training of the model. For example, the parameters include or correspond to connection weights and biases.

In a particular implementation, a model is represented as a set of nodes and connections therebetween. In such implementations, the hyperparameters of the model include the data descriptive of each of the nodes, such as an activation function of each node, an aggregation function of each node, and data describing node pairs linked by corresponding connections. The activation function of a node is a step function, sine function, continuous or piecewise linear function, sigmoid function, hyperbolic tangent function, or another type of mathematical function that represents a threshold at which the node is activated. The aggregation function is a mathematical function that combines (e.g., sum, product, etc.) input signals to the node. An output of the aggregation function may be used as input to the activation function.

In other implementations, the model is represented on a layer-by-layer basis. For example, the hyperparameters define layers, and each layer includes layer data, such as a layer type and a node count. Examples of layer types include fully connected, long short-term memory (LSTM) layers, gated recurrent units (GRU) layers, and convolutional neural network (CNN) layers. In some implementations, all of the nodes of a particular layer use the same activation function and aggregation function. In such implementations, specifying the layer type and node count fully may describe the hyperparameters of each layer. In other implementations, the activation function and aggregation function of the nodes of a particular layer can be specified independently of the layer type of the layer. For example, in such implementations, one fully connected layer can use a sigmoid activation function and another fully connected layer (having the same layer type as the first fully connected layer) can use a tan h activation function. In such implementations, the hyperparameters of a layer include layer type, node count, activation function, and aggregation function. Further, a complete autoencoder is specified by specifying an order of layers and the hyperparameters of each layer of the autoencoder.

In some implementations, a genetic algorithm (510) may be configured to perform speciation. For example, the genetic algorithm (510) may be configured to cluster the models of the input set (520) into species based on "genetic distance" between the models. The genetic distance between two models may be measured or evaluated based on differences in nodes, activation functions, aggregation functions, connections, connection weights, layers, layer types, latent-space layers, encoders, decoders, etc. of the two models. In an illustrative example, the genetic algorithm (510) may be configured to serialize a model into a bit string. In this example, the genetic distance between models may be represented by the number of differing bits in the bit strings corresponding to the models. The bit strings corresponding to models may be referred to as "encodings" of the models.

In some implementations, after configuration, a genetic algorithm (510) may begin execution based on the input data (502). Parameters of the genetic algorithm (510) may include but are not limited to, mutation parameter(s), a maximum number of epochs the genetic algorithm (510)

will be executed, a termination condition (e.g., a threshold fitness value that results in termination of the genetic algorithm (510) even if the maximum number of generations has not been reached), whether parallelization of model testing or fitness evaluation is enabled, whether to evolve a feedforward or recurrent neural network, etc. As used herein, a "mutation parameter" affects the likelihood of a mutation operation occurring with respect to a candidate neural network, the extent of the mutation operation (e.g., how many bits, bytes, fields, characteristics, etc. change due to the mutation operation), and/or the type of the mutation operation (e.g., whether the mutation changes a node characteristic, a link characteristic, etc.). In some examples, the genetic algorithm (510) uses a single mutation parameter or set of mutation parameters for all of the models. In such examples, the mutation parameter may impact how often, how much, and/or what types of mutations can happen to any model of the genetic algorithm (510). In alternative examples, the genetic algorithm (510) maintains multiple mutation parameters or sets of mutation parameters, such as for individual or groups of models or species. In particular aspects, the mutation parameter(s) affect crossover and/or mutation operations, which are further described below.

In some implementations, for an initial epoch of a genetic algorithm (510), the topologies of the models in the input set (520) may be randomly or pseudo-randomly generated within constraints specified by the configuration settings or by one or more architectural parameters. Accordingly, the input set (520) may include models with multiple distinct topologies. For example, a first model of the initial epoch may have a first topology, including a first number of input nodes associated with a first set of data parameters, a first number of hidden layers including a first number and arrangement of hidden nodes, one or more output nodes, and a first set of interconnections between the nodes. In this example, a second model of the initial epoch may have a second topology, including a second number of input nodes associated with a second set of data parameters, a second number of hidden layers including a second number and arrangement of hidden nodes, one or more output nodes, and a second set of interconnections between the nodes. The first model and the second model may or may not have the same number of input nodes and/or output nodes. Further, one or more layers of the first model can be of a different layer type that one or more layers of the second model. For example, the first model can be a feedforward model, with no recurrent layers; whereas, the second model can include one or more recurrent layers.

In some implementations, a genetic algorithm (510) may automatically assign an activation function, an aggregation function, a bias, connection weights, etc. to each model of the input set (520) for the initial epoch. In some aspects, the connection weights are initially assigned randomly or pseudo-randomly. In some implementations, a single activation function is used for each node of a particular model. For example, a sigmoid function may be used as the activation function of each node of the particular model. The single activation function may be selected based on configuration data. For example, the configuration data may indicate that a hyperbolic tangent activation function is to be used or that a sigmoid activation function is to be used. Alternatively, the activation function may be randomly or pseudo-randomly selected from a set of allowed activation functions, and different nodes or layers of a model may have different types of activation functions. Aggregation functions may similarly be randomly or pseudo-randomly assigned for the models in the input set (520) of the initial epoch. Thus, the models of the input set (520) of the initial epoch may have different topologies (which may include different input nodes corresponding to different input data fields if the data set includes many data fields) and different connection weights. Further, the models of the input set (520) of the initial epoch may include nodes having different activation functions, aggregation functions, and/or bias values/functions.

In some implementations, during execution, a genetic algorithm (510) performs fitness evaluation (540) and evolutionary operations (550) on the input set (520). In this context, fitness evaluation (540) includes evaluating each model of the input set (520) using a fitness function (542) to determine a fitness function value (544) ("FF values" in FIG. 5) for each model of the input set (520). The fitness function values (544) are used to select one or more models of the input set (520) to modify using one or more of the evolutionary operations (550). In FIG. 5, the evolutionary operations (550) include mutation operations (552), crossover operations (554), and extinction operations (556), each of which is described further below.

In some implementations, during a fitness evaluation (540), each model of the input set (520) is tested based on the input data (502) to determine a corresponding fitness function value (544). For example, a first portion (504) of the input data (502) may be provided as input data to each model, which processes the input data (according to the network topology, connection weights, activation function, etc., of the respective model) to generate output data. The output data of each model is evaluated using the fitness function (542) and the first portion (504) of the input data (502) to determine how well the model modeled the input data (502). In some examples, fitness of a model is based on reliability of the model, performance of the model, complexity (or sparsity) of the model, size of the latent space, or a combination thereof.

In some implementations, fitness evaluation (540) of the models of the input set (520) is performed in parallel. To illustrate, the system (500) may include devices, processors, cores, and/or threads (580) in addition to those that execute the genetic algorithm (510) and the optimization trainer (560). These additional devices, processors, cores, and/or threads (580) can perform the fitness evaluation (540) of the models of the input set (520) in parallel based on a first portion (504) of the input data (502) and may provide the resulting fitness function values (544) to the genetic algorithm (510).

In some implementations, a mutation operation (552) and a crossover operation (554) are highly stochastic under certain constraints and a defined set of probabilities optimized for model building, which produces reproduction operations that can be used to generate the output set (530), or at least a portion thereof, from the input set (520). In a particular implementation, the genetic algorithm (510) utilizes intra-species reproduction (as opposed to inter-species reproduction) in generating the output set (530). In other implementations, inter-species reproduction may be used in addition to or instead of intra-species reproduction to generate the output set (530). Generally, the mutation operation (552) and the crossover operation (554) are selectively performed on models that are more fit (e.g., have higher fitness function values (544), fitness function values (544) that have changed significantly between two or more epochs, or both).

In some implementations, an extinction operation (556) uses a stagnation criterion to determine when a species should be omitted from a population used as the input set (520) for a subsequent epoch of the genetic algorithm (510). Generally, the extinction operation (556) is selectively performed on models that are satisfy a stagnation criteria, such as modes that have low fitness function values (544), fitness function values (544) that have changed little over several epochs, or both.

In accordance with the present disclosure, cooperative execution of a genetic algorithm (510) and an optimization trainer (560) is used arrive at a solution faster than would occur by using a genetic algorithm (510) alone or an optimization trainer (560) alone. Additionally, in some implementations, the genetic algorithm (510) and the optimization trainer (560) evaluate fitness using different data sets, with different measures of fitness, or both, which can improve fidelity of operation of the final model. To facilitate cooperative execution, a model (referred to herein as a trainable model (532) in FIG. 5) is occasionally sent from the genetic algorithm (510) to the optimization trainer (560) for training. In a particular implementation, the trainable model (532) is based on crossing over and/or mutating the fittest models (based on the fitness evaluation (540)) of the input set (520). In such implementations, the trainable model (532) is not merely a selected model of the input set (520); rather, the trainable model (532) represents a potential advancement with respect to the fittest models of the input set (520).

In some implementations, an optimization trainer (560) uses a second portion (506) of the input data (502) to train the connection weights and biases of the trainable model (532), thereby generating a trained model (562). The optimization trainer (560) does not modify the architecture of the trainable model (532).

In some implementations, during optimization, an optimization trainer (560) provides a second portion (506) of the input data (502) to the trainable model (532) to generate output data. The optimization trainer (560) performs a second fitness evaluation (570) by comparing the data input to the trainable model (532) to the output data from the trainable model (532) to determine a second fitness function value (574) based on a second fitness function (572). The second fitness function (572) is the same as the first fitness function (542) in some implementations and is different from the first fitness function (542) in other implementations. In some implementations, the optimization trainer (560) or portions thereof is executed on a different device, processor, core, and/or thread than the genetic algorithm (510). In such implementations, the genetic algorithm (510) can continue executing additional epoch(s) while the connection weights of the trainable model (532) are being trained by the optimization trainer (560). When training is complete, the trained model (562) is input back into (a subsequent epoch of) the genetic algorithm (510), so that the positively reinforced "genetic traits" of the trained model (562) are available to be inherited by other models in the genetic algorithm (510).

In implementations where the genetic algorithm (510) employs speciation, a species ID of each of the models may be set to a value corresponding to the species that the model has been clustered into. A species fitness may be determined for each of the species. The species fitness of a species may be a function of the fitness of one or more of the individual models in the species. As a simple illustrative example, the species fitness of a species may be the average of the fitness of the individual models in the species. As another example, the species fitness of a species may be equal to the fitness of the fittest or least fit individual model in the species. In alternative examples, other mathematical functions may be used to determine species fitness. The genetic algorithm (510) may maintain a data structure that tracks the fitness of each species across multiple epochs. Based on the species fitness, the genetic algorithm (510) may identify the "fittest" species, which may also be referred to as "elite species." Different numbers of elite species may be identified in different embodiments.

In some implementations, a genetic algorithm (510) uses species fitness to determine if a species has become stagnant and is therefore to become extinct. As an illustrative non-limiting example, the stagnation criterion of the extinction operation (556) may indicate that a species has become stagnant if the fitness of that species remains within a particular range (e.g., +/−5%) for a particular number (e.g., 5) of epochs. If a species satisfies a stagnation criterion, the species and all underlying models may be removed from subsequent epochs of the genetic algorithm (510).

In some implementations, the fittest models of each "elite species" may be identified. The fittest models overall may also be identified. An "overall elite" need not be an "elite member," e.g., may come from a non-elite species. Different numbers of "elite members" per species and "overall elites" may be identified in different embodiments."

In some implementations, an output set (530) of the epoch is generated based on the input set (520) and the evolutionary operation (550). In the illustrated example, the output set (530) includes the same number of models as the input set (520). In some implementations, the output set (530) includes each of the "overall elite" models and each of the "elite member" models. Propagating the "overall elite" and "elite member" models to the next epoch may preserve the "genetic traits" resulted in caused such models being assigned high fitness values.

In some implementations, the rest of the output set (530) may be filled out by random reproduction using the crossover operation (554) and/or the mutation operation (552). After the output set (530) is generated, the output set (530) may be provided as the input set (520) for the next epoch of the genetic algorithm (510).

In some implementations, after one or more epochs of a genetic algorithm (510) and one or more rounds of optimization by an optimization trainer (560), the system (500) selects a particular model or a set of models as the final model (e.g., a model that is executable to perform one or more of the model-based operations of FIGS. 1-4B). For example, the final model may be selected based on the fitness function values (544, 574). For example, a model or set of models having the highest fitness function value (544 or 574) may be selected as the final model. When multiple models are selected (e.g., an entire species is selected), an ensemble can be generated (e.g., based on heuristic rules or using the genetic algorithm (510)) to aggregate the multiple models. In some implementations, the final model can be provided to the optimization trainer (560) for one or more rounds of optimization after the final model is selected. Subsequently, the final model can be output for use with respect to other data (e.g., real-time data).

Figure 6:
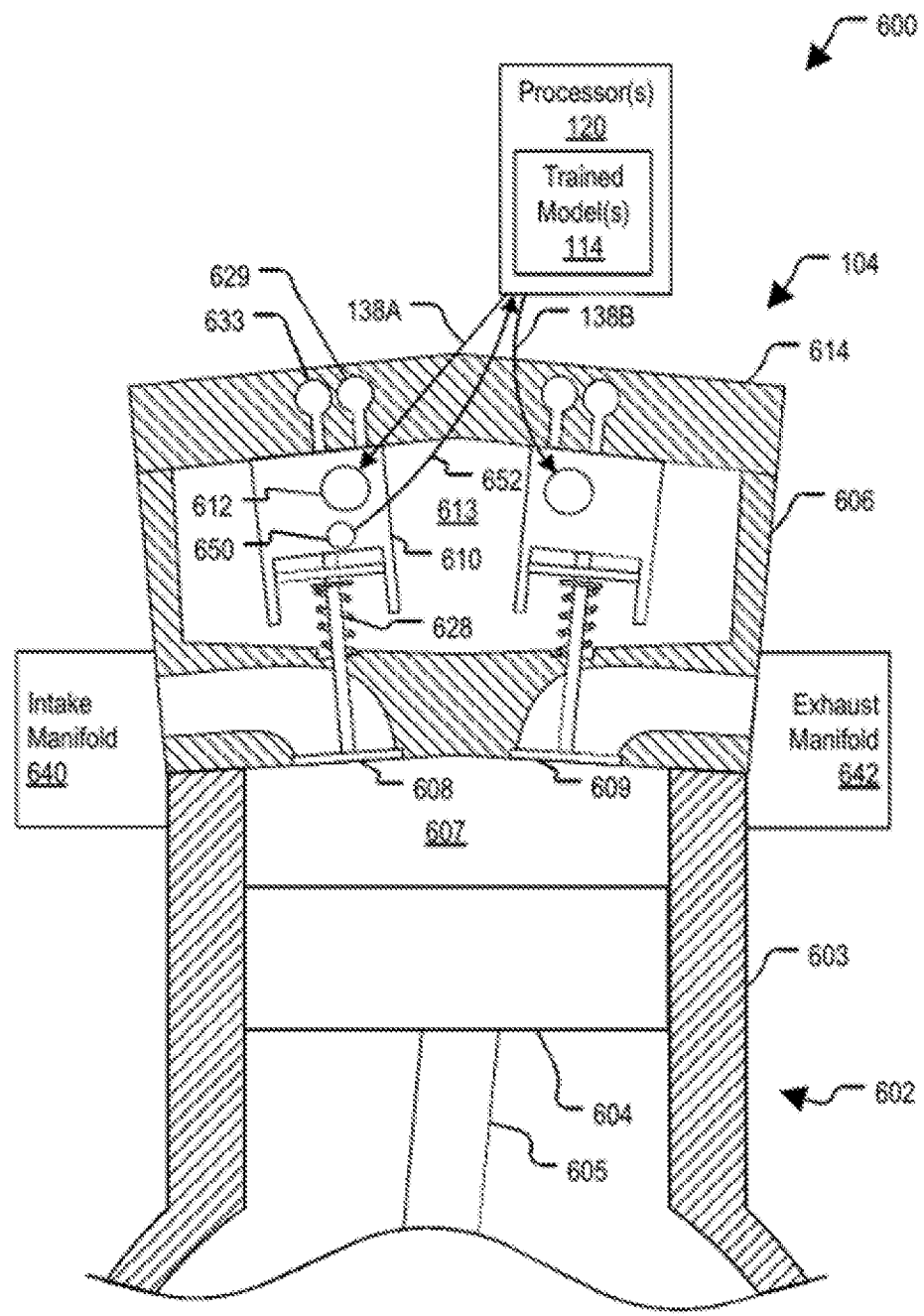
FIG. 6 is a diagram depicting an implementation of an electronically controllable valve in accordance with some examples of the present disclosure.

For further explanation, FIG. 6 illustrates an implementation (600) of components that may be used in the vehicle (102). The engine (104) includes a cylinder block (602) with at least one cylinder (603). Although a single cylinder (603) is depicted, it should be understood that in other implementations the engine (104) may include any number of additional cylinders that may operate substantially as described herein.

In some implementations, a piston (604) is axially displaceable in the cylinder (603) and coupled to a connection rod (605). The connection rod (605) is coupled to a crank shaft (not shown). A combustion chamber (607) may include an upper surface of the piston (604), walls of the cylinder (603), and a cylinder head (606). A mixture of fuel and air may enter the combustion chamber (607) from an intake manifold (640) via operation of an electronically controllable valve (608), and exhaust gas may exit the combustion chamber (607) to an exhaust manifold (642) via operation of an electronically controllable valve (609).

In alternate embodiments, fuel and air may enter the combustion chamber (607) via separate electronically controllable valves that may be controlled using trained models in accordance with the present disclosure. The electronically controllable valves (608, 609) are coupled to valve actuators (610), and the electronically controllable valves (608, 609) depicted may be implemented similarly to the electronically controllable valve (106) of FIG. 1. In a particular aspect, the intake manifold (640) corresponds to the reservoir (126) of FIG. 1, and the electronically controllable valve (608) may be implemented similarly to the electronically controllable valve (106) of FIG. 1. In another aspect, the exhaust manifold (642) corresponds to the reservoir (126) of FIG. 1, and the electronically controllable valve (609) may be implemented similarly to the electronically controllable valve (106) of FIG. 1.

In some implementations, a valve actuator (610) includes a pneumatic pressure fluid circuit with one or more inlet and outlet openings for pressure fluid (e.g., air or nitrogen gas, as non-limiting examples) to cause opening or closing of the electronically controllable valve (608) via motion of a valve stem, as described further below. In other implementations, however, the valve actuator (610) may be configured to use an electrical mechanism (e.g., a solenoid) or a mechanical mechanism (e.g., a motor) to cause the electronically controllable valve (608) to open or close. A return spring (628) may assist in causing the electronically controllable valve (608) to return from an open state to a closed state.

In some implementations, a valve actuator (610) includes a valve position sensor (650) configured to determine a position of the electronically controllable valve (608), such as by detecting a position or movement of a valve stem relative to the valve actuator (610), and to generate a valve position signal (652) that is provided to the one or more processors (120). For example, the valve position sensor (650) may correspond to one of the vehicle operation sensor(s) (118), and the valve position signal (652) may be included in the sensor data (124). Although the valve position sensor (650) is illustrated as a component of the valve actuator (610) that determines a position of the electronically controllable valve (608) via monitoring a position of the valve stem, in other implementations the valve position sensor (650) monitors valve position from another location, such as proximate to a valve head of the electronically controllable valve (608). Although a single valve position sensor (650) and valve position signal (652) are illustrated, in other implementations the engine (104) includes one or more additional valve position sensors. For example, each valve in the engine (104) may be coupled to a corresponding valve position sensor to provide position information for each of the valves for use by the one or more trained models (114).

In some implementations, an engine (104) comprises a cylinder head chamber (613) that forms part of a closed pressure fluid circuit and a cylinder head cover (614). One or more valves, such as a representative valve (612) within the valve actuator (610), may be responsive to the control signal (138) to control operation of the pressure fluid circuit to control the electronically controllable valve (608). For example, the valve (612) may enable or disable pressurized fluid flow, such as to open or close fluid paths to a pressure fluid manifold (629), a hydraulic liquid manifold (633), or the cylinder head chamber (613).

In some implementations, during operation, one or more processors (120) may process the one or more trained models (114), such as described with reference to FIGS. 1-4B, to generate the control signal (138) that includes a first control signal (138A) and a second control signal (138B). The first control signal (138A) is provided to the valve actuator (610) to control operation of one or more valves within the valve actuator (610), such as the representative valve (612), to operate the electronically controllable valve (608) to enable or prevent ingress of fuel and air into the combustion chamber (607). Similarly, the second control signal (138B) is provided to another actuator to enable or prevent egress of exhaust to the exhaust manifold (642) by controlling the electronically controllable valve (609). It is be understood that the use of trained models to control valves is not merely limited to a binary decision of valve open vs. valve closed. Rather trained models may be used to determine, for each valve of an engine, lift, duration, timing, speed, etc. of the valve, as described with reference to FIG. 1. Thus, fine-grained control may be dynamically exercised over operation of the cylinder block (602), enabling improved engine performance under various conditions.

In some examples, although a single inlet valve and a single outlet valve are illustrated per cylinder, in other implementations any number of inlet valves and any number of outlet valves may be used in each cylinder. Sets of valves may be commonly controlled, such as two inlet valves controlled by a single valve actuator (610), or each valve may be individually controlled via independent actuators. In some implementations, the control signal (138) can adjust a number of active valves operating in the engine (104) by causing one or more inlet valves, one or more outlet valves, one or more cylinders/chambers, or a combination thereof, to be deactivated or activated. Other adjustments to operation of the engine (104) can be made via controlling one or more of the valves, such as by causing the engine (104) to transition between 2-stroke and 4-stroke operation.

In some implementations, one or more trained models (114) may be processed by the one or more processors (120) at least partially based on valve positions (e.g., a set of valve position signals including the valve position signal (652)). For example, the valve control model (116) may be configured to generate the control signal(s) (138) to actuate the valves responsive to the current positions of the valves. In some implementations, the valve control model (116) determines an engine startup cylinder firing sequence based on the detected valve positions. In some examples, the valve position signals provide feedback that are used by the one or more trained models (114) to detect abnormalities of valve operation, such as when a detected valve position does not match its designated position within a determined tolerance, which may be due to failure or impending failure of a valve actuator, pressurized fluid system, etc. To illustrate, the valve control model (116) may be configured to detect such abnormalities and to adjust operation of the engine (104) accordingly, such as by deactivating the valve or the cylinder associated with the valve, adjusting operation of the remaining valves to at least partially compensate for the resulting loss of power, adjusting one or more other aspects, or a combination thereof.

Figure 7:
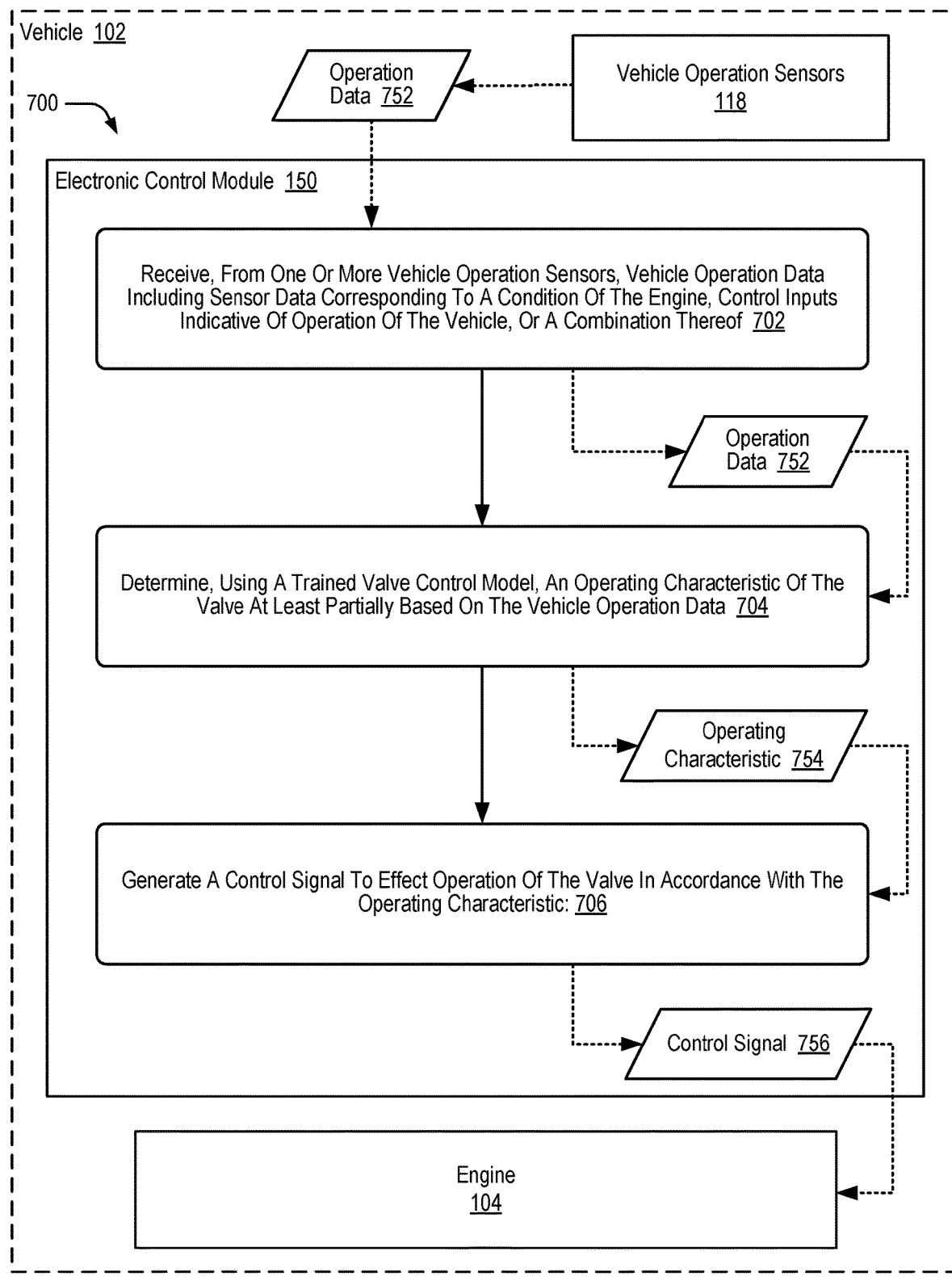
FIG. 7 is a flow chart of a method of controlling an electronically controllable valve of an engine of a vehicle in accordance with some examples of the present disclosure.

For further explanation, FIG. 7 depicts a flowchart (700) of a method of controlling an electronically controllable valve of an engine of a vehicle. In accordance with a particular implementation, the method is performed by the vehicle (102), such as by the one or more processors (120) in the ECM (150) of FIG. 1.

In this example, the method includes: receiving (702), from one or more vehicle operation sensors, vehicle operation data (752) including sensor data corresponding to a condition of the engine, control inputs indicative of operation of the vehicle, or a combination thereof. For example, the one or more processors (120) receive the vehicle operation data (136) from sensors at the operator controls 128, from the vehicle operation sensor(s) 118, or a combination thereof.

The example method also includes determining (704), using a trained valve control model, an operating characteristic (754) of the valve at least partially based on the vehicle operation data (752). For example, as described above with reference to FIG. 1, the one or more processors (120) may determine (704) the operating characteristic (754) of the electronically controllable valve (106) at least partially based on a valve control model, such as valve control model (116).

The method also includes generating (706) a control signal (756) to effect operation of the valve in accordance with the operating characteristic (754). For example, as described above with reference to FIG. 1, the one or more processors (120) may generate the control signal (756) to control operation of the electronically controllable valve 106 in accordance with the operating characteristic (134).

In some implementations, receiving (702) operation data (752) may include receiving from one or more travel condition sensors, travel sensor data corresponding to a travel condition and determining, using a travel type model, a travel type based on the travel sensor data. For example, the travel sensor data (216) is received from the travel condition sensor(s) (210), and the travel type model (202) is used to determine the travel type (220). In such implementations, the operating characteristic (134) is determined further based on the travel type (220).

In some implementations, determining (704) an operating characteristic (754) may include using a trained operator type model, preference data corresponding to an operator of the vehicle. For example, the operator type model (204) is responsive to operator data (238) to generate the preference data (222). In such implementations, the operating characteristic (134) is determined further based on the preference data (222).

In some implementations, receiving (702) operation data (752) may include receiving a fleet control instruction and determining, using a fleet operation model, fleet operation data corresponding to a fleet control instruction that is received at the vehicle. For example, the fleet operation model (206) is responsive to the fleet control data (218) that may be an instruction to generate the fleet operation data (224). In such implementations, the operating characteristic (134) is determined further based on the fleet operation data (224).

Figure 8:
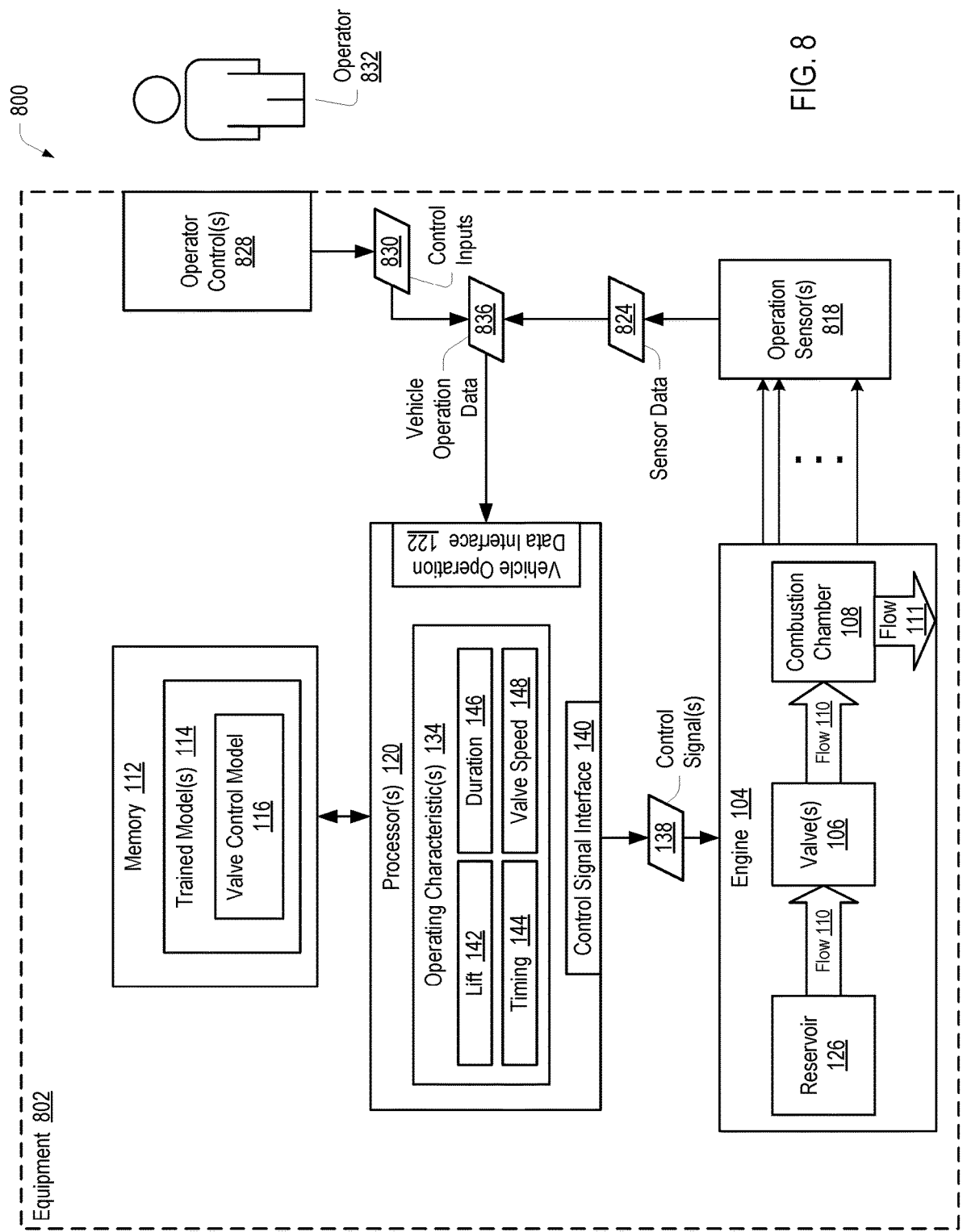
FIG. 8 illustrates a block diagram of an implementation of equipment that includes a valve control model to control operation of an electronically controllable valve of an engine in accordance with some examples of the present disclosure.

Although the preceding description describes implementations in which the engine (104) is in a vehicle, in other implementations the engine (104) is instead used in conjunction with other equipment, such as part of a power generator or other non-transportation equipment. FIG. 8 depicts a system (800) in which the memory (112), the one or more processors (120), and the engine (104) are components of equipment (802). The one or more processors (120) receive operation data (836) that includes sensor data (824) from one or more operation sensors (818) and control inputs (830) corresponding to manipulation of one or more operator controls (828) via an operator (832) of the equipment (802). Thus, it can be seen that the system (100) of FIG. 1 corresponds to a particular implementation of the system (800) in which the equipment (802) is a vehicle, although the system (800) is not limited to embodiments in which the equipment (802) is a vehicle.

Figure 9:
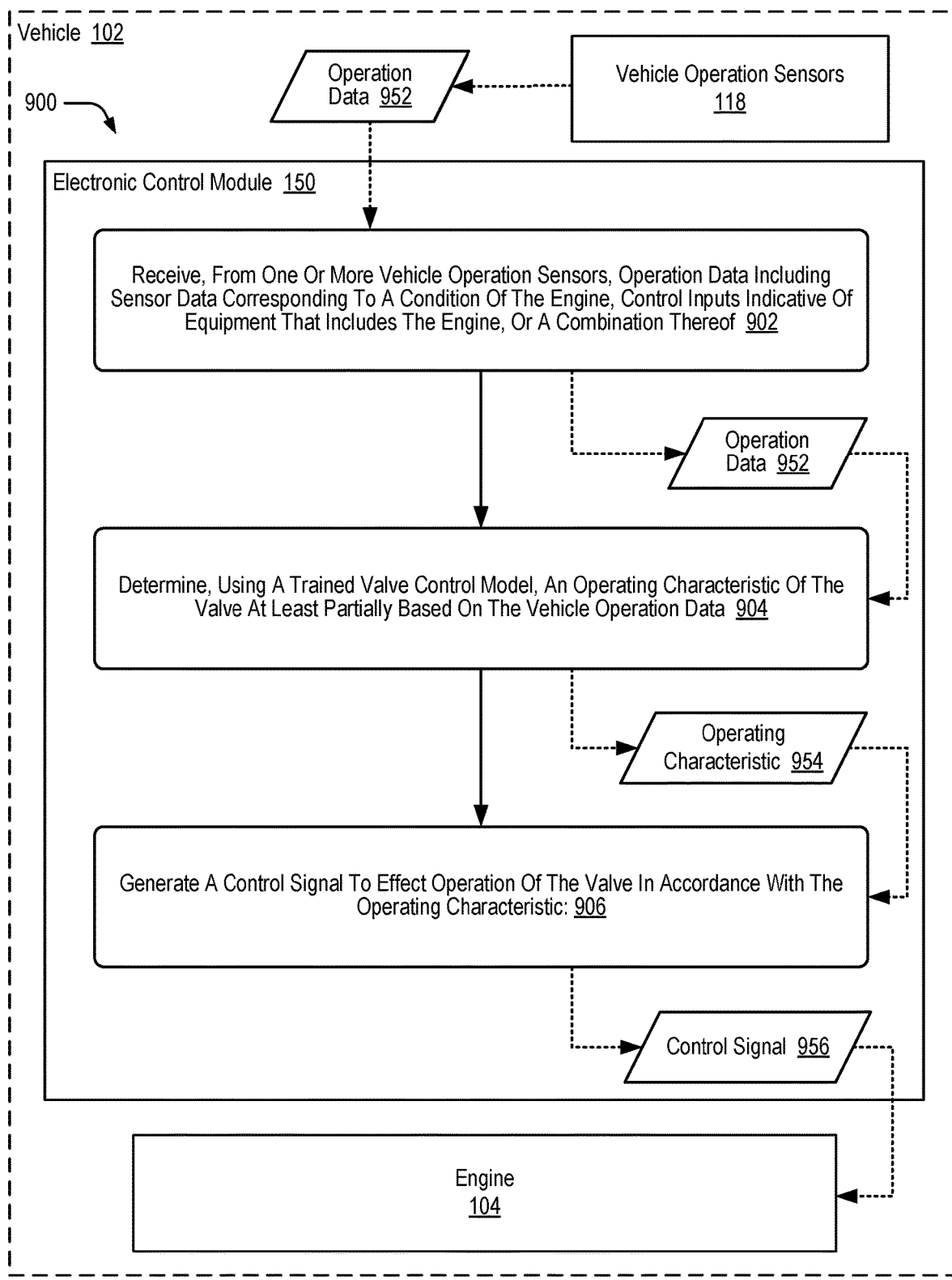
FIG. 9 is a flow chart of a method of controlling an electronically controllable valve of an engine in accordance with some examples of the present disclosure.

For further explanation, FIG. 9 depicts a flowchart (900) of a method of controlling an electronically controllable valve of an engine. In accordance with a particular implementation, the method (900) is performed by the one or more processors (120) of FIG. 8 implemented in non-transportation equipment.

The method includes receiving (902), from one or more operation sensors (118), operation data (952) including sensor data corresponding to a condition of the engine (104), control inputs indicative of operation of the equipment that includes the engine, or a combination thereof. For example, as described above with reference to FIG. 8, the one or more processors (120) receive the operation data (836) from sensors at the operator controls (828), from the operation sensor(s) (818), or a combination thereof.

The method (900) also includes determining (904), using a trained valve control model, an operating characteristic (954) of the valve at least partially based on the operation data (952). For example, as described above with reference to FIG. 8, the one or more processors (120) determine the operating characteristic (134) of the electronically controllable valve (106) at least partially based on the valve control model (116).

The method (900) also includes generating (906) a control signal (956) to effect operation of the electronically controllable valve (106) in accordance with the operating characteristic (954). For example, as described above with reference to FIG. 8, the one or more processors (120) generate a control signal (838) to control operation of the electronically controllable valve (106) in accordance with the operating characteristic (134).

The systems and methods illustrated herein may be described in terms of functional block components, screen shots, optional selections, and various processing steps. It should be appreciated that such functional blocks may be realized by any number of hardware and/or software components configured to perform the specified functions. For example, the system may employ various integrated circuit components, e.g., memory elements, processing elements, logic elements, look-up tables, and the like, which may carry out a variety of functions under the control of one or more microprocessors or other control devices. Similarly, the software elements of the system may be implemented with any programming or scripting language such as C, C++, C#, Java, JavaScript, VBScript, Macromedia Cold Fusion, COBOL, Microsoft Active Server Pages, assembly, PERL, PHP, AWK, Python, Visual Basic, SQL Stored Procedures, PL/SQL, any UNIX shell script, and extensible markup language (XML) with the various algorithms being implemented with any combination of data structures, objects, processes, routines or other programming elements. Further, it should be noted that the system may employ any number of techniques for data transmission, signaling, data processing, network control, and the like.

The systems and methods of the present disclosure may be embodied as a customization of an existing system, an add-on product, a processing apparatus executing upgraded software, a standalone system, a distributed system, a method, a data processing system, a device for data processing, and/or a computer program product. Accordingly, any portion of the system or a module or a decision model may take the form of a processing apparatus executing code, an internet based (e.g., cloud computing) embodiment, an entirely hardware embodiment, or an embodiment combining aspects of the internet, software, and hardware. Furthermore, the system may take the form of a computer program product on a computer-readable storage medium or device having computer-readable program code (e.g., instructions) embodied or stored in the storage medium or device. Any suitable computer-readable storage medium or device may be utilized, including hard disks, CD-ROM, optical storage devices, magnetic storage devices, and/or other storage media. As used herein, a "computer-readable storage medium" or "computer-readable storage device" is not a signal.

Figure 10A:
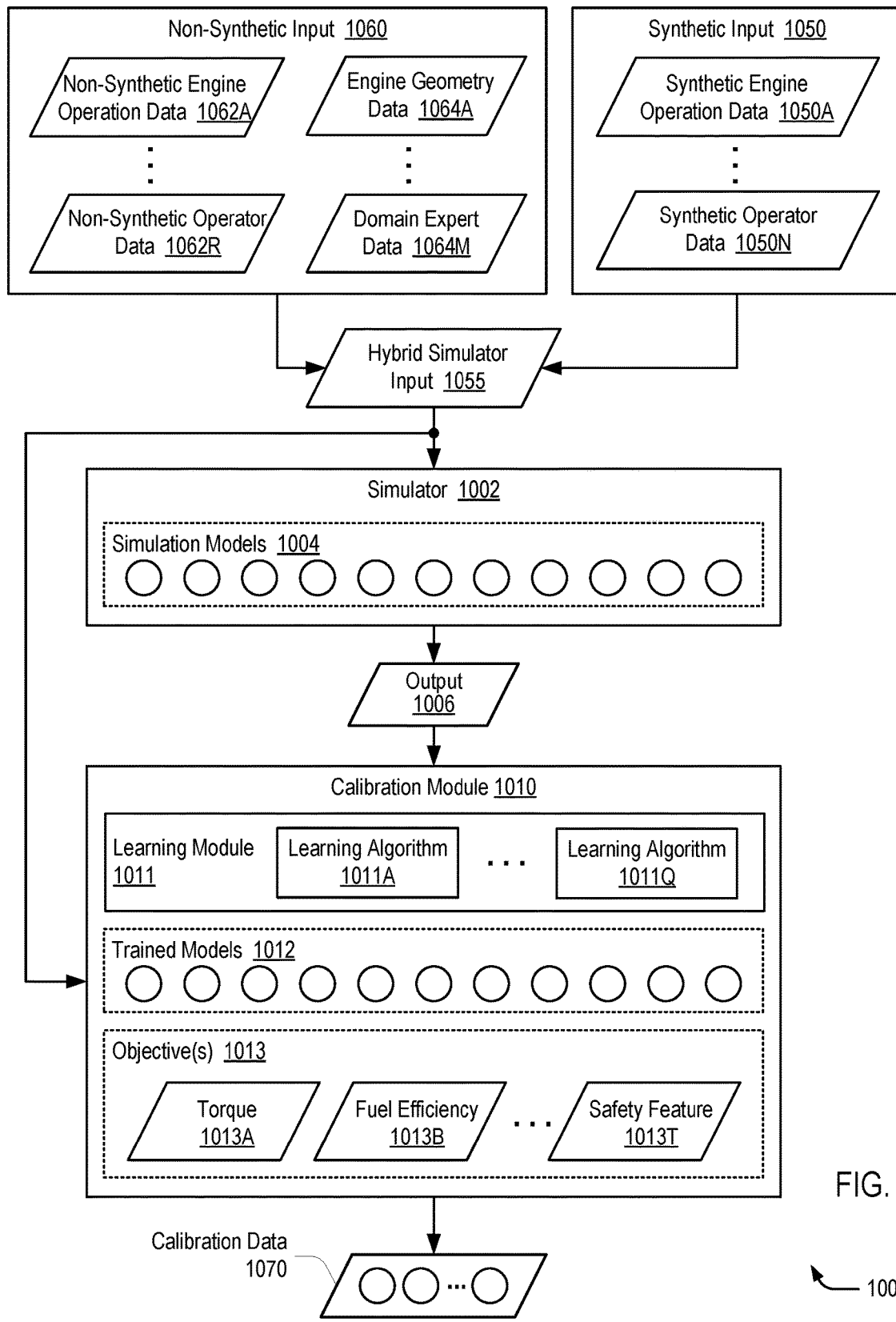
FIG. 10A is a diagram of an example of a simulation learning environment to generate one or more trained models that are used as a basis for calibrating electronically controllable engine components in accordance with some examples of the present disclosure.

For further explanation, FIG. 10A depicts an example simulation learning environment (1000) that may be used to simulate operation of an engine to generate calibration data for the engine in accordance with one or more target objectives.

FIG. 10A depicts a particular example architecture, however, in other implementations, other architectures or systems may be used for simulating operation of an engine or vehicle to generate calibration data in accordance with embodiments of the present disclosure. In some implementations, the simulation learning environment (1000) may be implemented by one or more computing devices, such as laptop computers, desktop computers, mobile devices, servers, or other devices using processors or operating systems, such as those discussed above with reference to FIGS. 1-9. Further, while the architecture of the simulation learning environment (1000) provides one example architecture, other implementations are envisioned. For example, the simulation learning environment (1000) may be carried out by a collection of multiple, separate computational processes that may operate in parallel or operate in sequence. In other examples, the simulation learning environment (1000) may be carried out by a group of models, or carried out by a collection of simulators that respectively simulate different parts of the real-world system—where the collection of simulators may share information or where some simulators may depend on output from other simulators. For example, among a collection of simulators may be a fuel injection simulator and an air pressure simulator, where these different simulators may be trained as different entities that pass information to each other, instead of a single model that includes the different aspects of fuel injection and air pressure.

As illustrated in FIG. 10A, a simulation learning environment (1000) may include a simulator (1002) and a calibration module (1010). In some examples, a simulator (1002) may be designed to simulate behavior and outcomes of a particular engine based on calculations using a mathematical model of the particular engine. Further, the mathematical model of the particular engine may be based on geometry of an engine, some or all operating features, available control signals, dependencies between each of these component elements, and other specifications that may be based on, or may be related to, design and operation of an engine.

In this example, the simulator (1002) may receive hybrid simulator input (1055) to perform calculations in accordance with the model used to simulate operation of the particular engine. Further, in this example, the simulations may generate output (1006) that describe results of the simulations, where the results of the simulations may include behavior and operating characteristics of the engine that correspond to particular inputs, settings, or parameters specified in the hybrid simulator input (1055).

Continuing with this example, given the simulator output (1006), the calibration module (1010), may develop and generate calibration data (1070), where the calibration data (1070)—when installed onto the engine being simulated, or an engine similar to the engine being simulated—is used to calibrate, tune, or modify the operating characteristics of the engine in accordance with one or more objectives (1013).

In some implementations, there may be one or more target objectives for how an engine or vehicle should be calibrated to perform, and based on simulations of the engine or vehicle, a set of control signals, for multiple different states of an engine, may be determined to correspond to engine characteristics or performance of electronically controlled components of the engine that optimally satisfy, or nearly optimally satisfy, the target objectives. In some examples, a given state for an engine may be determined by a particular combination of sensor data inputs and operator control inputs. As one example of multi-objective under constraints calibration may be maximization of torque as constrained by minimization of fuel consumption and by maintenance of emissions below a specified threshold, where the specified threshold may be regulatory threshold or a user-specified threshold that may be lower than a regulated threshold.

In some implementations, simulation may provide insights into operation of an engine that exists as a physical specification, but has not yet been built. In other implementations, simulation may provide an alternative or a supplement to testing, tuning, or calibrating a physical engine. In such examples, the simulator (1002) may simulate operation of a physical engine using a data-driven approach, where the data-driven approach may include generating combinations of inputs and parameters at a scale that would not be possible by similarly testing a physical engine. Further, in some implementations, the simulator (1002) may use a data-driven approach that additionally includes non-synthetic data collected from real-world systems that may be similar or identical to the system being modeled by the simulator (1002). In other words, transfer learning may be used to provide non-synthetic data to the simulator (1002).

In some implementations, as illustrated in FIG. 10A, a simulator (1002) may use simulation inputs that are based exclusively on: (a) sample data from physically operating an existing engine being simulated or from operating an existing engine that is similar, but not identical, to the engine being simulated; (b) simulator inputs specified by a user; or (c) based on both sample data from physical operation of an existing engine and on user-specified input data. By contrast, in other implementations, a simulator (1002) may use simulation inputs that are generated exclusively using a data-driven approach, where data-driven generation of inputs are described in other sections of this disclosure. In some examples, as described above, simulator input (1152) may include non-synthetic data collected from real-world systems that may be similar or identical to the system being modeled by the simulator (1002). Further, in some implementations, with regard to generation of simulator input, simulator input may be generated based on different types of bootstrapping. For example, one type of bootstrapping includes bootstrap aggregating, where given a small subsample of data, the small subsample of data is resampled to simulate an original distribution. In other examples, another type of bootstrapping may include using an initial set of input data to generate a set of outputs, where the set of outputs may be analyzed to determine refinements to one or more simulator models to provide for a more grounded exploration of simulations. Further, such an iterative refinement of simulator models may include active learning techniques, where subsequent iterations may be guided based on areas that have not been sufficiently explored and/or guided based on requests made in response to uncertainty in how to refine a subsequent iteration of a model. For example, in response to uncertainty, a request may be made to a human subject matter expert or a calibration engineer.

However, described in the following implementations, is a simulator (1002) that may operate on hybrid simulator input (1055). In such an implementation, the hybrid simulator input (1055) includes input (1050) based on using a data-driven approach for computationally generating simulation input combined with using input (1060) based on real-world, physical parameters, sample inputs, or domain expert knowledge or specifications. In this example, algorithm-generated, data-driven simulation input may be referred to as "synthetic data" or "synthetic input." Further, in this example, real-world sample data, physical engine parameters, or domain expert specifications of the engine may be referred to as "non-synthetic data," "real data," or "real input." For example, non-synthetic data may also include sensor data or control data collected from operation of physical assets or real-world systems.

As depicted in FIG. 10A, a simulator (1002) may receive hybrid simulator input (1055) that includes both non-synthetic input (1060) and synthetic input (1050). In this example, the simulator (1002) may include one or more models (1004) that model or computationally represent one or more aspects of an engine or vehicle. In this example, different sets of input (1055) received by the simulator (1002) may correspond to different simulations, and correspondingly, to different sets of output (1006).

Continuing with this example, output (1006) from the simulations may be provided to a calibration module (1010). In some examples, the calibration module (1010) may also receive as input the hybrid simulator input (1055) provided to the simulator (1002). In some implementations, the calibration module (1010) may use some or all input as a basis to generate calibration data (1070) that may be installed within an electronic control module or equipment memory, such as an electronic control module (150) in FIG. 1, and such as equipment memory (112) in FIG. 8.

In some implementations, the calibration data (1070) generated by the calibration module (1010) may be trained models based on one or more learning algorithms (1011A-1011Q). Further, in this example, the learning algorithms (1011A-1011Q) may be any of the learning algorithms described above with reference to FIGS. 1-9, where the learning algorithms (1011A-1011Q) may be trained using sets of simulator output (1006) and corresponding sets of simulator input (1055), and using one or more target objectives (1013) for calibrating the engine. In some implementations, as noted above, with regard to simulator input, simulator input may be generated based on different types of bootstrapping. For example, in some situations, a trained model may be used to train other models, and bootstrapping may be used for generating a similar, large-scale set of input data from a small amount of real-world data. In this way, in some examples, bootstrapping may be used to generate inputs sets of hundreds of thousands of samples from an input set of single thousands of samples.

Further, in this example, to calibrate the engine or vehicle, the calibrated data (1070), or trained models, may be uploaded or installed onto an engine, vehicle, or equipment. In this way, in this example, in accordance with the target calibration objectives, the trained models (1070) may be a basis for generating control signals in response to a current engine state, where the engine state may be characterized by: vehicle operation data that may include: combinations of engine operation sensor data, operator control data, location data, environmental data, travel condition data, regulatory data, fleet control data, among other variables that may affect operation of the engine.

In some implementations, and as noted above, a calibration module (1010) may use one or more learning algorithms (1011A-1011Q) to train one or more models (1012) as part of the calibration data (1070) output, where the one or more learning algorithms (1011A-1011Q) may train the one or more models (1012) based on simulator inputs (1055) and corresponding simulator outputs (1006), and based on target objectives (1013).

In some implementations, target objectives (1013) may describe target performance aspects or target features according to which engine operation or performance is expected to be calibrated. As depicted in FIG. 10A, target objectives (1013) include torque (1013A), fuel efficiency (1013B), or safety features (1013T). In other examples, more generally, target objectives (1013) may be specified for any measurable characteristic of an engine or vehicle, such as emissions, ride comfort settings, wear and tear, power output, and driving experience characteristics such as smoothness, avoidance of abrupt engine reactions, among others described below.

In some implementations, each target objective (1013) may be specified according to a set of values or a range of values desired for the given objective. Further, each target objective (1013) may be specified for a set of multiple values under a multiple sets of engine operating conditions.

Further, in some implementations, specifications for target objectives (1013) may include metadata describing dependencies among different target objectives (1013A-1013T). For example, a target objective for torque (1013A) may be specified to be a particular value, where the particular value may be decreased during engine operation if providing torque at the particular value decreases fuel efficiency beyond a specified, minimum threshold. In this example, the decrease of fuel efficiency beyond the specified threshold may be considered a trigger. Similarly, in other examples more generally, calibration data (1070) may be used to calibrate an engine such that other dependencies, triggers, and trigger responses, may be specified among one or more of the target objectives (1013A-1013T).

Similarly, in some implementations, a first target objective may be defined relative to a second target objective. For example, a first target objective for torque (1013A) may be specified to be a maximum value attainable while maintaining the second target objective for emissions below a specified threshold. In this example, emissions is a higher priority target objective, and torque maximization, or torque improvement, is dependent on the calibration data usable for maintaining the target objective for emissions. In this way, in some implementations, calibration data (1070) may be used to calibrate an engine such that some target objectives may be specified with respect to conditional relationships, dependency relationships, or other relationships, to other target objectives.

In some implementations, in addition to or instead of a target objective being specified relative to another target objective, a given target objective (1013) may be specified relative to, or dependent upon, a specified engine condition, sensor data, road conditions, user control data, weather or environmental conditions, among other vehicle or engine conditions. For example, in some cases, a given combination of sensor data may be indicative of a problem or potential failure with an engine, where continued operation of the engine in the same manner may likely result in the increased severity of the problem and/or result in causing other problems.

Further, in this example, it may be the case that modification of some aspect of the engine operation may result in controlling the problem or reducing the likelihood of other potential failures. In this case, calibration data (1070) may be used to calibrate an engine such that a target objective for fuel efficiency may be suspended or modified in response to increase torque under specified vehicle handling sensor data, such as a change in vehicle road traction.

In other implementations, target objectives (1013) may also include braking or stopping characteristics, acceleration characteristics, or vehicle handling characteristics, emission levels, a lambda value indicative of a fuel/air mix ratio, among others. Further, more generally, a target objective may be any feature or aspect of the operating characteristics of an engine or vehicle, where a given target objective may be specified as a value or range of values within the possible values for the given target objective.

As depicted in FIG. 10A, in some implementations, non-synthetic input (1060) may include: non-synthetic engine operation data (1062A), such as collected engine sensor data sample points, non-synthetic operator data (1062R), such as collected operator control data sample points, engine geometry data (1064A), such as engine architecture, and mechanical and electrical specifications, and domain expert data (1064M), such as parameter limitations for one or more inputs or operational characteristics of the engine.

In some implementations, domain expert data (1064M) may specify minimum and/or maximum values for a lambda value for an aerosolized fuel mixture representing how rich with fuel an air-injected fuel mixture is entering a combustion chamber, where a maximum lambda value may be specified to be one (1) to avoid fuel inefficiency. Similarly, other domain knowledge may be specified within the domain expert data (1064M) to guide or restrict a simulation.

In some implementations, simulation inputs usable for a data-driven approach may include any parameter values for controlling operating characteristics that may be given effect by one or more control signals. In some examples, an operating characteristics may generally be a characteristic of the operation of an electronically controllable component, such as an electronically controllable valve, among any other electronically controllable components within an engine.

In some implementations, to avoid expending computational resources on simulations that are not practical, inputs generated by a data-driven approach may be constrained by principles of physics or chemistry. In other words, in some implementations, in addition simulator data inputs that cover all possible variations to explore the geometry of an engine, operating features, control signals, and other specifications that are related to design and operation of an engine, generation of data-driven simulator input may include constraints based on physics and chemistry. For example, in a case where the simulator model would otherwise allow for a particular set of simulation input, but where that particular set of simulation input violates a principle of physics or chemistry, the particular set of simulation input may be eliminated based on the violation of the physical-world principle.

Further, in some implementations, an operating characteristic for an electronically controllable valve may include: valve lift or valve displacement with respect to a particular position, duration of an open state at a given valve displacement, valve timing that may be based on positions of a crankshaft in the engine, or valve speed specifying how quickly the electronically controllable valve moves to open or close.

In some implementations, simulation inputs usable for a data-driven approach may also include any parameter values for control inputs based on vehicle or engine operator controls, such as control inputs corresponding to: sensor data for one or more sensors coupled to a throttle or accelerator pedal, sensor data for a brake pedal, sensor data for a clutch pedal, sensor data for a steering wheel position or movement, sensor data for a gear shift control, sensor data for traction control settings, sensor data for ride height control, sensor data for cruise control, data for vehicle or engine remote control, or some combination of this list.

Further, in some implementations, some constraints to a data-driven approach, in addition to being guided or combined with domain knowledge or sample data from physical operation of an engine, may be how some inputs impact or influence one or more target objectives. For example, as noted above, in general, there may be multiple target objectives, where calibration data that may improve a first target objective may adversely affect a second target objective—where a calibration goal may be some balance of improvements to all of the multiple target objectives.

However, in some implementations, some target objectives may be designated to be prioritized above others. For example, with regard to safe operation of an engine or vehicle, a safety target objective may have priority over other target objectives, such that no degradation to safe operation is tolerated even if, on balance, the overall improvements to other target objectives is optimal or near optimal. Further, in general, any one or more target objectives may be designated as having priority over others, where there may be multiple tiers of target objective priority.

In some implementations, as depicted in FIG. 10A, target objective (1013) may include parameters specifying objectives for torque (1013A), fuel efficiency (1013B), and safety (1013T). However, target objectives (1013) may further include: power output, emissions, engine or vehicle responsiveness, engine longevity, or some combination. In some examples, a target objective (1013) may include an objective corresponding to operation of any given engine operating characteristic that may be affected by one or more control signals that may be specified by a calibrated electronic control module (150).

In this way, based on using a hybrid approach, a simulator may operate on inputs allowing for discovery of calibration data that generates optimal, or near optimal, results that satisfy the one or more objectives being targeted. For example, a domain expert, or simulator operator, may have biases or preconceived ideas of how an engine ought to be calibrated, and such bias may preclude some calibration data solutions that may seem odd or ill-advised.

As illustrated in FIG. 10A, inputs (1050) usable for a data-driven approach may be possible variables relating to engine operation and performance, such as synthetic engine operation data (1050A) . . . synthetic operator data (1050N). Further, while not depicted for the sake of clarity, other data-driven parameters may be based on velocity, acceleration, stable speed, elevation changes, among others. Further, in this example, operator data (1050N) may include operator preference settings, such as cruise, sport, comfort, acceleration, speed, among others.

In short, in this example, the hybrid simulator input (1055) includes input (1050) based on using a data-driven approach for generating simulation input combined with using input (1060) based on real-world, physical parameters, sample inputs, or domain expert knowledge or specifications. In some examples, input (1050) may include algorithm-generated parameter values for each of the types of data listed above with reference to non-synthetic input (1060).

Figure 10B:
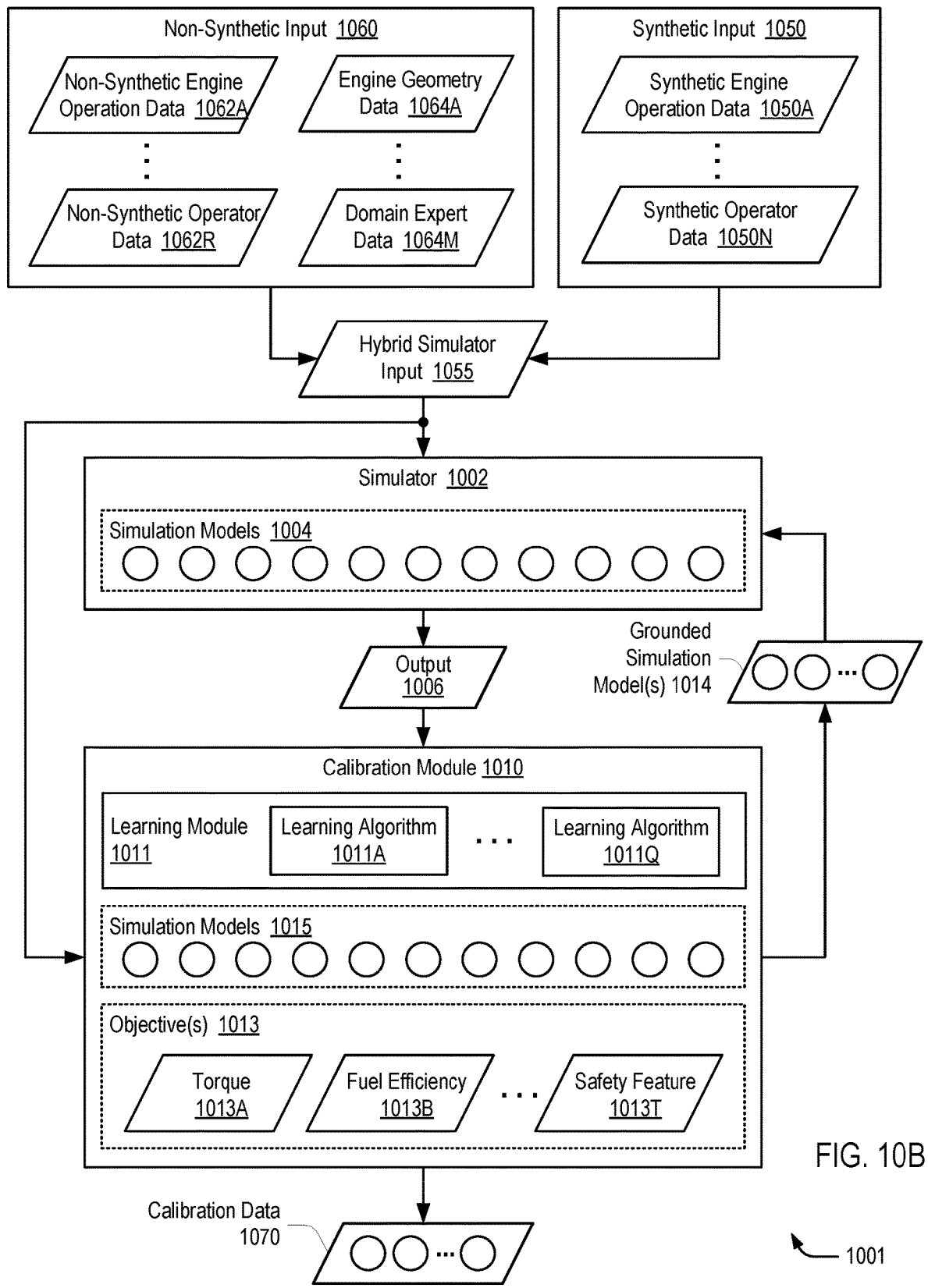
FIG. 10B is a diagram of an example of a simulation learning environment to generate one or more trained models that are used as a basis for calibrating electronically controllable engine components in accordance with some examples of the present disclosure.

For further explanation, FIG. 10B depicts an example simulation learning environment (1001) that may be used to simulate operation of an engine to generate calibration data for the engine in accordance with one or more target objectives.

FIG. 10B depicts a particular example architecture, however, in other implementations, other architectures or systems may be used for simulating operation of an engine or vehicle to generate calibration data in accordance with embodiments of the present disclosure. In some implementations, the simulation learning environment (1001) may be implemented by one or more computing devices, such as laptop computers, desktop computers, mobile devices, servers, or other devices using processors or operating systems, such as those discussed above with reference to FIGS. 1-10A.

As illustrated in FIG. 10B, similar to the simulation learning environment (1000) depicted in FIG. 10A, a simulation learning environment (1001) may include a simulator (1002) and a calibration module (1010).

However, in contrast to the simulation learning environment (1000) illustrated in FIG. 10A, the simulation learning environment (1001) further depicts a computational design architecture that illustrates an iterative process for modifying models used in the simulator (1004) based on grounding a current version of a simulator (1002) with non-synthetic data or non-synthetic input (1060). As described above, in some examples, iterative refinement of simulator models may be based on grounded simulation learning. For example, a given simulator model may be connected to a physical embodiment, or real-world system, that interacts with, or operates within, a real-world environment, where the observations and data gathered during operation of the real-world system, or physical embodiment, may be used in refining subsequent simulator models.

For example, for a given set of simulator inputs that include sample data from tests on a physical engine being simulated, a current version of a simulator (1002) may generate simulator output (1006) that is measurably inconsistent with physical output of a physical engine for the same sample data from the simulator inputs. In other words, a given simulation may expose inaccuracies based on simulator output being inconsistent with physical engine output, where both the simulator and physical engine use the same inputs.

Continuing with this example, the calibration module (1010) may use one or more learning algorithms (1011A-1011Q), one or more current simulation models (1015), and generate grounded simulation models (1014) that have been updated to reduce simulator inaccuracies for inputs that produced divergent results in the simulator in comparison to a physical engine. In this example, given updated simulation models, the simulator (1002) may perform more simulations, where in a subsequent iteration, a similar grounding process may be implemented to further improve simulator accuracy.

In some examples, such an iterative process may continue for a specified number of iterations, or the iterative process may continue until some threshold quantity of improvement is no longer being reached. In other words, in some examples, if the improvement is small, and below a specified threshold, the accuracy may be considered sufficient, and the simulation updates may be stopped.

Concluding with this example, given completion of an iterative improvement process, a simulator may then generate calibration data (1070) output that may be used to calibrate an engine, as described above with reference to FIG. 10A.

Figure 11A:
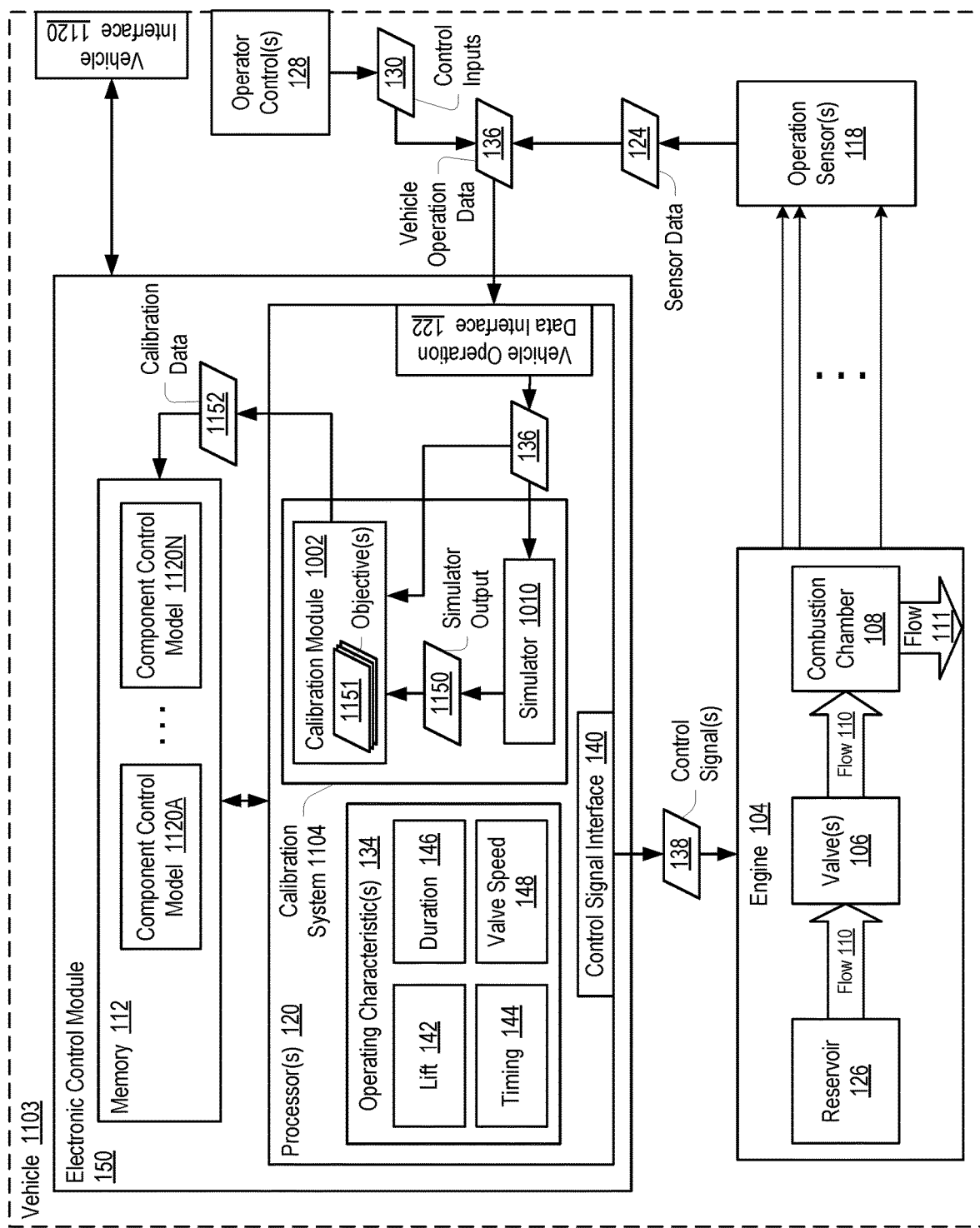
FIG. 11A is a diagram of an example of a calibration computing environment to calibrate an online combustion engine using simulations in accordance with some examples of the present disclosure.

For further explanation, FIG. 11A depicts, within a vehicle 1103, an example calibration system 1104 for generating calibration data to be used for calibrating online combustion engines or vehicles based on using onboard simulations in order to calibrate to one or more target objectives.

FIG. 11A depicts an example architecture for calibration for online combustion engines using simulations; however, in other implementations, a different architecture or a different system may be used in accordance with each of the embodiments of the present disclosure. In some implementations, the calibration system 1104 depicted within the vehicle 1103 may be implemented similarly to the simulation learning environments 1000, 1001 described above with reference to FIGS. 10A and 10B. For example, the calibration system 1104 may include some or all of the components described above, in addition to including components directed toward calibration of online engines or vehicles.

In some implementations, the calibration system 1104 may be implemented by one or more computing devices, such as an onboard computer, onboard processors, onboard silicon logic, or other devices using processors or operating systems, such as those discussed above with reference to FIGS. 1-10B.

As depicted in FIG. 11A, an onboard calibration system 1104 may receive vehicle operation data 136 from onboard sensors, and base determinations regarding calibrations upon sensor data for the vehicle 1103. Further, in some examples, the calibration system 1104 may receive data, such as an updated simulator 1010, updated learning algorithms (not depicted), or updated target objectives 1151 over a wireless communication link established by a vehicle interface 1120. In this example, the updates may be received while the vehicle is in service and operating.

As illustrated in FIG. 11A, a vehicle 1103 may include a calibration system 1104 and a vehicle interface 1120, where the vehicle 1103 also includes a combustion engine 104 to be calibrated. In this example, the depicted vehicle 1103 may be implemented similarity to the vehicle 102 described above with reference to FIG. 1. However, in this implementation, vehicle 1103, in addition to including multiple mechanical, electrical, memory, and computer components 150, 112, 120, 128, 828, 104, 818 described above, also includes an onboard calibration system 1104 and vehicle interface 1120. In some example, the vehicle interface 1120 may establish physical or wireless communication links with other vehicles or with local or remote computer systems.

In some implementations, the calibration system 1104 may implement a simulation learning environment, such as simulation learning environments 1000, 1001 described above with reference to FIGS. 10A and 10B. In other words, in some examples, the simulation learning environment 1000, 1001 may be implemented onboard the vehicle 1103 or calibration system 1104.

However, in other examples, in contrast to onboard processing and generation of calibration data, a simulation learning environment 1000, 1001 may be implemented remotely with reference to the engine 104 or vehicle 104 being calibrated. For example, the simulation learning environment 1000, 1001 may be implemented within a data center or implemented within a cloud computing environment (not depicted) that is not physically proximate to the vehicle, where example cloud computing environments may include, but are not limited to, Amazon™ AWS (Amazon Web Services), Microsoft™ Azure™, Google™ Cloud services.

In this way, in some implementations, the vehicle interface 1120 may transmit to the remote simulation learning environment, or remote calibration system, data such as vehicle operation data, and other data regarding conditions or status of the engine or vehicle. Continuing with this example, the remote simulation learning environment or remote calibration system, may then, given the received data from the vehicle 1103, perform simulations, generate calibration data, and transmit the calibration data to the vehicle 1103. Consequently, in this example, greater computing resources than may be practicable on a vehicle may be used to generate new calibration data, where the calibration process may be performed while the vehicle 1103 is online and in service.

In short, in this example, the vehicle interface 1120 may transmit vehicle operation data and receive calibration data 1152 for installation onto the online engine 104 or vehicle 1103, where the calibration data, subsequent to installation, calibrates the operation, behavior, or characteristics of the operation of the engine or vehicle when the engine is online or returned to service.

Further, in some implementations, calibration data 1152, once installed onto an online engine or vehicle, may be used to calibrate operation, behavior, or characteristics of the vehicle 1103 in addition to calibrating operation, behavior, or characteristics of the engine 104. In other words, in the disclosed embodiments, calibration of an online engine 104 may include calibration of a vehicle 1103 that incorporates the engine 104.

In this example, an onboard calibration system 1104 includes a simulator 1002 and a calibration module 1010. In some implementations, the simulator 1002 may be designed to simulate behavior and outcomes of a particular engine based on calculations using a mathematical model of the particular engine to be calibrated, as described above with reference to FIGS. 10A and 10B.

Specifically, in this example, the simulator 1002 may receive hybrid simulator input to perform calculations in accordance with the model used to simulate operation of the particular engine. Further, in this example, the simulations may generate output 1006 that describe results of the simulations, where the results of the simulations may include behavior and operating characteristics of the engine that correspond to particular inputs, settings, or parameters specified in the hybrid simulator input. In different implementations, the simulator 1002 may receive simulator input using different techniques. For example, the simulator 1002 may receive input by a user specifying an input source or configuration file via a graphical user interface for the simulator 1002.

Continuing with this example, the calibration module 1010, given simulator input 136, simulator output 1150, and target objectives 1151, may develop and generate calibration data 1070, where the calibration data—when installed onto the engine being simulated, or an engine similar to the engine being simulated—is used to calibrate, tune, or modify the operating characteristics of the engine in accordance with the target objectives.

Figure 11B:
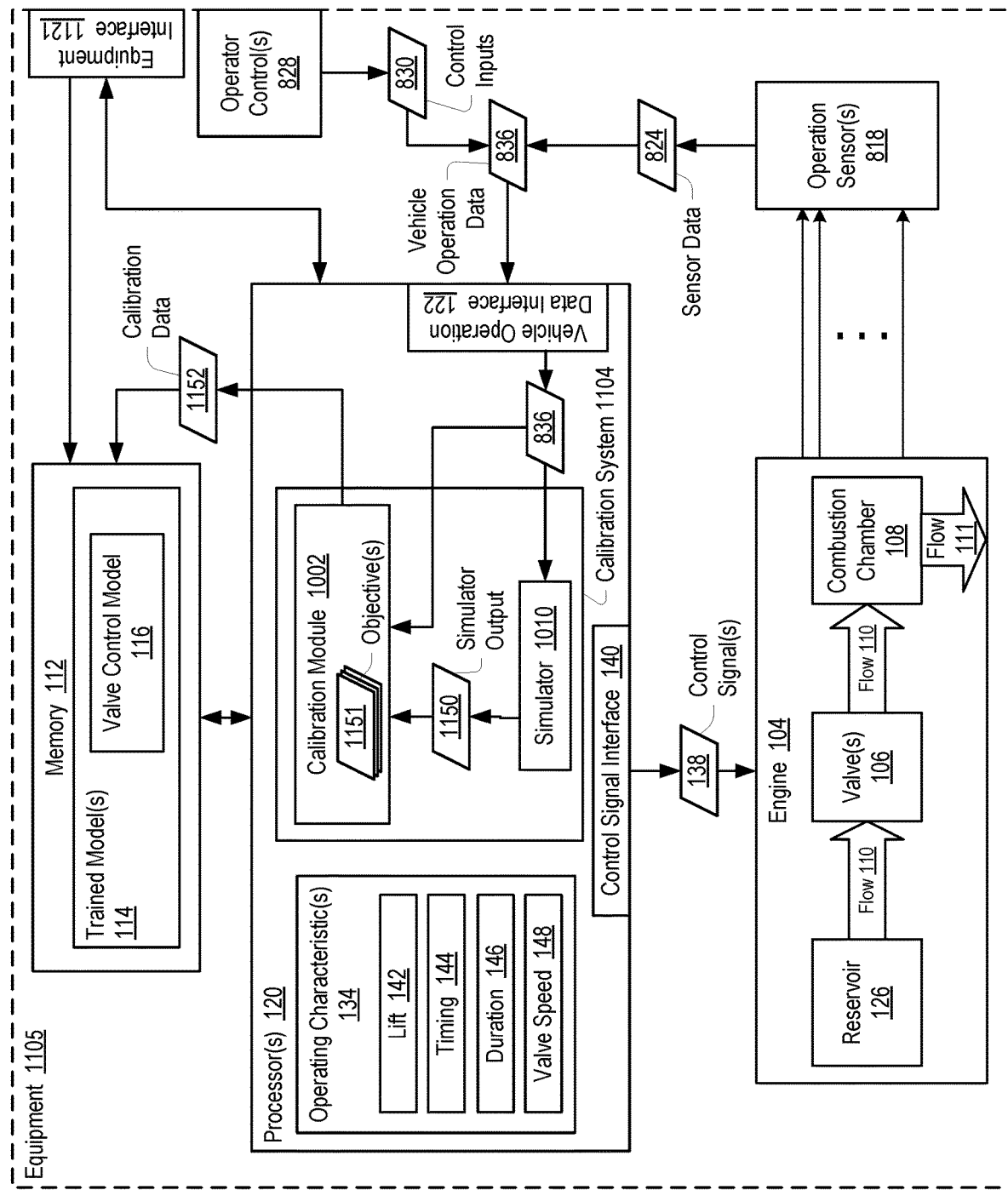
FIG. 11B is a diagram of an example of a calibration computing environment to calibrate an online equipment using simulations in accordance with some examples of the present disclosure.

For further explanation, FIG. 11B depicts, within equipment 1105, an example calibration system 1104 used for generating calibration data 1152 that is used for calibration of online equipment 1105 based on simulation data in accordance with one or more target objectives 1151.

In the example calibration described above with reference to FIG. 11A, calibration of an online engine 104 or vehicle 1103 is described. By contrast, in this implementation, the online combustion engine 104 being calibrated may instead be used in conjunction with multiple types of equipment.

In some implementations, similar to calibration of engines and vehicles described above with reference to FIG. 11A, calibration of an online engine 104 may include calibration of equipment 1105 that incorporates the engine 104. For example, equipment 1105, and a corresponding engine 104, that may be calibrated may include power generators or non-transportive equipment.

In this example, the depicted equipment 1105 may be implemented similarity to equipment 802 described above with reference to FIG. 8. However, in this implementation, equipment 1105, in addition to including multiple mechanical, electrical, memory, and computer components 112, 120, 828, 104, 818 described above, may further include a calibration system 1104 and an equipment interface 1121. In some examples, the equipment interface 1121 may establish physical or wireless communication links with other equipment or with remote computer systems, such as remote computer systems that calculate and generate calibration data.

Further, in some implementations, in contrast to onboard processing and generation of calibration data, and similar to the implementation described above for calibration with reference to FIG. 11A, the vehicle interface 1121 may transmit to a remote simulation learning environment, or remote calibration system, data such as equipment operation data, and other data regarding conditions or status of the engine or equipment. Continuing with this example, the remote simulation learning environment or remote calibration system, may then, given the received data from the equipment 1105, perform simulations, generate calibration data, and transmit the calibration data to the equipment 1105. Consequently, in this example, greater computing resources than may be practicable on a piece of equipment may be used to generate new calibration data, where the calibration process may be performed while the equipment 1105 is online and in service.

In short, in this example, the interface system 1121 may transmit vehicle operation data and receive calibration data 1152 for installation onto the online engine 104 or equipment 1105, where the calibration data, subsequent to installation, is used by a control module to calibrate the operation, behavior, or characteristics of the operation of the engine or equipment when the engine is online or returned to service.

In this way, in this example, the calibration data 1152, once installed onto online equipment or an online engine, may be used to calibrate operation, behavior, or characteristics of the engine 104 in addition to calibrating operation, behavior, or characteristics of the equipment 1105. In other words, in the disclosed embodiments, calibration of an online engine 104 may include calibration of the equipment 1105 that incorporates the engine 104.

FIG. 11B depicts an example architecture for calibration for online equipment using simulations; however, in other implementations, a different architecture or a different system may be used in accordance with each of the embodiments of the present disclosure. In some implementations, the calibration system 1104 depicted within the equipment 1105 may be implemented similarly to the simulation learning environments 1000, 1001 described above with reference to FIGS. 10A and 10B. For example, the calibration system 1104 may include some or all of the described components described above, in addition to including components directed toward calibration of online pieces of equipment.

For example, instead of a calibration system 1104 receiving operation data from equipment 1105 via an equipment interface 1121, sets of simulator input from multiple, different pieces of equipment may be collected and provided by one or more databases, or one or more cloud computing storage services, or through some other manner of input data upload into the calibration system 1104. Similarly, in some implementations, calibration system 1104 may receive, or be configured with, target objectives 1151 and the different kinds of simulator inputs described herein.

Figure 12A:
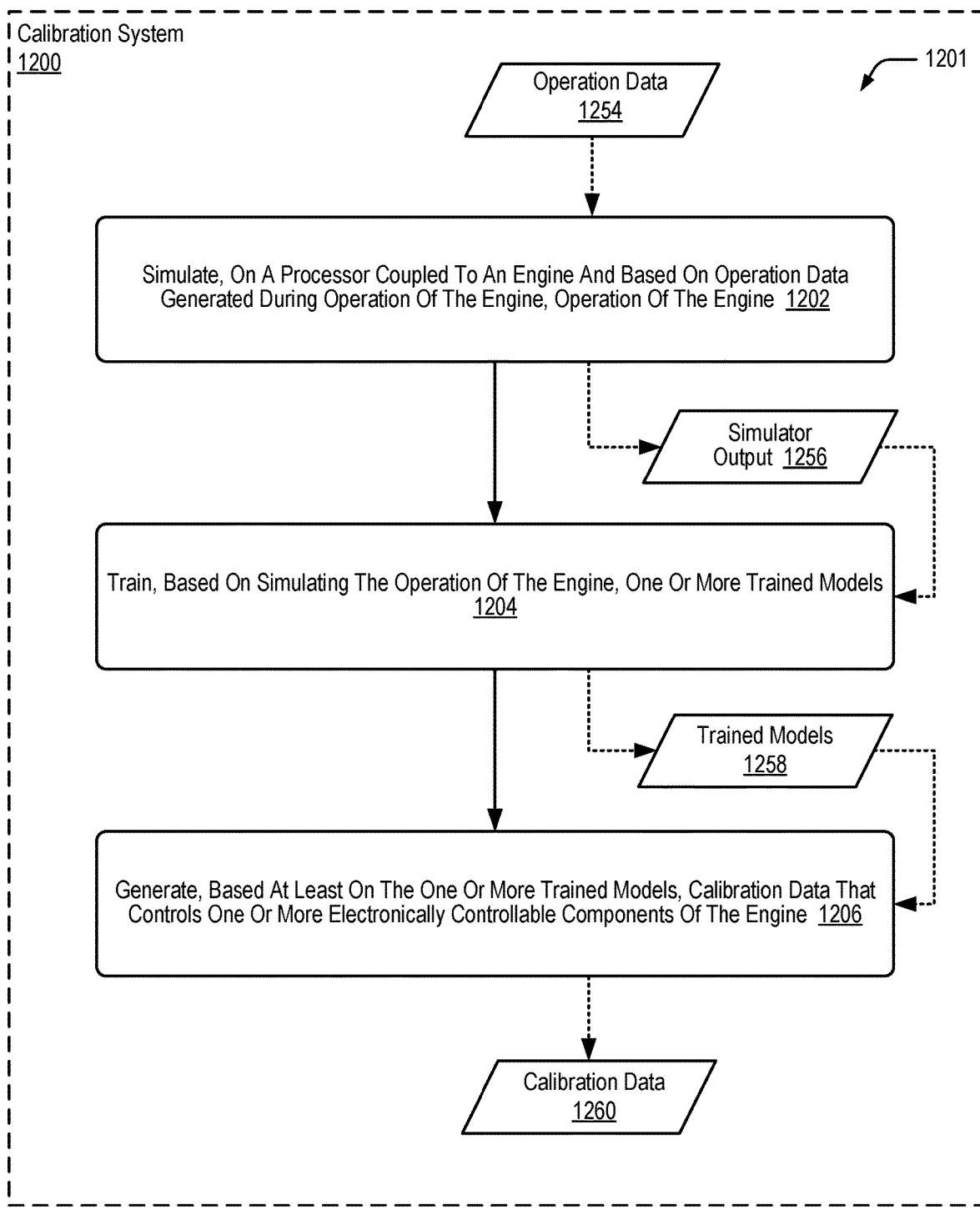
FIG. 12A is a flow chart of a method of using a simulator to determine calibration information for an online engine in accordance with some examples of the present disclosure.

For further explanation, FIG. 12A depicts a flowchart 1201 of an example method for calibration of online combustion engines using simulations in accordance with embodiments of the present disclosure. As depicted, the flowchart 1201 illustrates an implementation for simulating operation of an engine to generate calibration data 1260 to be used for calibrating one or more electronically controllable components of an engine.

Further, the example method depicted in FIG. 12A may be implemented by one or more computing devices, such as laptop computers, desktop computers, mobile devices, servers, or other devices using processors or operating systems, such as those discussed above with reference to FIGS. 1-11B. In particular, with reference to the calibration systems 1104 depicted in FIGS. 11A and 11B, the calibration system 1200 depicted in FIG. 12A may be implemented similarly to the calibration system 1104, and may similarly include a simulator 1002 and a calibration module 1010.

Turning toward the flowchart 1201, the example method depicted in FIG. 12A includes: simulating 1202, on a processor couple to an engine and based on operation data 1254 generated during operation of the engine, operation of the engine; training 1204, based on simulating 1202 the operation of the engine, one or more trained models 1258; and generating 1206, based at least on the one or more trained models 1258, calibration data 1260 corresponding to one or more electronically controllable components of the engine.

Simulating 1202, on a processor coupled to an engine and based on operation data 1254 generated during operation of the engine, operation of the engine being may be carried out similarly to carrying out the simulations described above with reference to FIGS. 10A-11B. For example, a simulator, such as simulator 1002 depicted in FIG. 11A, may be designed to simulate behavior and outcomes of a particular engine based on calculations using a mathematical model of the particular engine. In this example, the simulator 1002 may use the operation data 1254 as simulator input.

Further, in some examples, simulator input 1254 may be hybrid simulator input that includes input based on using a data-driven approach for generating simulation input combined with using input based on real-world, sample inputs based on the operation data 1254. In this example, and with reference to FIG. 11A, sample inputs, such as operation data 836 stored within a memory 112 of a vehicle, may be received by the calibration system 1104 via a vehicle operation data interface 122 that is communicatively coupled to receive operation data that includes control inputs and sensor data. In this example, data-driven simulator input may be generated onboard, or may be received over the air wirelessly from a remote simulation learning environment, and the data-drive simulation input may include ranges and combinations of simulator input from continuous spectrums of possible inputs described above with regard to combinations of inputs, as described in greater detail above with reference to FIGS. 10A and 10B.

Continuing with this example, simulator output 1256 from one or more onboard or remote simulations may be provided to a calibration module, such as calibration module 1010 depicted in FIG. 11A. In this example, the calibration module, in addition to the simulator output 1256, may also receive simulator inputs, and target objectives, and use the simulator output 1256, simulator inputs, and target objectives as a basis for generating calibration data.

In this example, and with reference to FIG. 11A, a calibration system 1104 is depicted as receiving operation data 836 from a single vehicle; however, in other examples more generally, a calibration system 1104 may receive sets of vehicle operation data collected from multiple, different engines over a wireless link.

In other words, in other examples more generally, instead of a calibration system 1104 receiving vehicle operation data from a vehicle via an interface system 1102, sets of simulator input from multiple, different vehicles may be provided by one or more databases, or one or more cloud computing storage services, or through some other manner of input data upload into the calibration system 1104.

Similarly, in some implementations, data-driven simulator input used by the simulator may be received from sources other than the calibration module 1010. For example, sets of simulator input from multiple, different sources may be provided by one or more databases, or one or more cloud computing storage services, or through some other manner of input data upload into the calibration system 1104.

Training 1204, based on simulating the operation of the engine, one or more trained models 1258 may be carried out similarly to carrying out training models described above with reference to FIGS. 10A-11B. For example, output 1256 from the simulations may be provided to a calibration module 1010. In some examples, the calibration module 1010 may also receive as input the hybrid simulator input 1055 provided to the simulator 1002, and receive one or more target objectives to be met, or nearly met, in calibrating an online engine.

Continuing with this example, given inputs that include simulator output 1256 and corresponding simulator input 1254, and include the one or more target objectives, the calibration module 1010 may use a learning algorithm, such as learning algorithms 1011A-1011Q to train the one or more trained models 1258. Further, a given learning algorithm, such as a genetic algorithm 510, described above with reference to FIG. 5, may be trained using sets of simulator output 1152 and corresponding sets of simulator input 1154, and using one or more target objectives 1452 for calibrating the engine.

In this way, in this example, training the one or more models 1258 results in the trained models providing, under various conditions, specific specifications of control signals given specific vehicle operation data, such that during operation of the engine, one or more engine characteristics are in accordance with, or satisfy or nearly satisfy, the one or more target objectives for calibrating the engine.

Generating 1206, based at least on the one or more trained models 1258, calibration data 1260 corresponding to one or more electronically controllable components of the online engine being calibrated may be carried out by the calibration module 1010 generating calibration data 1260 that specifies the one or more trained models.

Further, in this example, the calibration data 1260 may be uploaded or installed onto an online engine or vehicle, and based on the uploaded calibration data 1260. Continuing with this example, the trained models may take in as input various vehicle or engine operation data, such as sensor data and control inputs, and generate control signals in accordance with the calibration data, where the control signals control the electronically controllable components of the engine or vehicle.

Figure 12B:
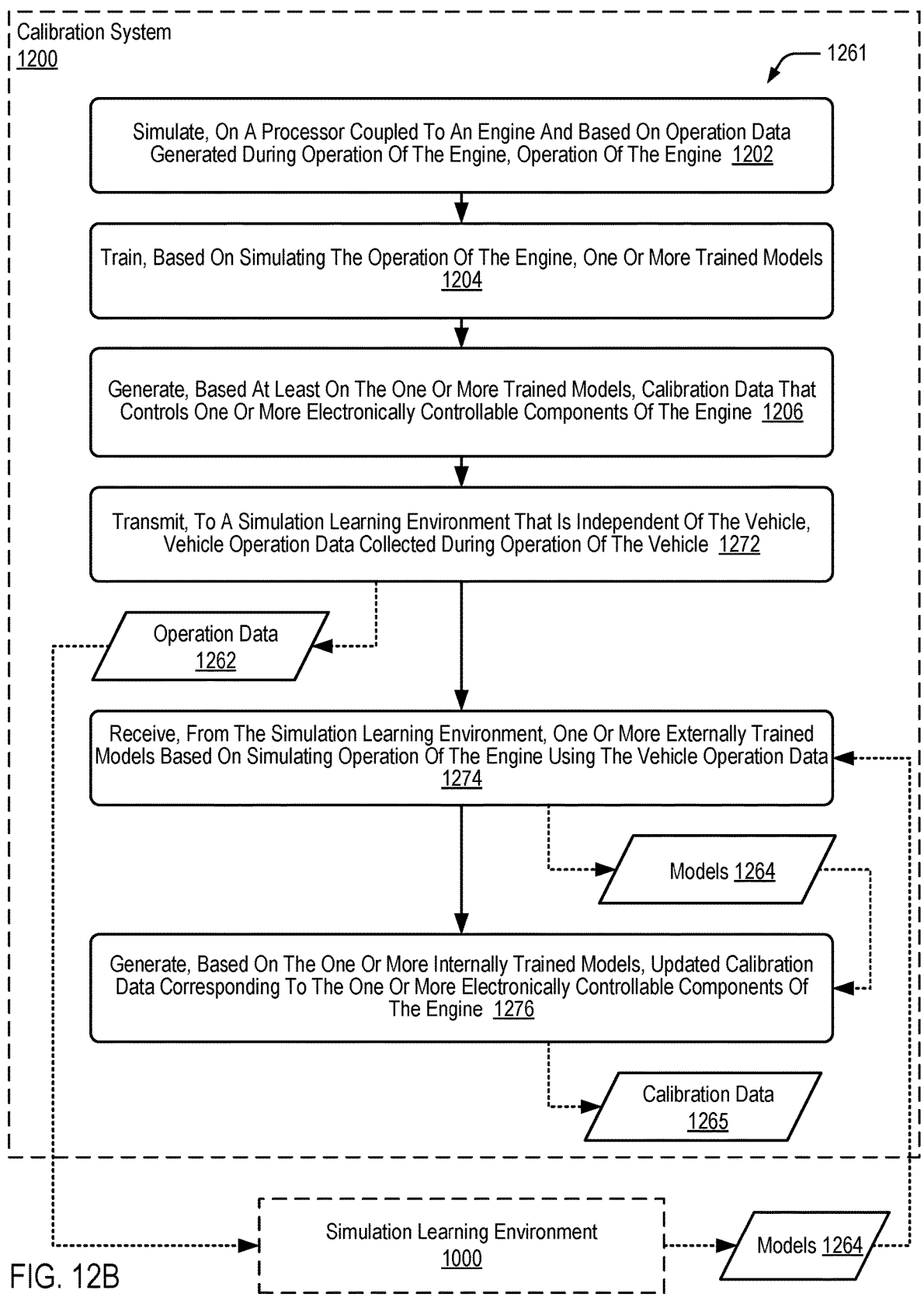
FIG. 12B is a flow chart of a method of using a simulator to determine calibration information for an engine in accordance with some examples of the present disclosure.

For further explanation, FIG. 12B depicts a flowchart 1261 of an example method for calibration of online combustion engines using simulations in accordance with embodiments of the present disclosure. As depicted, the flowchart 1261 illustrates an implementation for simulating operation of an engine to generate calibration data 1260 to be used for calibrating one or more electronically controllable components of an engine.

Specifically, in this example, the flowchart 1261 depicts generating calibration data using both offline and online techniques—where operation data generated during online operation is provided to an external simulation learning environment 1000, and where the external simulation learning environment, after simulating the engine using the real-world operation data, provides updated calibration data to the vehicle.

The example method depicted in FIG. 12B is similar to the example method depicted in FIG. 12A, as the example method depicted in FIG. 12B also includes: simulating 1202, on a processor couple to an engine and based on operation data 1254 generated during operation of the engine, operation of the engine; training 1204, based on simulating 1202 the operation of the engine, one or more trained models 1258; and generating 1206, based at least on the one or more trained models 1258, calibration data 1260 corresponding to one or more electronically controllable components of the engine.

Figure 13:
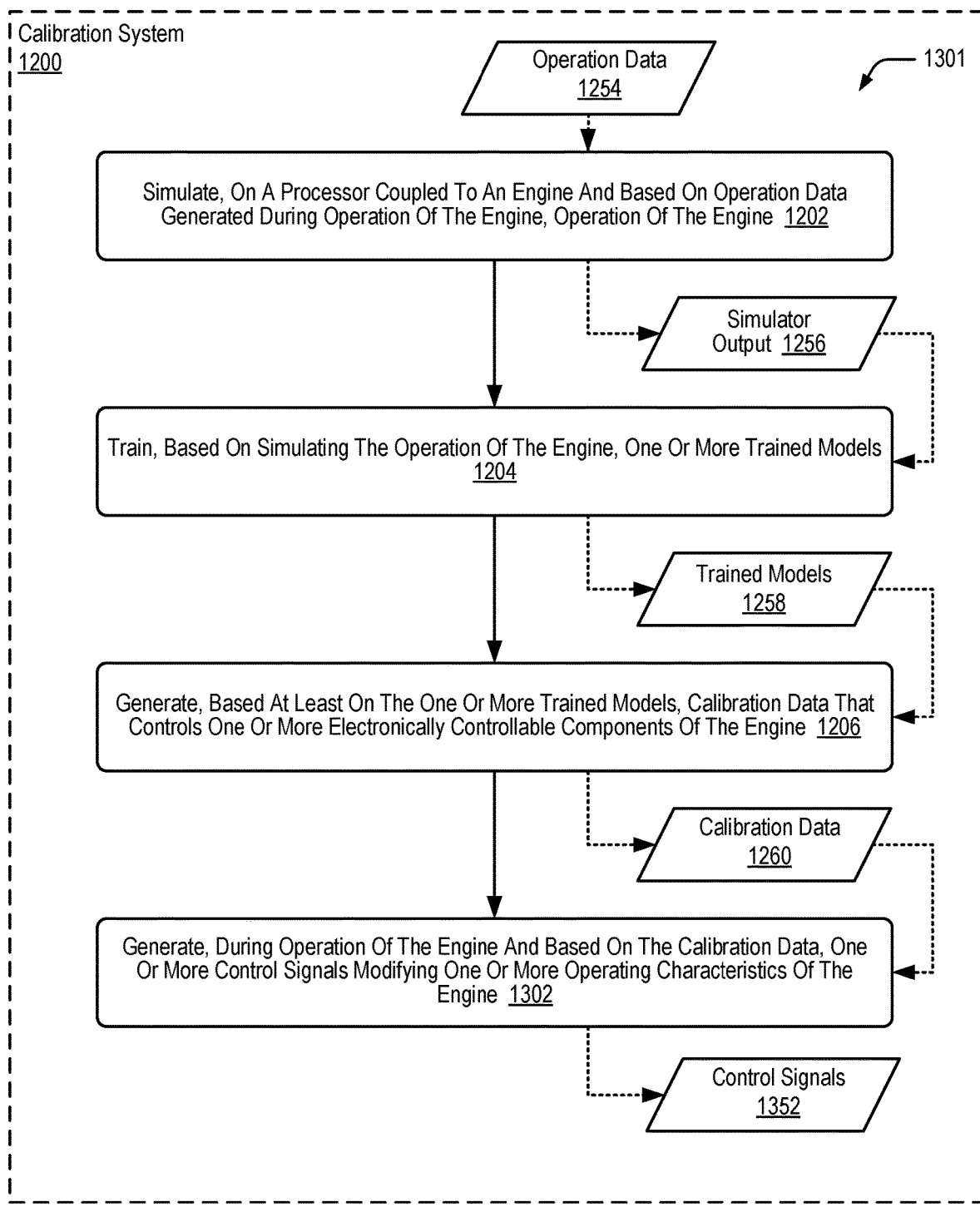
FIG. 13 is a flow chart of a method of using a simulator to determine calibration information for an online engine in accordance with some examples of the present disclosure.

However, in contrast to the example method in FIG. 12A, the example method in FIG. 13 further includes transmitting 1272, to a simulation learning environment 1000 that is independent of the vehicle, vehicle operation data 1262 collected during operation of the vehicle; receiving 1274, from the simulation learning environment 1000, one or more externally trained models 1264 based on simulating operation of the engine using the vehicle operation data 1262; and generating 1276, based on the one or more externally trained models 1264, updated calibration data 1265 corresponding to the one or more electronically controllable components of the engine.

Transmitting 1272, to a simulation learning environment 1000 that is independent of the vehicle, vehicle operation data 1262 collected during operation of the vehicle may be carried out by establishing a communication link with the simulation learning environment, such as a communication link established over a wireless network, such as a cellular network, and where communication may be based on any standard network communication protocol.

Receiving 1274, from the simulation learning environment 1000, one or more externally trained models 1264 based on simulating operation of the engine using the vehicle operation data 1262 may be carried out by using the communication link established above, and where receiving is done using any standard network communication protocol.

Generating 1276, based on the one or more externally trained models 1264, updated calibration data 1265 corresponding to the one or more electronically controllable components of the engine may be carried out similarly to generating 1206 calibration data described above with reference to FIG. 12A, and as described above with reference to FIGS. 10A, 10B, 11A, and 11B.

For further explanation, FIG. 13 depicts a flowchart 1301 of an example method for calibration of online combustion engines using simulations in accordance with embodiments of the present disclosure. As depicted, the flowchart 1301 illustrates an implementation for simulating operation of an engine to generate calibration data 1260 to be used for calibrating one or more electronically controllable components of an engine.

The example method depicted in FIG. 13 is similar to the example method depicted in FIG. 12A, as the example method depicted in FIG. 13 also includes: simulating 1202, on a processor couple to an engine and based on operation data 1254 generated during operation of the engine, operation of the engine; training 1204, based on simulating 1202 the operation of the engine, one or more trained models 1258; and generating 1206, based at least on the one or more trained models 1258, calibration data 1260 corresponding to one or more electronically controllable components of the engine.

However, in contrast to the example method in FIG. 12A, the example method in FIG. 13 further includes generating 1302, during operation of the engine and based on the calibration data 1260, one or more control signals (1352) modifying one or more operating characteristics of the engine.

Generating 1302, during operation of the engine and based on the calibration data 1260, one or more control signals (1352) modifying one or more operating characteristics of the engine may be carried out by an electronic control module onboard the vehicle, such as electronic control module 150 depicted in FIG. 11A, where for given a given set of input vehicle operation data 136, the one or more trained models 1258 generate output, where the trained model output is then used by the electronic control module 150 to issue control signals to give effect to the trained model output by specifying operating characteristics of the engine or vehicle.

Figure 14:
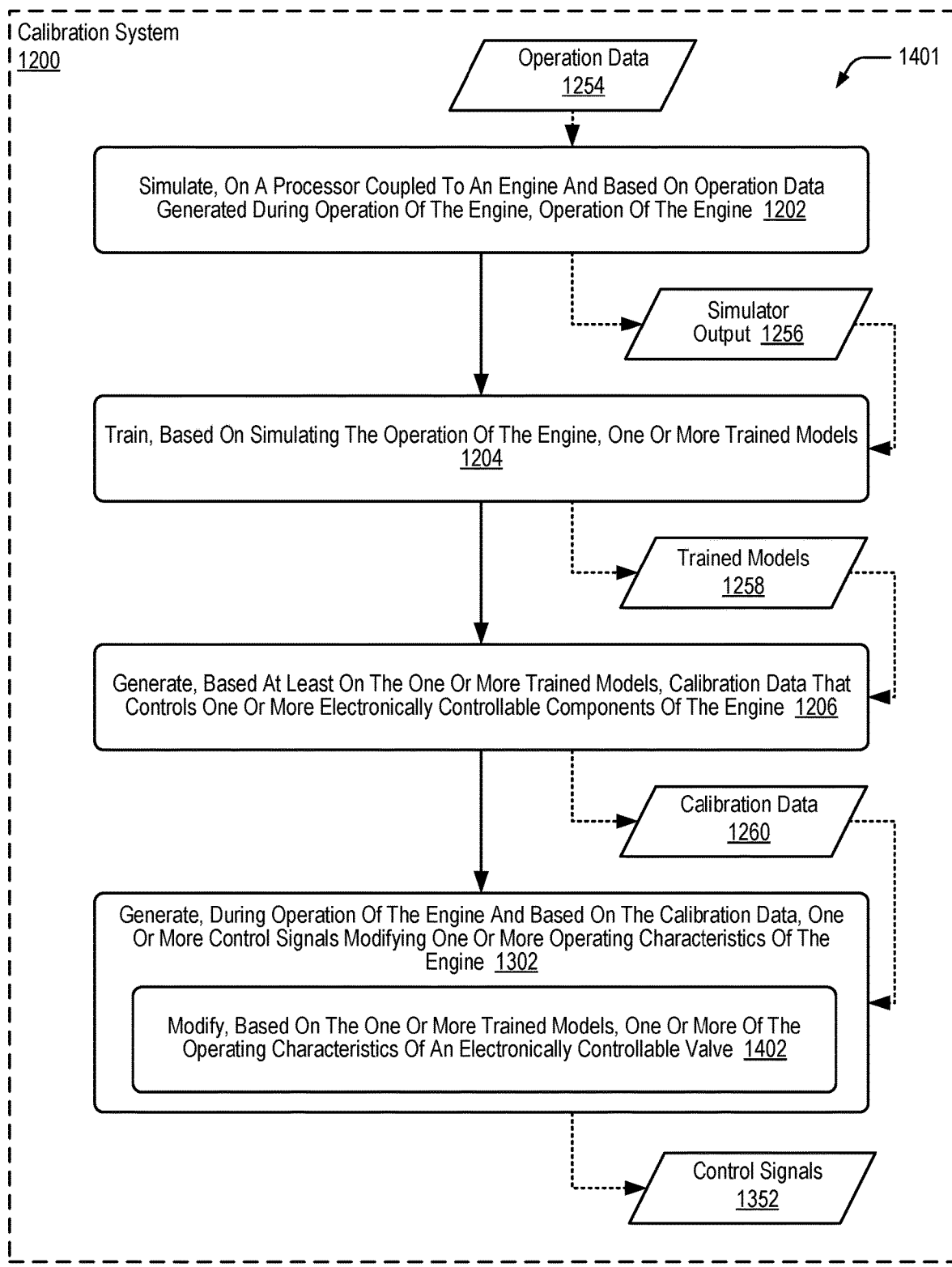
FIG. 14 is a flow chart of a method of using a simulator to determine calibration information for an online engine in accordance with some examples of the present disclosure.

For further explanation, FIG. 14 depicts a flowchart 1401 of an example method for calibration of online combustion engines using simulations in accordance with embodiments of the present disclosure. As depicted, the flowchart 1401 illustrates an implementation for simulating operation of an engine to generate calibration data 1260 to be used for calibrating one or more electronically controllable components of an engine.

The example method depicted in FIG. 14 is similar to the example method depicted in FIG. 13, as the example method depicted in FIG. 13 also includes: simulating 1202, on a processor couple to an engine and based on operation data 1254 generated during operation of the engine, operation of the engine; training 1204, based on simulating 1202 the operation of the engine, one or more trained models 1258; generating 1206, based at least on the one or more trained models 1258, calibration data 1260 corresponding to one or more electronically controllable components of the engine; and generating 1302, during operation of the engine and based on the calibration data 1260, one or more control signals modifying one or more operating characteristics of the engine.

However, in contrast to the example method in FIG. 13, the example method in FIG. 14 further specifies that generating 1302 the one or more control signals modifying the one or more operating characteristics further includes modifying 1402, based on the one or more trained models, one or more of the operating characteristics of an electronically controllable valve.

Modifying 1402, based on the one or more trained models, one or more of the operating characteristics of an electronically controllable valve may be carried out based on at least one of the trained models including a trained valve control model, such as valve control models described above with reference to FIGS. 1-9.

For example, in some implementations, a valve control model may be trained to determine, responsive to receiving, and based at least in part on, the vehicle operation data, an operating characteristic corresponding to the electronically controllable valve, and where the operating characteristics is generated by producing a corresponding set of control signals sent to the engine by the electronic control module.

Figure 15:
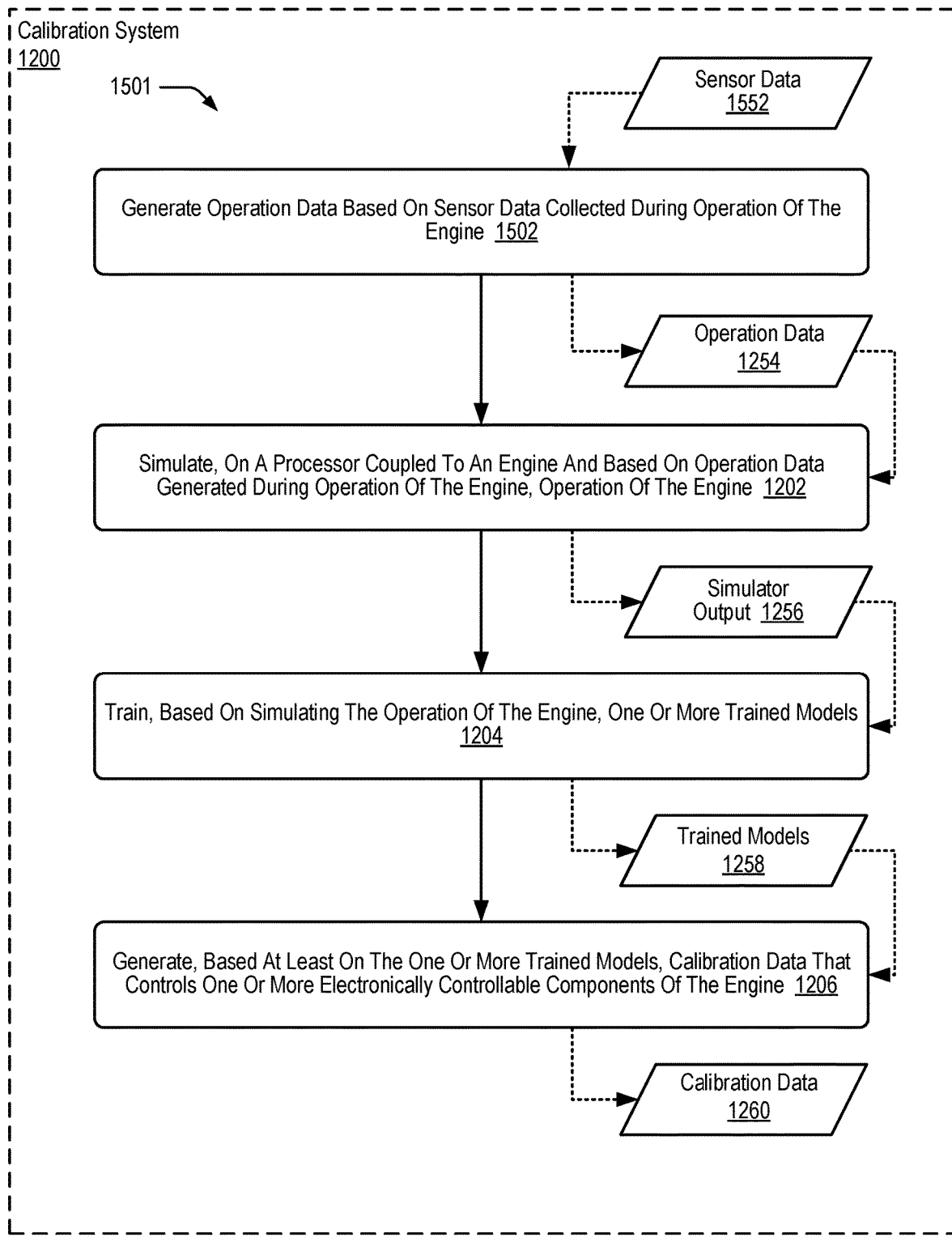
FIG. 15 is a flow chart of a method of using a simulator to determine calibration information for an online engine in accordance with some examples of the present disclosure.

For further explanation, FIG. 15 depicts a flowchart 1501 of an example method for calibration of online combustion engines using simulations in accordance with embodiments of the present disclosure. As depicted, the flowchart 1501 illustrates an implementation for simulating operation of an engine to generate calibration data 1260 to be used for calibrating one or more electronically controllable components of an engine.

The example method depicted in FIG. 15 is similar to the example method depicted in FIG. 12A, as the example method depicted in FIG. 15 also includes: simulating 1202, on a processor couple to an engine and based on operation data 1254 generated during operation of the engine, operation of the engine; training 1204, based on simulating 1202 the operation of the engine, one or more trained models 1258; and generating 1206, based at least on the one or more trained models 1258, calibration data 1260 corresponding to one or more electronically controllable components of the engine.

However, in contrast to the example method in FIG. 12A, the example method in FIG. 15 further includes generating 1502 operation data 1254 based on sensor data 1552 collected during operation of the engine. Generating 1502 operation data 1254 based on sensor data 1552 collected during operation of the engine may be carried out by an electronic control module 150, such as that depicted in FIG. 11A, receiving, and storing vehicle operation data 136 received from sensor input and operator control input. In some examples, the electronic control module may also store and correlate control signals that were sent out to the engine that correspond with the sensor data, where such data may serve as simulator input. Further, in some examples, new sets of simulator input may be generated when there is a change to sensor data, or when there is a different control signal issued to the engine.

Figure 16:
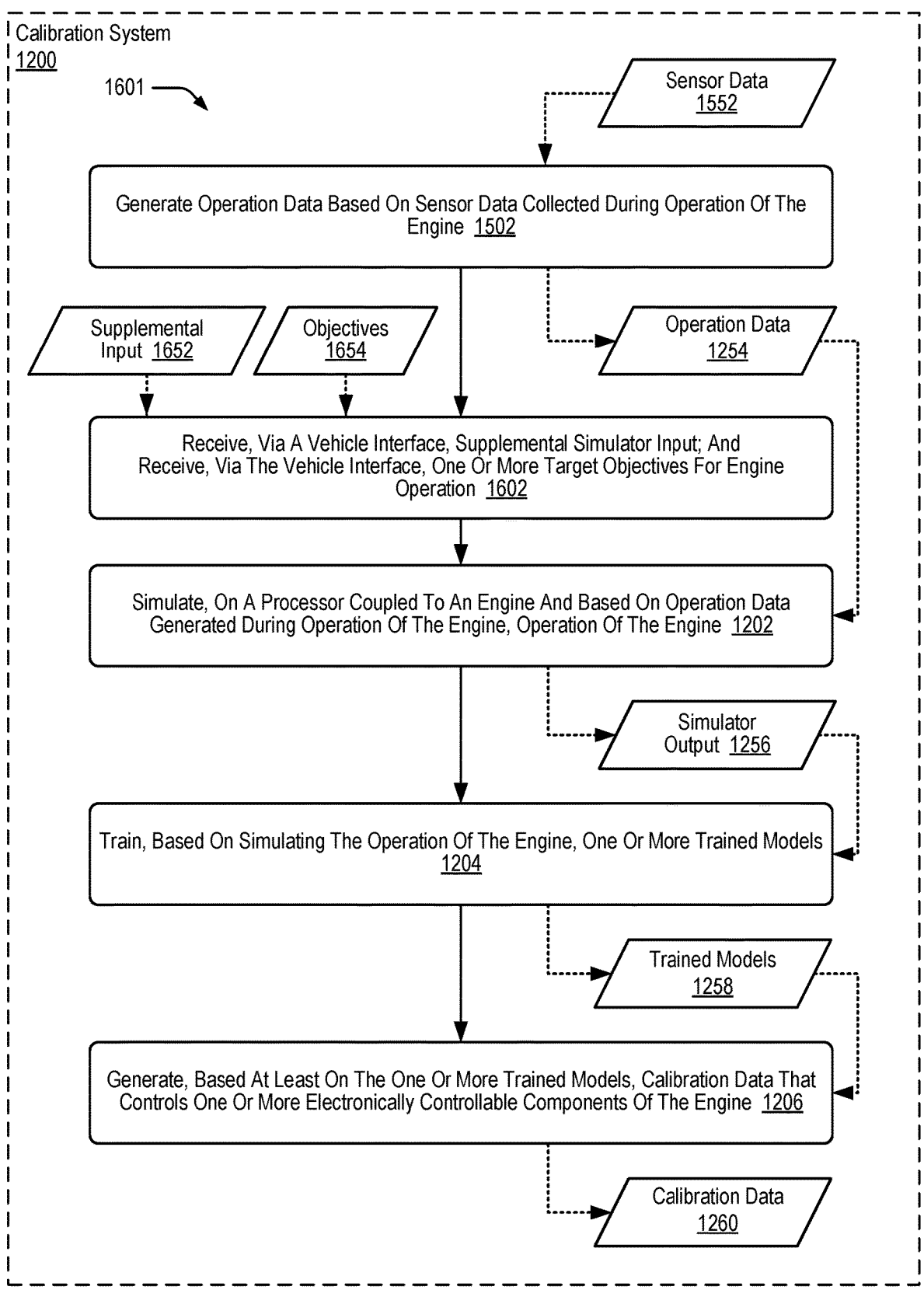
FIG. 16 is a flow chart of a method of using a simulator to determine calibration information for an online engine in accordance with some examples of the present disclosure.

For further explanation, FIG. 16 depicts a flowchart 1601 of an example method for calibration of online combustion engines using simulations in accordance with embodiments of the present disclosure. As depicted, the flowchart 1601 illustrates an implementation for simulating operation of an engine to generate calibration data 1260 to be used for calibrating one or more electronically controllable components of an engine.

The example method depicted in FIG. 16 is similar to the example method depicted in FIG. 15, as the example method depicted in FIG. 16 also includes: generating 1502 operation data 1254 based on sensor data 1552 collected during operation of the engine; simulating 1202, on a processor couple to an engine and based on operation data 1254 generated during operation of the engine, operation of the engine; training 1204, based on simulating 1202 the operation of the engine, one or more trained models 1258; and generating 1206, based at least on the one or more trained models 1258, calibration data 1260 corresponding to one or more electronically controllable components of the engine.

However, in contrast to the example method in FIG. 15, the example method in FIG. 16 further includes: receiving 1602, via a vehicle interface, supplemental simulator input 1652, and receiving, via the vehicle interface, one or more target objectives 1654 for engine operation.

Receiving 1602, via a vehicle interface, supplemental simulator input, and receiving, via the vehicle interface, one or more target objectives for engine operation may be carried out by establishing a communication link over a vehicle interface, such as vehicle interface 1120 depicted in FIG. 11A. In this example, the communication link may be wireless and established as the vehicle is in use or operating, and where the communication link may be initiated by the electronic control module 150 to a remote simulation learning environment, or where the communication link may be initiated from a remote location based on new or updated calibration data, calibration data target objectives, or simulator inputs being available.

Figure 17:
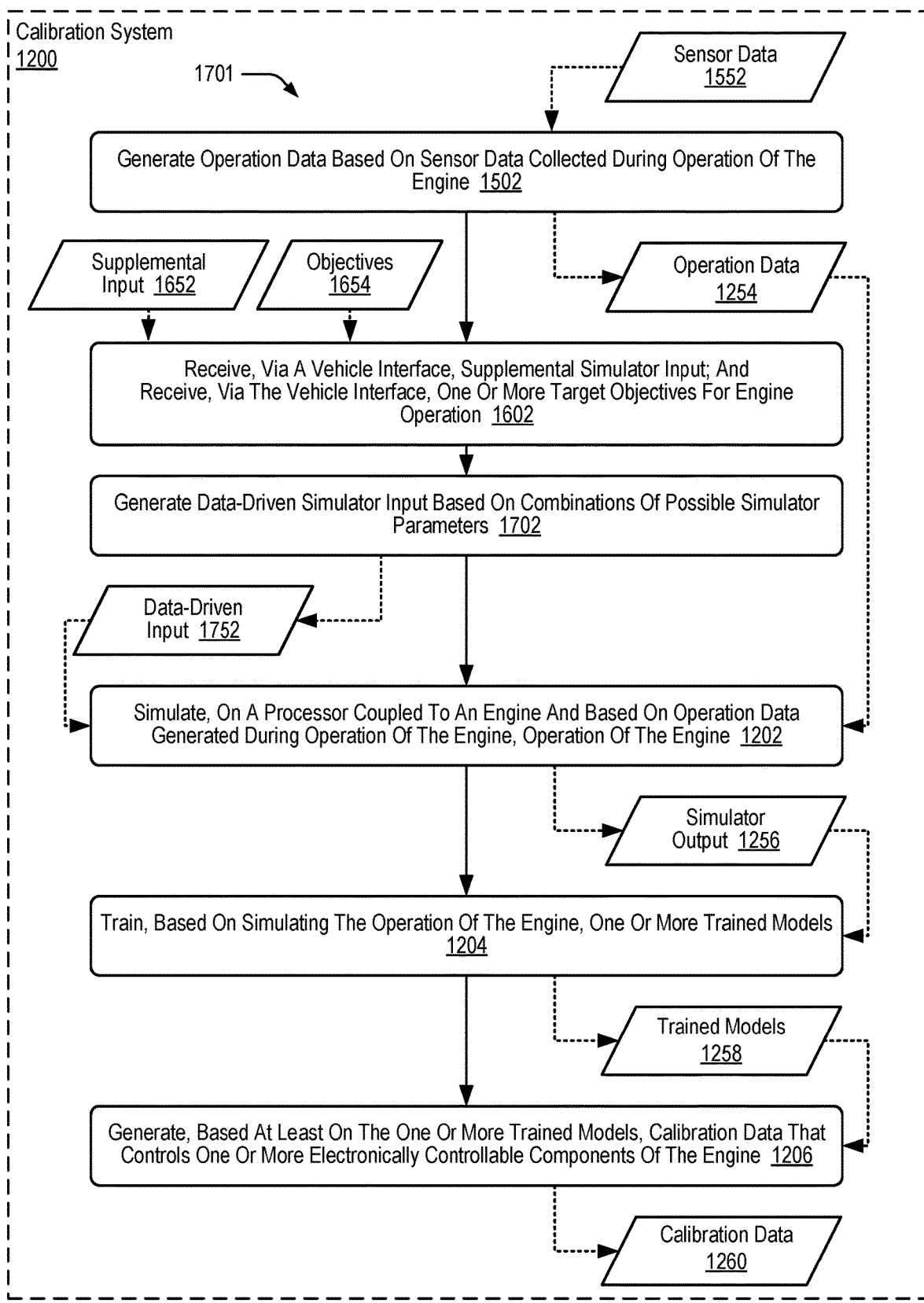
FIG. 17 is a flow chart of a method of using a simulator to determine calibration information for an online engine in accordance with some examples of the present disclosure.

For further explanation, FIG. 17 depicts a flowchart 1701 of an example method for calibration of online combustion engines using simulations in accordance with embodiments of the present disclosure. As depicted, the flowchart 1701 illustrates an implementation for simulating operation of an engine to generate calibration data 1260 to be used for calibrating one or more electronically controllable components of an engine.

The example method depicted in FIG. 17 is similar to the example method depicted in FIG. 16, as the example method depicted in FIG. 17 also includes: generating 1502 operation data 1254 based on sensor data 1552 collected during operation of the engine; receiving 1602, via a vehicle interface, supplemental simulator input 1652, and receiving, via the vehicle interface, one or more target objectives 1654 for engine operation; simulating 1202, on a processor couple to an engine and based on operation data 1254 generated during operation of the engine, operation of the engine; training 1204, based on simulating 1202 the operation of the engine, one or more trained models 1258; and generating 1206, based at least on the one or more trained models 1258, calibration data 1260 corresponding to one or more electronically controllable components of the engine.

However, in contrast to the example method in FIG. 16, the example method in FIG. 17 further includes: generating 1702 data-driven simulator input 1752 based on combinations of possible simulator parameters. Further, in some examples, generating 1702 data-driven simulator input 1752 based on combinations of possible simulator parameters is based on specifications for a given objective for engine operation.

Generating 1702 data-driven simulator input 1752 based on combinations of possible simulator parameters may be carried out as described above with reference to FIGS. 10A-11B. For example, data-driven simulator input may be generated based on selecting random input data sets of simulator parameters based on combinatorial selection of possible parameter values for simulator settings, including: sensor data values for one or more sensors coupled to a throttle or accelerator pedal, sensor data values for a brake pedal, sensor data values for a clutch pedal, sensor data values for a steering wheel position or movement, sensor data values for a gear shift control, sensor data values for traction control settings, sensor data values for ride height control, or sensor data values for cruise control, data for vehicle or engine remote control.

Figure 18:
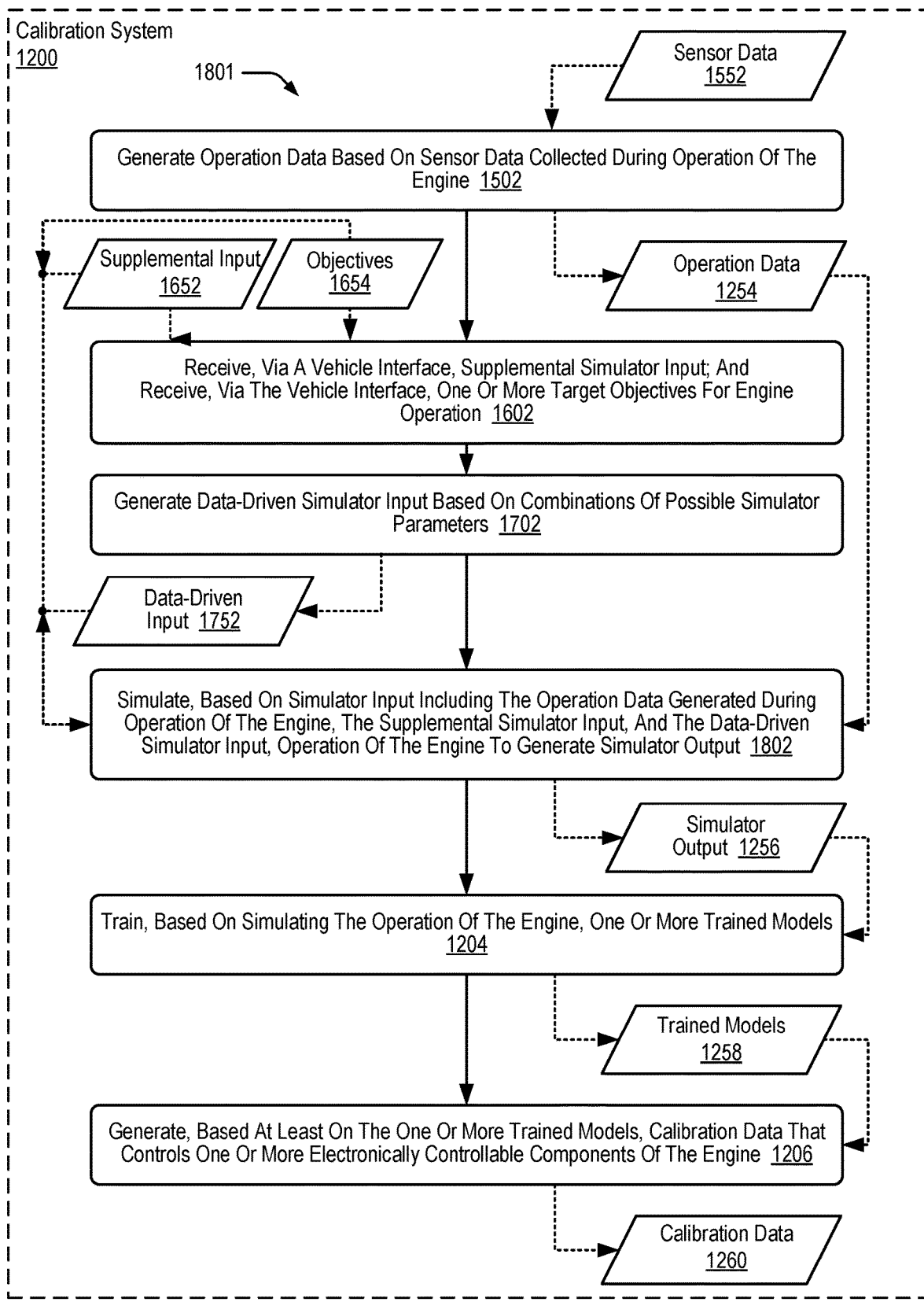
FIG. 18 is a flow chart of a method of using a simulator to determine calibration information for an online engine in accordance with some examples of the present disclosure.

For further explanation, FIG. 18 depicts a flowchart 1801 of an example method for calibration of online combustion engines using simulations in accordance with embodiments of the present disclosure. As depicted, the flowchart 1801 illustrates an implementation for simulating operation of an engine to generate calibration data 1260 to be used for calibrating one or more electronically controllable components of an engine.

The example method depicted in FIG. 18 is similar to the example method depicted in FIG. 17, as the example method depicted in FIG. 17 also includes: generating 1502 operation data 1254 based on sensor data 1552 collected during operation of the engine; receiving 1602, via a vehicle interface, supplemental simulator input 1652, and receiving, via the vehicle interface, one or more target objectives 1654 for engine operation; generating 1702 data-driven simulator input 1752 based on combinations of possible simulator parameters; training 1204, based on simulating 1202 the operation of the engine, one or more trained models 1258; and generating 1206, based at least on the one or more trained models 1258, calibration data 1260 corresponding to one or more electronically controllable components of the engine.

However, in contrast to the example method in FIG. 17, the example method in FIG. 18 replaces simulating 1202, on a processor couple to an engine and based on operation data 1254 generated during operation of the engine, operation of the engine. More specifically, in this example, simulating 1202 is, in this example, replaced with a specification of simulating 1802, based on simulator input including the operation data 1254 generated during operation of the engine, the supplemental simulator input 1652, and the data-driven simulator input 1654, operation of an engine to generate the simulator output 1256.

Simulating 1802, based on simulator input including the operation data 1254 generated during operation of the engine, the supplemental simulator input 1652, and the data-driven simulator input 1654, operation of an engine to generate the simulator output 1256 may be carried out as described with reference to FIG. 11A, where a simulator 1002 may operate on multiple types of simulator inputs to generate simulator output.

Figure 19:
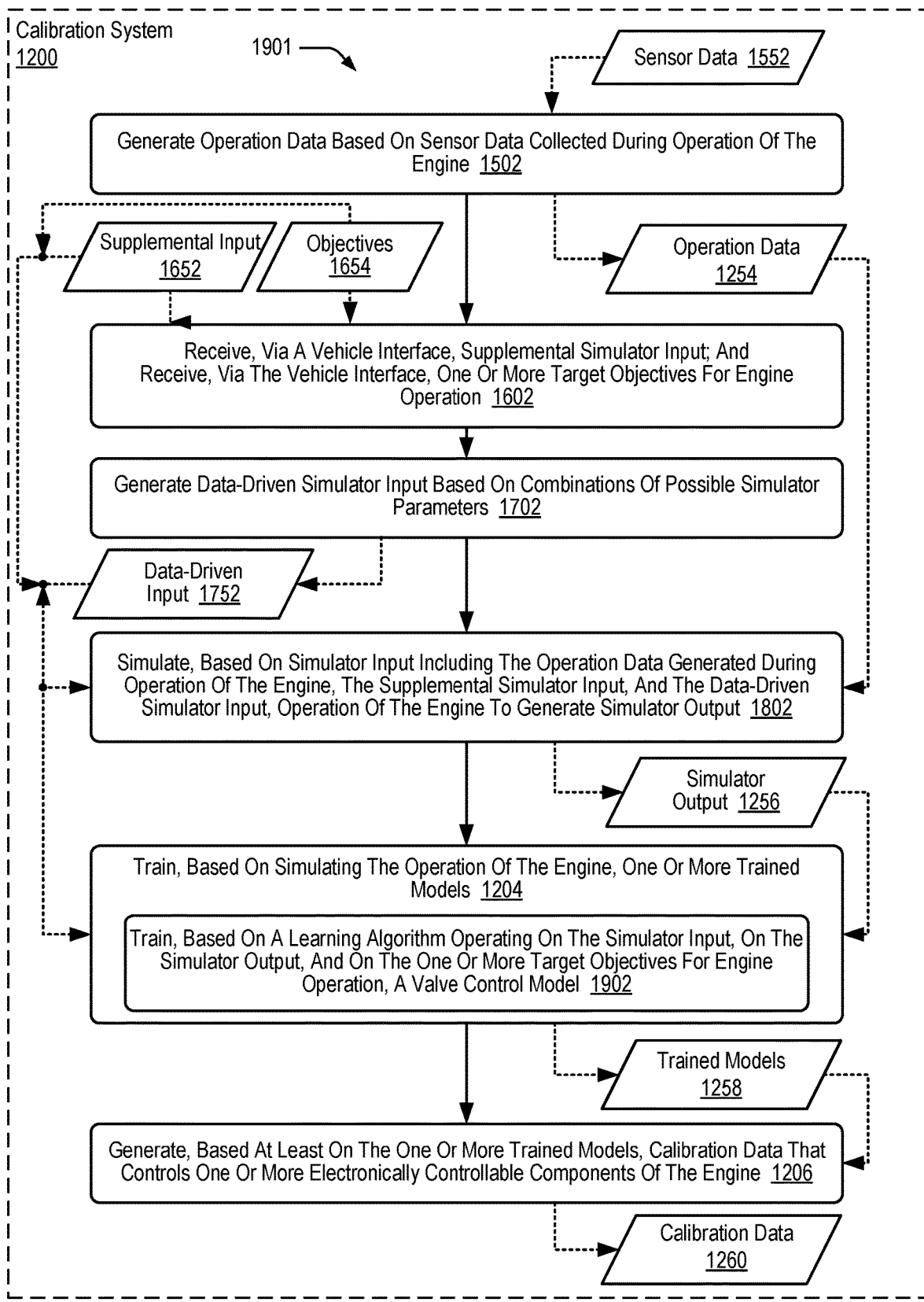
FIG. 19 is a flow chart of a method of using a simulator to determine calibration information for an online engine in accordance with some examples of the present disclosure.

For further explanation, FIG. 19 depicts a flowchart 1901 of an example method for calibration of online combustion engines using simulations in accordance with embodiments of the present disclosure. As depicted, the flowchart 1901 illustrates an implementation for simulating operation of an engine to generate calibration data 1260 to be used for calibrating one or more electronically controllable components of an engine.

The example method depicted in FIG. 19 is similar to the example method depicted in FIG. 18, as the example method depicted in FIG. 18 also includes: generating 1502 operation data 1254 based on sensor data 1552 collected during operation of the engine; receiving 1602, via a vehicle interface, supplemental simulator input 1652, and receiving, via the vehicle interface, one or more target objectives 1654 for engine operation; generating 1702 data-driven simulator input 1752 based on combinations of possible simulator parameters; simulating 1802, based on simulator input including the operation data 1254 generated during operation of the engine, the supplemental simulator input 1652, and the data-driven simulator input 1654, operation of an engine to generate the simulator output 1256; training 1204, based on simulating 1202 the operation of the engine, one or more trained models 1258; and generating 1206, based at least on the one or more trained models 1258, calibration data 1260 corresponding to one or more electronically controllable components of the engine.

However, in contrast to the example method in FIG. 17, the example method in FIG. 18 further specifies training 1204, based on simulating 1202 the operation of the engine, one or more trained models 1258 to include training 1902, based on a learning algorithm operating on the simulator input 1652, 1752, on the simulator output 1256, and on the one or more target objectives 1654 for engine operation, a valve control model.

Training 1902, based on a learning algorithm operating on the simulator input 1652, 1752, on the simulator output 1256, and on the one or more target objectives 1654 for engine operation, a valve control model may be carried out by as described above with reference to FIG. 12A and training the one or more models, and where the one or more models include a valve control model. Further, in this example, a valve control model may be trained as described above with reference to genetic learning algorithms and FIG. 5.

Figure 20:
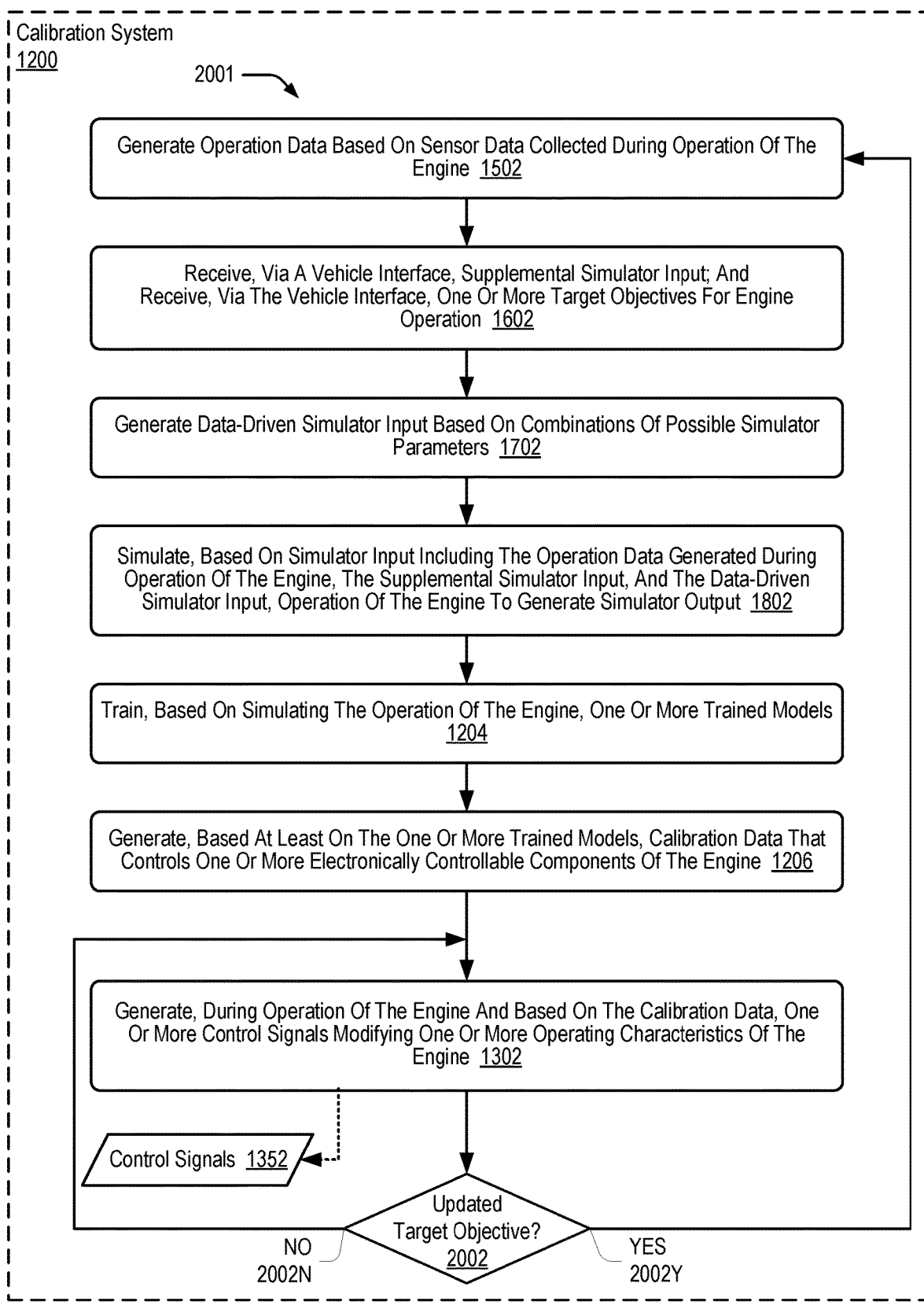
FIG. 20 is a flow chart of a method of using a simulator to determine calibration information for an online engine in accordance with some examples of the present disclosure.

For further explanation, FIG. 20 depicts a flowchart 2001 of an example method for calibration of online combustion engines using simulations in accordance with embodiments of the present disclosure. As depicted, the flowchart 2001 illustrates an implementation for simulating operation of an engine to generate calibration data 2001 to be used for calibrating one or more electronically controllable components of an engine.

The example method depicted in FIG. 20 is similar to the example method depicted in FIG. 19, as the example method depicted in FIG. 20 also includes: generating 1502 operation data 1254 based on sensor data 1552 collected during operation of the engine; receiving 1602, via a vehicle interface, supplemental simulator input 1652, and receiving, via the vehicle interface, one or more target objectives 1654 for engine operation; generating 1702 data-driven simulator input 1752 based on combinations of possible simulator parameters; simulating 1802, based on simulator input including the operation data 1254 generated during operation of the engine, the supplemental simulator input 1652, and the data-driven simulator input 1654, operation of an engine to generate the simulator output 1256; training 1204, based on simulating 1202 the operation of the engine, one or more trained models 1258; generating 1206, based at least on the one or more trained models 1258, calibration data 1260 corresponding to one or more electronically controllable components of the engine; and generating 1302, during operation of the engine and based on the calibration data 1260, one or more control signals modifying one or more operating characteristics of the engine.

However, in contrast to the example method in FIG. 19, the example method in FIG. 20 further includes a decision point 2002 with regard to whether or not updated target objectives have been received.

In this example, at the decision point 2002, if target objectives have not been updated 2002N, then operation continues by repeating the generation 1302, during operation of the engine and based on the calibration data 1260, one or more control signals modifying one or more operating characteristics of the engine. While this example describes a decision point based on whether or not target objectives have been updated, in other examples, other criteria may be a basis for deciding whether or not to update calibration data. As a first example, instead of or in addition to updated target objectives, the calibration system 1200 may update calibration data on a periodic basis, such as nightly, weekly, according to some default schedule, according to a user-specified schedule, or in response to exceeding some threshold number of miles. As a second example, the calibration system 1200 may update calibration data in response to determining that—based on simulations indicating performance improvement given updated calibration data—performance would improve by a threshold percentage, say X %, where X may be any value. As a third example, the calibration system 1200 may update calibration data in response to configuration change to the engine or vehicle, or more generally, a given real-world system that includes that calibration system 1200—where a configuration change may include addition, removal, replacement, or maintenance of a component of the engine or vehicle. As a fourth example, the calibration system 1200 may update calibration data in response to changes in operational behavior of a component of the engine or vehicle, where the change in operational behavior may be due to wear, damage, or some type of fault or component failure or degradation. As another example, the calibration system 1200 may update calibration data based on a combination of the above examples, where multiple triggers may initiate a calibration update, including a combination of the first, second, third, and/or fourth examples listed above.

Otherwise, in this example, at the decision point 2002, if the target objective have been updated 2002Y, then operation continues by repeating generating 1502 operation data 1254 based on sensor data 1552 collected during operation of the engine; receiving 1602, via a vehicle interface, supplemental simulator input 1652, and receiving, via the vehicle interface, one or more target objectives 1654 for engine operation; generating 1702 data-driven simulator input 1752 based on combinations of possible simulator parameters; simulating 1802, based on simulator input including the operation data 1254 generated during operation of the engine, the supplemental simulator input 1652, and the data-driven simulator input 1654, operation of an engine to generate the simulator output 1256, training 1204, based on simulating 1202 the operation of the engine, one or more trained models 1258; generating 1206, based at least on the one or more trained models 1258, calibration data 1260 corresponding to one or more electronically controllable components of the engine; and generating 1302, during operation of the engine and based on the calibration data 1260, one or more control signals modifying one or more operating characteristics of the engine.

In this way, in this example, operation continues normally, using existing calibration data; however, if new target objectives are received, then update calibration data may be generated as described above.

Systems and methods may be described herein with reference to screen shots, block diagrams and flowchart illustrations of methods, apparatuses (e.g., systems), and computer media according to various aspects. It will be understood that each functional block of a block diagrams and flowchart illustration, and combinations of functional blocks in block diagrams and flowchart illustrations, respectively, can be implemented by computer program instructions.

Computer program instructions may be loaded onto a computer or other programmable data processing apparatus to produce a machine, such that the instructions that execute on the computer or other programmable data processing apparatus create means for implementing the functions specified in the flowchart block or blocks. These computer program instructions may also be stored in a computer-readable memory or device that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

Accordingly, functional blocks of the block diagrams and flowchart illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions.

Although the disclosure may include a method, it is contemplated that it may be embodied as computer program instructions on a tangible computer-readable medium, such as a magnetic or optical memory or a magnetic or optical disk/disc. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

In this written description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements. In the present disclosure, terms such as "determining," "calculating," "estimating," "shifting," "adjusting," etc. may be used to describe how one or more operations are performed. It should be noted that such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device. As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive electrical signals (digital signals or analog signals) directly or indirectly, such as via one or more wires, buses, networks, etc. As used herein, "directly coupled" may include two devices that are coupled (e.g., communicatively coupled, electrically coupled, or physically coupled) without intervening components.

Changes and modifications may be made to the disclosed embodiments without departing from the scope of the present disclosure. These and other changes or modifications are intended to be included within the scope of the present disclosure, as expressed in the following claims.

What is claimed is:

1. A method comprising:
   simulating, on a processor coupled to an engine, based on operation data generated during operation of the engine and simulation output from simulating the engine during a prior offline period, operation of the engine;
   training, based on simulating the operation of the engine, one or more trained models;
   generating, based at least on the one or more trained models, calibration data corresponding to one or more electronically controllable components of the engine;
   transmitting, to a simulation learning environment that is independent of the vehicle, vehicle operation data collected during operation of the vehicle;
   receiving, from the simulation learning environment, one or more externally trained models based on simulating operation of the engine using the vehicle operation data; and
   generating, based on the one or more externally trained models, updated calibration data corresponding to the one or more electronically controllable components of the engine, wherein the updated calibration data includes both the one or more externally trained models and the one or more trained models based on simulating operation of the engine during operation of the engine.

2. The method of claim 1, further comprising:
   generating, during operation of the engine and based on the calibration data, one or more control signals modifying one or more operating characteristics of the engine.

3. The method of claim 2, wherein generating the one or more control signals modifying the one or more operating characteristics of the engine comprises:
   modifying, based on the one or more trained models, one or more operating characteristics of an electronically controllable valve.

4. The method of claim 1, further comprising:
   generating the operation data based on sensor data collected during operation of the engine, wherein the operation data comprises operator control data is based on one or more sensors corresponding to operator inputs or operator settings.

5. The method of claim 4, further comprising:
   receiving, via a vehicle interface, supplemental simulator input, wherein the supplemental simulator input is based on combinations of possible simulator parameters, and wherein generating the data-driven simulation input is not based on specifications for a given objective for engine operation; and
   receiving, via the vehicle interface, one or more target objectives for engine operation.

6. The method of claim 5, further comprising:
   generating data-driven simulator input based on combinations of possible simulator parameters, wherein generating the data-driven simulation input is not based on specifications for a given objective for engine operation.

7. The method of claim 6, wherein simulating operation of the engine further comprises:
   simulating, based on simulator input including the operation data, the supplemental simulator input, and the data-driven simulator input, the operation of the engine to generate simulator output.

8. The method of claim 7, wherein training the one or more trained models further comprises:
   training, based on a learning algorithm operating on the simulator input, on the simulator output, and on the one or more target objectives for engine operation, a valve control model.

9. The method of claim 1, further comprising:
   responsive to receiving an updated target objective: repeating said simulating, said training, and said generating to generate updated calibration data in accordance with the updated target objective.

10. A computer program product disposed upon a non-transitory computer-readable medium, the computer program product comprising computer program instructions that, when executed, cause a computer to carry out the steps of:
    simulating, on a processor coupled to an engine, based on operation data generated during operation of the engine and simulation output from simulating the engine during a prior offline period, operation of the engine;
training, based on simulating the operation of the engine, one or more trained models;
generating, based at least on the one or more trained models, calibration data corresponding to one or more electronically controllable components of the engine;
transmitting, to a simulation learning environment that is independent of the vehicle, vehicle operation data collected during operation of the vehicle;
receiving, from the simulation learning environment, one or more externally trained models based on simulating operation of the engine using the vehicle operation data; and
generating, based on the one or more externally trained models, updated calibration data corresponding to the one or more electronically controllable components of the engine, wherein the updated calibration data includes both the one or more externally trained models and the one or more trained models based on simulating operation of the engine during operation of the engine.

11. The computer program product of claim 10, wherein the computer program instructions, when executed, further cause the computer to carry out the steps of:
generating, during operation of the engine and based on the calibration data, one or more control signals modifying one or more operating characteristics of the engine.

12. The computer program product of claim 11, wherein generating the one or more control signals modifying the one or more operating characteristics of the engine comprises:
modifying, based on the one or more trained models, one or more operating characteristics of an electronically controllable valve.

13. The computer program product of claim 10, further comprising:
generating the operation data based on sensor data collected during operation of the engine, wherein the operation data comprises operator control data is based on one or more sensors corresponding to operator inputs or operator settings.

14. The computer program product of claim 13, wherein the computer program instructions, when executed, further cause the computer to carry out the steps of:
receiving, via a vehicle interface, supplemental simulator input, wherein the supplemental simulator input is based on combinations of possible simulator parameters, and wherein generating the data-driven simulation input is not based on specifications for a given objective for engine operation; and
receiving, via the vehicle interface, one or more target objectives for engine operation.

15. The computer program product of claim 14, wherein the computer program instructions, when executed, further cause the computer to carry out the steps of:
generating data-driven simulator input based on combinations of possible simulator parameters, wherein generating the data-driven simulation input is not based on specifications for a given objective for engine operation.

16. The computer program product of claim 15, wherein simulating operation of the engine further comprises:
simulating, based on simulator input including the operation data, the supplemental simulator input, and the data-driven simulator input, the operation of the engine to generate simulator output.

17. The computer program product of claim 16, wherein training the one or more trained models further comprises:
training, based on a learning algorithm operating on the simulator input, on the simulator output, and on the one or more target objectives for engine operation, the one or more trained models.

18. A vehicle comprising:
an engine comprising one or more electronically controllable components;
a memory configured to store one or more trained models; and
one or more processors configured to:
simulate, based on operation data generated during operation of the engine and simulation output from simulating the engine during a prior offline period, operation of the engine;
train, based on simulating the operation of the engine, the one or more trained models;
generate, based at least on the one or more trained models, calibration data corresponding to the one or more electronically controllable components of the engine;
transmit, to a simulation learning environment that is independent of the vehicle, vehicle operation data collected during operation of the vehicle;
receive, from the simulation learning environment, one or more externally trained models based on simulating operation of the engine using the vehicle operation data; and
generate, based on the one or more externally trained models, updated calibration data corresponding to the one or more electronically controllable components of the engine, wherein the updated calibration data includes both the one or more externally trained models and the one or more trained models based on simulating operation of the engine during operation of the engine.

19. The vehicle of claim 18, wherein the one or more processors are further configured to:
generate, during operation of the engine and based on the calibration data, one or more control signals modifying one or more operating characteristics of the engine.

* * * * *